(12) United States Patent
Nishio et al.

(10) Patent No.: US 9,332,668 B2
(45) Date of Patent: May 3, 2016

(54) ELECTRONIC CIRCUIT UNIT CAPABLE OF EXTERNAL CONNECTION

(75) Inventors: Akihiro Nishio, Yokkaichi (JP); Hiroki Hirai, Yokkaichi (JP); Tetsuji Tanaka, Yokkaichi (JP); Yasuo Omori, Yokkaichi (JP)

(73) Assignees: AUTONETWORKS TECHNOLOGIES, LTD. (JP); SUMITOMO WIRING SYSTEMS, LTD. (JP); SUMITOMO ELECTRIC INDUSTRIES, LTD. (JP)

( * ) Notice: Subject to any disclaimer, the term of this patent is extended or adjusted under 35 U.S.C. 154(b) by 229 days.

(21) Appl. No.: 14/350,249

(22) PCT Filed: Oct. 12, 2011

(86) PCT No.: PCT/JP2011/005711
§ 371 (c)(1),
(2), (4) Date: Apr. 7, 2014

(87) PCT Pub. No.: WO2013/051076
PCT Pub. Date: Apr. 11, 2013

(65) Prior Publication Data
US 2014/0226295 A1   Aug. 14, 2014

(30) Foreign Application Priority Data

Oct. 5, 2011 (JP) .................................. 2011-221219
Oct. 5, 2011 (JP) .................................. 2011-221220
Oct. 5, 2011 (JP) .................................. 2011-2212218

(51) Int. Cl.
*H01R 12/00* (2006.01)
*H05K 7/14* (2006.01)
(Continued)

(52) U.S. Cl.
CPC ............ *H05K 7/1452* (2013.01); *H01R 12/721* (2013.01); *H01R 13/42* (2013.01); *H01R 13/6271* (2013.01); *H05K 5/0069* (2013.01); *H01R 13/4361* (2013.01)

(58) Field of Classification Search
CPC .................................................. H01R 13/6658
USPC ......................................... 439/76.1, 493, 946
See application file for complete search history.

(56) References Cited

U.S. PATENT DOCUMENTS 6,280,228 B1 * 8/2001 Maciejewski ...... H01R 13/6315
439/374
6,549,427 B1 * 4/2003 Johnston ................ H05K 3/325
361/822

(Continued)

FOREIGN PATENT DOCUMENTS

JP   2007-26762   2/2007
JP   2007-143281  6/2007

(Continued)

OTHER PUBLICATIONS

International Search Report of Dec. 26, 2011.

*Primary Examiner* — Phuongchi T Nguyen
(74) *Attorney, Agent, or Firm* — Gerald E. Hespos; Michael J. Porco; Matthew T. Hespos

(57) ABSTRACT

An electronic circuit unit includes a circuit board (10) with conductors for connection (14) on an edge (12), a case (20) for housing the circuit board (10) and a connector (C). The case (20) includes an opening (21) that allows the circuit board (10) to be inserted in a board inserting direction and holds the circuit board (10) at a specific board holding position. The connector (C) includes connector terminals (30) to be mounted on ends of wires (W), and a housing (40) for holding the connector terminals (30) so that the connector terminals (30) can simultaneously contact the conductors for connection (14). The housing (40) includes a lid (48) for closing the opening (21). The case (20) locks the housing (40) at a position where the connector terminals (30) contact the conductors for connection (14) of the circuit board (10) at the board holding position.

34 Claims, 30 Drawing Sheets

(51) Int. Cl.
*H01R 13/42* (2006.01)
*H01R 12/72* (2011.01)
*H01R 13/627* (2006.01)
*H05K 5/00* (2006.01)
*H01R 13/436* (2006.01)

(56) References Cited

U.S. PATENT DOCUMENTS 7,651,342 B1 * 1/2010 Wu .................. H01R 9/032
439/607.46

7,758,378 B2    7/2010  Yoshida et al.
7,803,010 B1 *  9/2010  Hwang .................. H01R 9/032
439/497

FOREIGN PATENT DOCUMENTS

| | | |
|---|---|---|
| JP | 2008-112682 | 5/2008 |
| JP | 2009-146836 | 7/2009 |
| JP | 2011-25719 | 2/2011 |
| JP | 2011-28856 | 2/2011 |

* cited by examiner (a)

(b)

ELECTRONIC CIRCUIT UNIT CAPABLE OF EXTERNAL CONNECTION

BACKGROUND

1. Field of the Invention

The present invention relates to an electronic circuit unit which is mounted in a vehicle such as an automotive vehicle and connectable to an external circuit via a plurality of wires.

2. Description of the Related Art

Conventionally, many electronic circuit units each provided with a circuit board fitted with an electronic circuit and a board connector for connecting wires for external connection to conductors for connection on this circuit board are known as electronic circuit units to be mounted in vehicles. Further, a so-called card edge connector to be mounted on an edge part of the circuit board is known as the board connector.

For example, Japanese Unexamined Patent Publication No. 2008-112682 below discloses a connector provided with connector terminals 92 provided on ends of a plurality of wires, a terminal-side housing 94 for holding these connector terminals 92, and a board-side housing 98 fixed to an edge part of a circuit board 96 as shown in FIG. 31.

Each connector terminal 92 includes a resilient contact piece 93 resiliently displaceable in a thickness direction of the circuit board 96. This resilient contact piece 93 is resiliently displaced by receiving a reaction force from a surface of the circuit board 96 when coming into contact with this surface and pressed into contact with the conductor for connection on this surface by a resilient restoring force thereof.

The terminal-side housing 94 holds the connector terminals 92 in such an arrangement that the resilient contact pieces 93 of the respective connector terminals 92 sandwich the circuit board 96 from both sides of the circuit board 96 and a plurality of connector terminals 92 are juxtaposed along a width direction of the circuit board 96. The board-side housing 98 is shaped to be able to receive the terminal-side housing 94 and locks the terminal-side housing 94 at a position where the resilient contact pieces 93 of the respective connector terminals 92 are held in contact with the conductors for connection of the circuit board 96.

In an electronic circuit unit using the connector 90, the miniaturization and structure simplification of the entire electronic circuit unit are difficult. Specifically, the connector 90 requires the board-side housing 98 for locking the terminal-side housing 94 to the circuit board 96 in addition to the terminal-side housing 94 for holding the plurality of connector terminals 92. Further, the circuit board is housed in a predetermined case, but this case has to house the connector 90 to be mounted on the circuit board 96 in addition to the circuit board 96 and is enlarged by that much.

To solve the above problem, the present invention aims to provide an electronic circuit unit which includes a circuit board, a case for housing the circuit board and a connector for external connection and can be miniaturized and simplified in structure.

SUMMARY OF THE INVENTION

A first electronic circuit unit provided by the present invention includes a circuit board including an edge part and a plurality of conductors for connection provided on a surface thereof, a case for housing the circuit board, and a connector for connecting wires to the conductors for connection of the circuit board. The case includes an opening which is open in a specific direction and is so shaped that the circuit board is insertable into the case in a board inserting direction perpendicular to a plate thickness direction of the circuit board through the opening with an edge part opposite to the former edge part in the lead. The connector includes a plurality of connector terminals connected to ends of the respective wires and electrically conductively connectable to the conductors for connection of the circuit board by respectively coming into contact with the conductors and a housing for holding the connector terminals in such an arrangement that the respective connector terminals simultaneously come into contact with the respective conductors for connection. This housing is shaped to be mountable into the case to close the opening of the case at a position where each connector terminal held in the housing comes into contact with each conductor for connection of the circuit board at the board holding position, and the case includes a housing locking portion for locking the housing of the connector at the position where each connector terminal of the connector comes into contact with each conductor for connection of the circuit board housed in the case.

A second electronic circuit unit provided by the present invention includes a circuit board including a first edge part and a second edge part facing opposite sides and first conductors for connection and second conductors for connection provided on surfaces of the respective edge parts, a case for housing the circuit board, a first connector for connecting wires to the respective first conductors for connection of the circuit board and a second connector for connecting wires to the respective second conductors for connection of the circuit board. The case includes a first opening which is open in a specific direction and a second opening which is open in a direction opposite to the specific direction, and is so shaped that the circuit board is insertable into the case in a board inserting direction perpendicular to a plate thickness direction of the circuit board through at least one opening with the edge part opposite to the edge part corresponding to the one opening out of the first and second edge parts in the lead. The first connector includes a plurality of first connector terminals connected to ends of the wires and electrically conductively connectable to the first conductors for connection by respectively coming into contact with the first conductors for connection and a first housing for holding the first connector terminals in such an arrangement that the respective first connector terminals simultaneously come into contact with the respective first conductors for connection, the first housing being shaped to be mountable into the case to close the first opening of the case. The second connector includes a plurality of second connector terminals connected to ends of the wires and electrically conductively connectable to the second conductors for connection by respectively coming into contact with the second conductors for connection and a second housing for holding the second connector terminals in such an arrangement that the respective second connector terminals simultaneously come into contact with the respective second conductors for connection, the second housing being shaped to be mountable into the case to close the second opening of the case. The case includes a first housing locking portion for locking the first housing of the first connector at a position where each first connector terminal of the first connector comes into contact with each first conductor for connection of the circuit board housed in the case and a second housing locking portion for locking the second housing of the second connector at a position where each second connector terminal of the second connector comes into contact with each second conductor for connection of the circuit board housed in the case.

A third electronic circuit unit provided by the present invention includes a circuit board including a first edge part and a second edge part located on a side opposite to the first edge part and a plurality of conductors for connection provided on surfaces of the first and second edges, a case configured to house the circuit board, including an opening which is open in a specific direction and shaped such that the circuit board is insertable in a board inserting direction perpendicular to a plate thickness direction of the circuit board through the opening with the first edge part in the lead, case terminals mounted on ends of a plurality of wires and configured to connect the conductors for connection and the wires by being held in the case and coming into contact with the respective conductors for connection of the first edge part of the circuit board housed in the case, and a connector to be mounted into the case to connect a plurality of wires different from the wires, on which the case terminals are mounted, to the respective conductors for connection of the circuit board housed in the case. The case includes a first terminal holding portion located on a side opposite to the opening and configured to hold the respective case terminals in such an arrangement that the case terminals simultaneously come into contact with the respective conductors for connection of the first edge part and first terminal inserting portions located outside the first terminal holding portion, having an inner peripheral surface surrounding each of a plurality of terminal insertion holes into which the case terminals are insertable from an outer side and configured to guide the inserted terminals to the first terminal holding portion. The connector includes a plurality of connector terminals connected to ends of wires and electrically conductively connectable to the conductors for connections of the second edge part of the circuit board by respectively coming into contact with the conductors, and a housing for holding the connector terminals in such an arrangement that the respective connector terminals simultaneously come into contact with the respective conductors for connection. This housing includes second terminal inserting portions having an inner peripheral surface surrounding each of a plurality of terminal insertion holes through which the connector terminals are insertable from an outer side and a second terminal holding portion shaped to receive and hold the terminals inserted through the second terminal inserting portions and to be insertable into the case through the opening of the case and configured to hold each connector terminal such that each connector terminal comes into contact with each conductor for connection of the second edge part of the circuit board in an inserted state. The connector-side seal member is interposed between the housing and the case to seal the interior of the case. Each wire-side seal member is interposed between the wire and the inner peripheral surface of the first or second terminal inserting portion to seal the interior of the case. The case includes a housing locking portion for locking the housing at a position where each connector terminal held in the second terminal holding portion of the housing comes into contact with each conductor for connection of the second edge of the circuit board in the case.

DETAILED DESCRIPTION OF THE PREFERRED EMBODIMENTS

Figure 1:
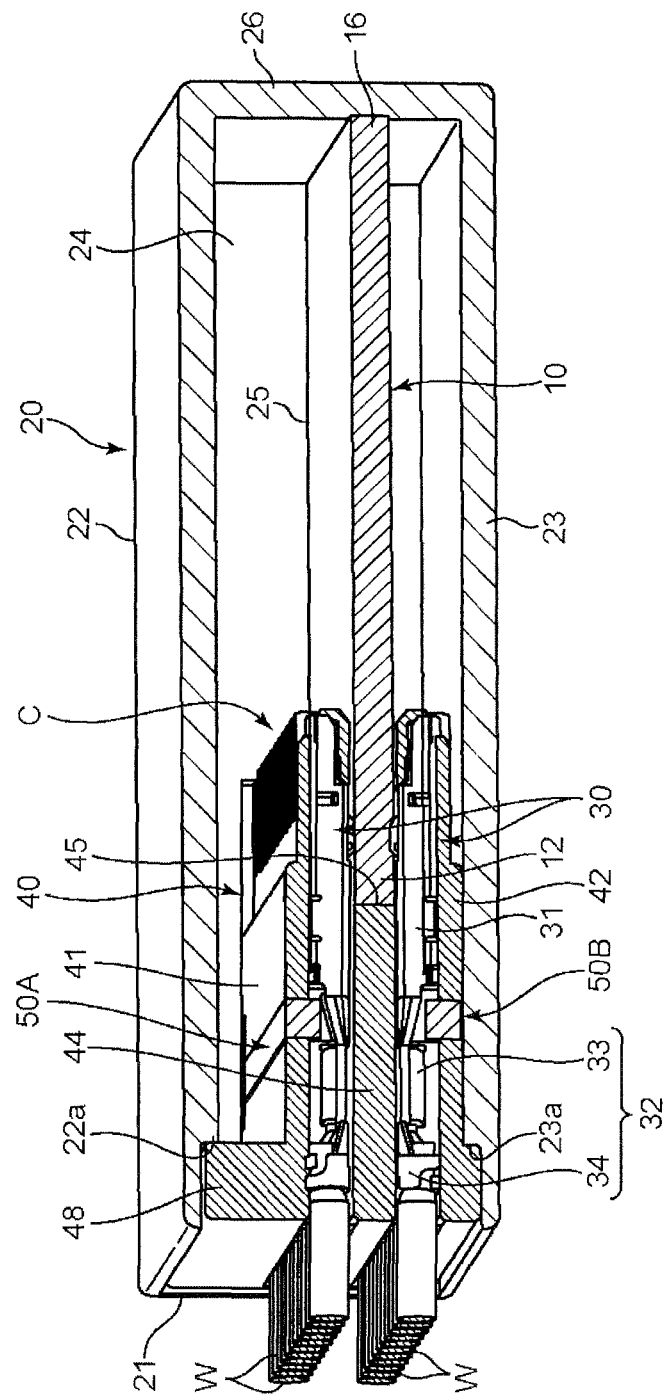
FIG. 1 is a perspective view in section showing a state where a circuit board, a case and a connector of an electronic circuit unit according to a first embodiment of the present invention are assembled.

A first embodiment of the present invention is described with reference to FIGS. 1 to 10.

An electronic circuit unit according to this embodiment includes a circuit board 10, a case 20 for housing the circuit board 10, and a connector C for connecting a plurality of wires W to the circuit board 10.

The circuit board 10 is, for example, a printed circuit board, conductor patterns for circuit configuration are arranged on both sides thereof, and electronic components constituting circuits are mounted thereon. The circuit board 10 according to this embodiment has a rectangular shape. A plurality of conductors for connection 14 in the form of thin plates are provided on the top surface and the under surface of one edge part (left edge part in FIGS. 1 and 4) of the circuit board 10. These conductors for connection 14 are arranged along the edge part.

The case 20 is formed into a substantially rectangular parallelepipedic shape, includes an opening 21 which is open in a specific direction (leftward direction in FIGS. 1 and 4) and is shaped to allow the circuit board 10 to be inserted in a board inserting direction (rightward direction in FIGS. 1 and 4 in this embodiment) perpendicular to a plate thickness direction of the circuit board 10 through this opening 21 with an edge part 16 opposite to the edge part 12 in the lead. Specifically, the case 20 includes a ceiling wall 22, a bottom wall 23, a pair of left and right side walls 24 (only the side wall 24 on a back side is shown) and an end wall 26. The ceiling wall 22 and the bottom wall 23 are arranged on upper and lower sides in postures parallel to each other. The both side walls 24 are arranged between the ceiling wall 22 and the bottom wall 23 and form a rectangular tube body together with the ceiling wall 22 and the bottom wall 23. The end wall 26 is provided to close an opening on one side of the rectangular tube body (opening on a side opposite to the opening 21; right opening in FIGS. 1 and 4).

A guiding groove 25 is formed in the inner side surface of each side wall 24. The respective guiding grooves 25 extend in the board inserting direction and have a width enabling left and right edge parts of the circuit board 10 to be inserted thereinto. By the insertion of the circuit board 10 into the case 20 associated with this insertion, the left and right edge parts of the circuit board 10 are held from both sides (upper and lower sides in this embodiment) by the both side walls 24. A position (position shown in FIGS. 1 and 4) where the edge part (edge part opposite to the edge part 12; right edge part in FIGS. 1 and 4) 16 of this circuit board 10 is in contact with the end wall 26 corresponds to a "board holding position" according to the present invention.

The connector C includes a plurality of connector terminals 30, a housing 40 and a pair of upper and lower retainers 50A, 50B. Each connector terminal 30 is mounted on an end of a corresponding wire W. The housing 40 is formed of an insulating material such as synthetic resin and collectively holds the connector terminals 30. The retainers 50A, 50B are for doubly locking the connector terminals 30 held in the housing 40 and respectively mounted into the housing 40.

The wire W is composed of an unillustrated conductor and an insulation coating covering the conductor. The insulation coating is partly removed at the end of the wire W to expose the conductor.

Each connector terminal 30 is made of an electrically conductive metal plate and mounted on the end of the corresponding wire W. Specifically, each connector terminal 30 includes a board connecting portion 31 and a wire connecting portion 32 arranged one after the other. The wire connecting portion 32 includes left and right conductor barrels 33 and left and right insulation barrels 34 arranged one after the other.

The both conductor barrels 33 are so crimped to the conductor as to embrace the conductor exposed at the end of the wire W, thereby being electrically conductively connected to the conductor. The both insulation barrels 34 are so crimped to the wire W as to embrace a part of the insulation coating located behind the exposed part of the conductor.

The board connecting portion 31 is composed of a main body 37, a resilient contact piece 35 and a resilient force reinforcing member 36 as shown in FIGS. 5(a) and 5(b).

The main body 37 is integrally formed to the wire connecting portion 32 and obtained by forming a part of the metal plate forming the wire connecting portion 32 into a rectangular tube shape. A window 37a is formed to penetrate through one of four walls forming this main body 37.

The resilient contact piece 35 extends in an axial direction of the connector terminal 30 and includes a base end part 35b to be fixed to the main body 37 and a contact end part 35a to be brought into contact with the conductor for connection 14 of the circuit board 10. The base end part 35b is fixed to the underside of the wall formed with the window 37a out of the main body 37 at a position behind the window 37a. As shown in FIG. 5(b), the contact end part 35a is shaped to project outward from the main body 37 through the window 37a in a state where the resilient contact piece 35 is not deformed. However, when this contact end part 35a comes into contact with the edge part 12 of the circuit board 10 as shown in FIG. 5(b), the contact end part 35a receives a reaction force from the edge part 12, is deflected and displaced to retract into the window 37a and is pressed into contact with the conductor for connection 14 on the edge part 12 by a resilient force thereof.

The resilient force reinforcing member 36 is so provided in the main body 37 as to be resiliently deformed as the contact end part 35a is deflected and displaced, and reinforces a resilient restoring force of the contact end part 35a by a resilient force resulting from the resilient deformation thereof.

The housing 40 collectively holds the connector terminals 30 in such an arrangement that the contact end parts 35a of the resilient contact pieces 35 in the respective connector terminals 30 simultaneously come into contact with the conductors for connection on the opposite surfaces of the edge part 12 of the circuit board 10.

Figure 6:
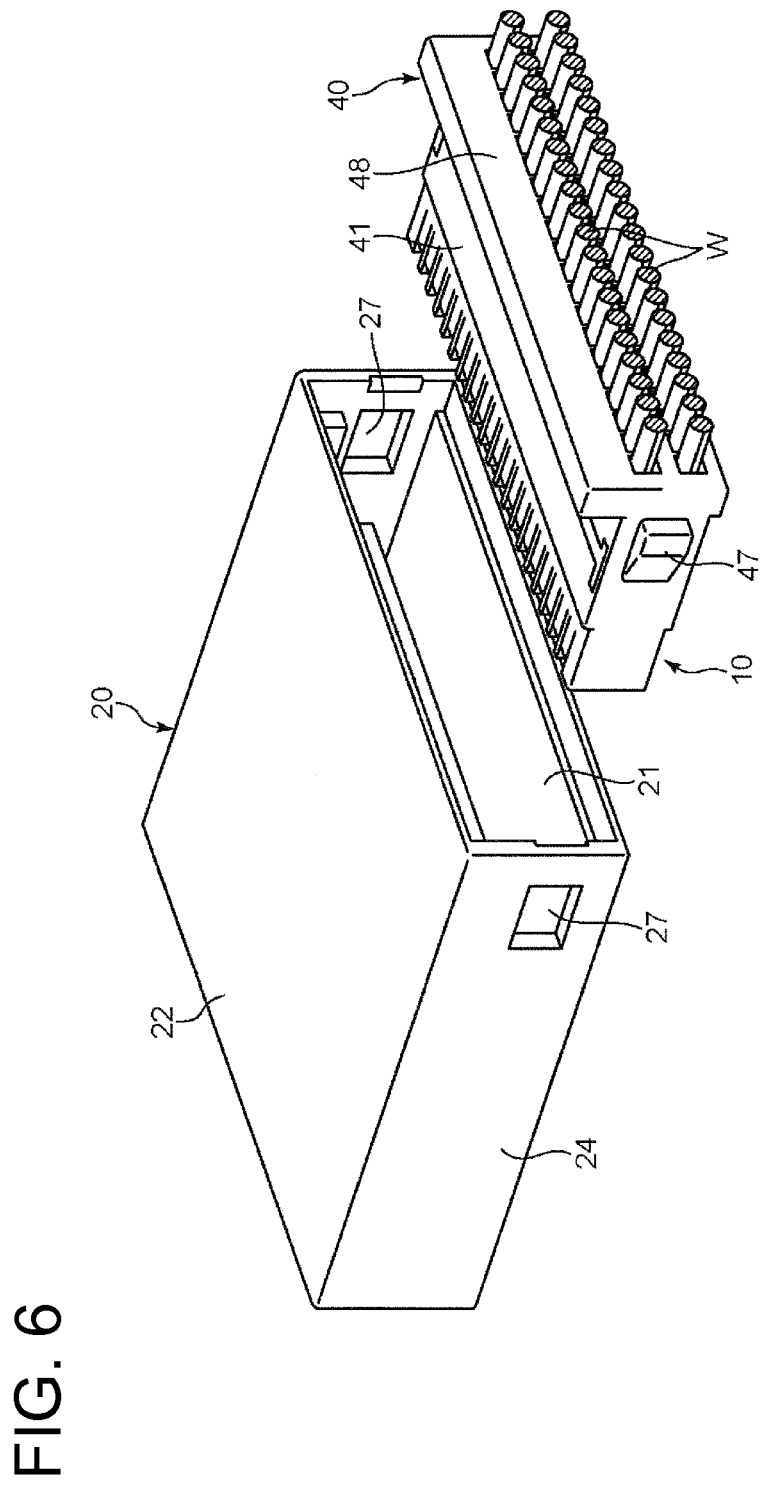
FIG. 6 is a perspective view showing a state where retainers in the connector are at a connector terminal locking position.

Specifically, this housing 40 includes a pair of upper and lower ceiling wall 41 and bottom wall 42 extending in parallel to each other, an intermediate wall 44 located between these ceiling wall 41 and bottom wall 42, and a pair of left and right side walls 46 (only one side wall 46 is shown in FIG. 6). A plurality of terminal accommodating chambers juxtaposed in a lateral direction are formed between the ceiling wall 41 and the intermediate wall 44 and between the bottom wall 42 and the intermediate wall 44, and each connector terminal 30 is inserted into each terminal accommodating chamber.

A front end (right end in FIG. 1) 45 of the intermediate wall 44 is located behind the front ends of the ceiling wall 41 and the bottom wall 42, and a board insertion space into which the edge part 12 of the circuit board 10 is insertable is ensured before the front end 45 of the intermediate wall 44. Each connector terminal 30 is so held in the housing 40 that the contact end part 35a of the resilient contact piece 35 of the connector terminal 30 face the board insertion space.

Specifically, the connector terminals 30 accommodated in the terminal accommodating chambers between the ceiling wall 41 and the intermediate wall 44 (connector terminals 30 in an upper row) are so held in the housing 40 that the contact end parts 35a thereof face downward, and the connector terminals 30 accommodated in the terminal accommodating chambers between the bottom wall 42 and the intermediate wall 44 (connector terminals 30 in a lower row) are so held in the housing 40 that the contact end parts 35a thereof face upward. Holding positions of the respective connector terminals 30 in the housing 40 are so set that the contact end parts 35a of the connector terminals 30 simultaneously come into contact with the conductors for connection 14 of the circuit board 10 at a position where the edge part 12 of the circuit board 10 is completely inserted in the board insertion space and an end surface of the edge part 12 is in contact with the front end 45 of the intermediate wall 44. Thus, the front end 45 of the intermediate wall 44 constitutes a "board restraining portion" according to the present invention.

The housing 40 includes a plurality of locking lances (locking portions) 43 for holding the respective connector terminals 30. Each locking lance 43 is deflected and displaced in a direction to be retracted from the connector terminal 30 when the connector terminal 30 is inserted into the terminal accommodating chamber from behind (left side in FIGS. 1 and 4) and locks an appropriate position of the connector terminal 30 by being resiliently restored when the insertion of the connector terminal 30 is completed.

As a feature of the present invention, the housing 40 includes a lid portion 48 shaped to close the opening 21 of the case 20. This lid portion 48 closes the opening 21 at a position (i.e. position where the front end 45 of the intermediate wall 44 is in contact with the end surface of the edge part 12 of the circuit board 10) where each connector terminal held in the housing 40 is in contact with each conductor for connection 14 of the circuit board 10 at the board holding position (i.e. position where the edge part 16 opposite to the edge part 12 where the conductors for connection 14 are provided is in contact with the end wall 26). Specifically, rear end parts of the ceiling wall 41 and the bottom wall 42 project upward and downward from other parts thereof to such an extent as to be able to close the opening 21, and these rear end parts and a rear end part of the intermediate wall 44 form the lid portion 48. On the other hand, the ceiling wall 22 and the bottom wall 23 of the case 20 are respectively formed with step portions 22a, 23a for preventing excessive entrance of the upper and lower ends of the lid portion 48, and located near the opening 21.

On the other hand, the case 20 includes a housing locking portion for locking the housing 40 at a position where each connector terminal 30 comes into contact with each conductor for connection 14 of the circuit board 10 at the board holding position. Specifically, as shown in FIG. 6, engaging projections 47 projecting outward are formed at appropriate positions of the side walls 46 of the housing 40, whereas locking holes 27 into which the engaging projections 47 are fittable are formed in the side walls 24 of the case 20. The positions of the locking holes 27 are so set that the engaging projections 47 are fitted into the locking holes 27 in a state where the edge part (edge part opposite to the edge part 12 where the conductors for connection 14 are provided) 16 of the circuit board 10 is in contact with the end wall 26 of the case and the edge part 12 is in contact with the front end 45 of the intermediate wall 44 of the circuit board 10 as shown in FIG. 1. The housing 40 is locked to the case 20 by fitting the engaging projections 47 into the locking holes 27.

Figure 7:
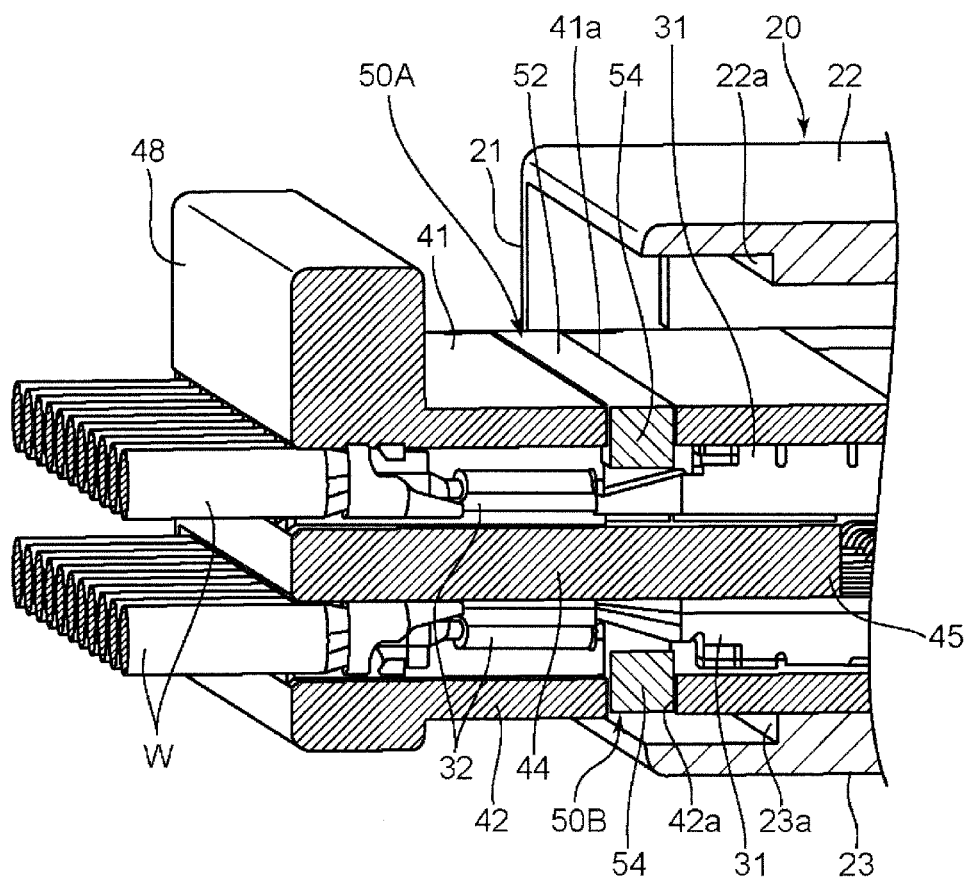
FIG. 7 is a perspective view in section showing the state where the retainers in the connector are at the connector terminal locking position.
Figure 8:
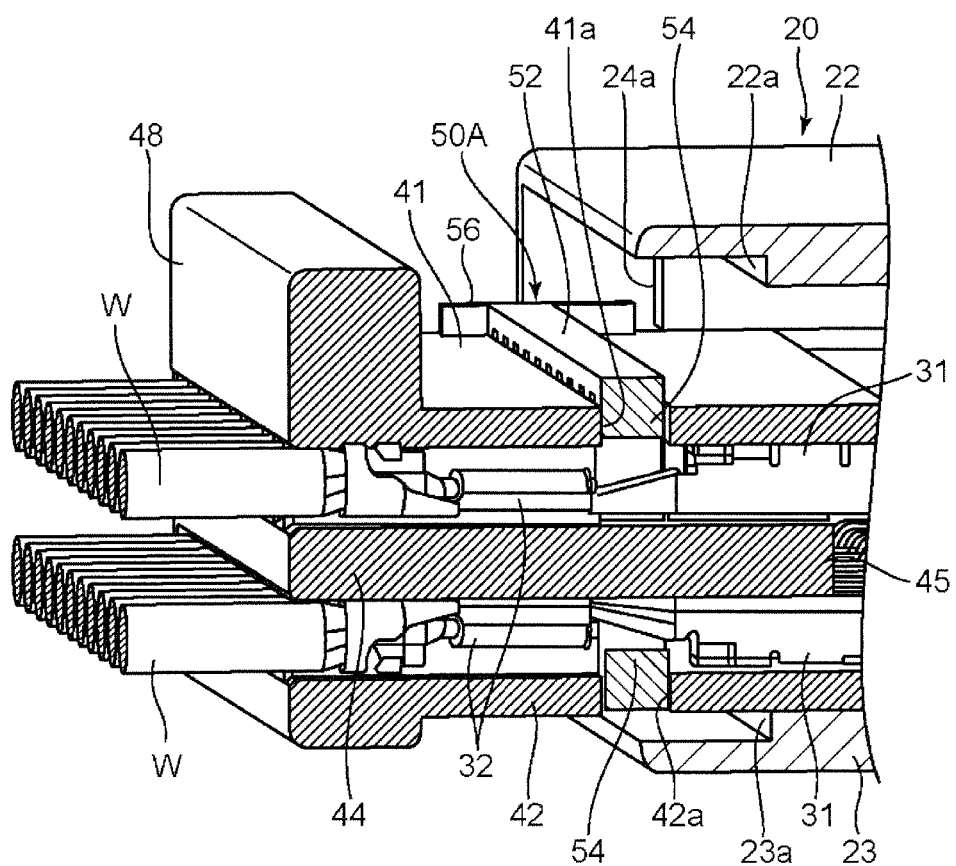
FIG. 8 is a perspective view in section showing a state where the retainers are at a connector terminal releasing position.
Figure 9:
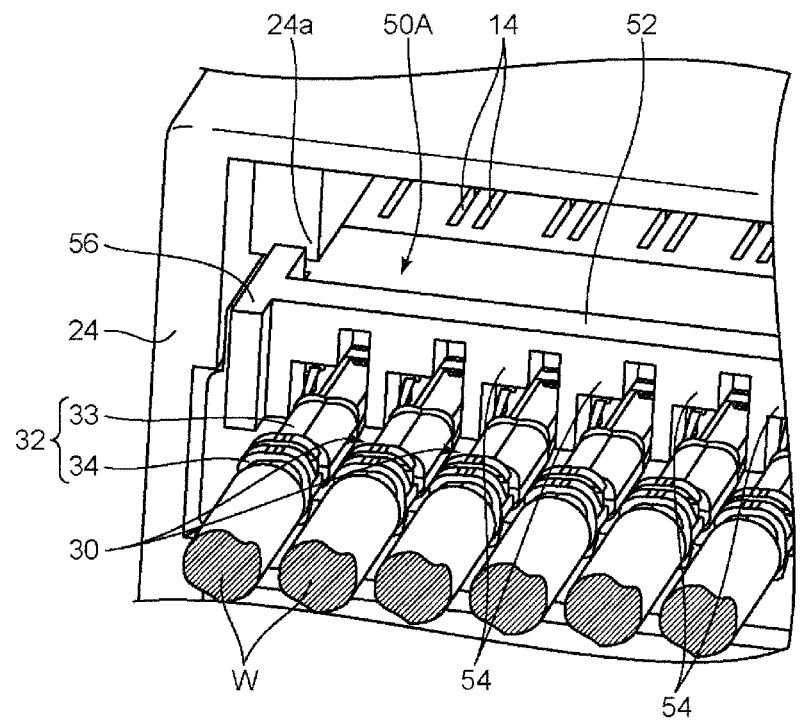
FIG. 9 is a perspective view partly in section showing the state of FIG. 8 when viewed from a different angle.
Figure 10:
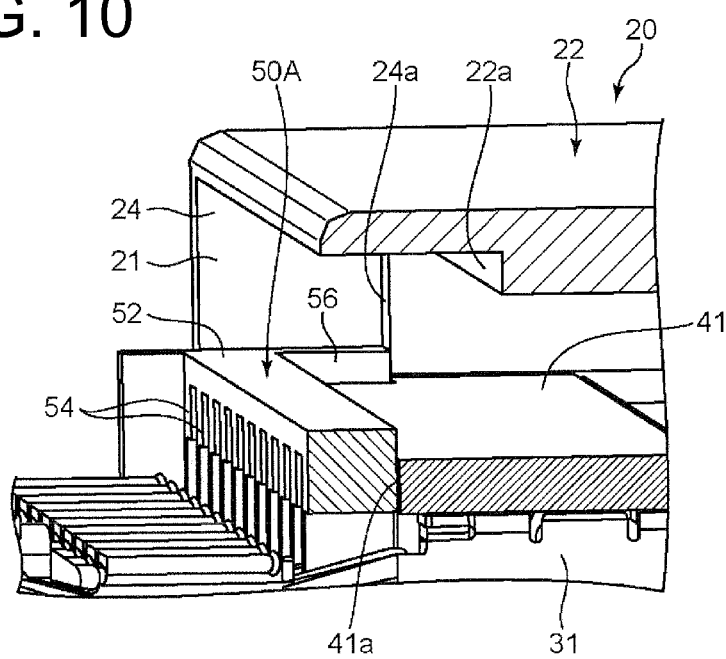
FIG. 10 is a perspective view in section showing a state where the retainer at the connector terminal releasing position is in contact with a step portion of the case to prevent the housing of the connector from being mounted into the case.

The respective retainers 50A, 50B are for doubly locking (locking in addition to locking by the locking lances 43) the connector terminals 30 arranged on the lower and upper sides of the intermediate wall 44 and so mounted in the housing 40 as to be vertically movable between a connector terminal locking position shown in FIGS. 1 to 4 and 7 and a connector terminal releasing position as shown in FIGS. 8 to 10.

Specifically, as shown in FIGS. 8 to 10, each retainer 50A, 50B integrally includes an outer wall 52 extending in a direction parallel to an arrangement direction of the respective connector terminals 30 (connector width direction), a plurality of locking walls 54 projecting from this outer wall 52 into the respective terminal accommodating chambers, and a pair of left and right side walls 56. On the other hand, the ceiling wall 41 and the bottom wall 42 of the housing 40 are respectively formed with retainer mounting holes 41a, 42a shaped to penetrate through the ceiling wall 41 and the bottom wall 42 in the thickness direction and extend across in the width direction, and the outer walls 52 of the retainers 50A, 50B are respectively so fitted into these retainer mounting holes 41a, 42a as to be displaceable in the thickness direction.

The connector terminal locking position is a position where each locking wall 54 is inserted deep into each terminal accommodating chamber and locks the connector terminal 30 at an appropriate position (rear end of the board connecting portion 31 in the shown example). At this position, an outer side surface of the outer wall 52 and outer ends of the side walls 56 (upper surface of the outer wall 52 and upper ends of the side walls 56 in the upper retainer 50A, lower surface of the outer wall 52 and lower surfaces of the side walls 56 in the lower retainer 50B) are substantially flush with an outer surface of the housing 40 (upper surface of the ceiling wall 41 for the upper retainer 50A, lower surface of the bottom wall 42 for the locking wall 50B) and hardly project out from the outer surface.

The connector terminal releasing position is a position where each locking wall 54 is partly retracted outward from each terminal accommodating chamber to allow the insertion and withdrawal of the connector terminal 30 into and from the terminal accommodating chamber. At this position, the outer side surface of the outer wall 52 and the side walls 56 largely project outward from the outer surface of the housing 40. Specifically, the upper surface of the outer wall 52 and the upper ends of the side walls 56 largely project upward from the upper surface of the ceiling wall 41 in the upper retainer 50A and the lower surface of the outer wall 52 and the lower ends of the side walls 56 largely project downward from the lower surface of the ceiling wall 41 in the lower retainer 50B.

On the other hand, the case 20 is provided with mounting preventing portions. These mounting preventing portions allow the housing 40 to be mounted into the case 20 when the retainers 50A, 50B are at the connector terminal locking position, whereas prevent the mounting of the housing into the case 20 by coming into contact with the retainers 50A, 50B when the retainers 50A, 50B are at the connector terminal releasing position.

Specifically, for the upper retainer 50A, the step portions 24*a* as shown in FIGS. 8 to 10 are formed on the inner side surfaces of the both side walls 24 of the case 20. These step portions 24*a* are located right above the ceiling wall 41 when the housing 40 is inserted into the case 20 and formed to come into contact with upper end parts of the side walls 56 projecting upward from the ceiling wall 41 when the retainer 50A is at the connector terminal releasing position. Further entrance and mounting of the housing 40 are prevented by this contact. On the other hand, for the lower retainer 50B, the step portion 23*a* of the bottom wall 23 comes into contact with the outer wall 52 of the retainer 50B when the retainer 50B is at the connector terminal releasing position, thereby preventing further entrance and mounting of the housing 40.

Note that the retainers 50A, 50B can be omitted as appropriate. Further, the conductors for connection 14 may not necessarily be arranged on the both sides of the circuit board 10 and may be formed only on one of them. In that case, the connector terminals 30 of the connector C may be arranged only in one row.

Next, an assembling procedure of this electronic circuit unit is described.

Figure 2:
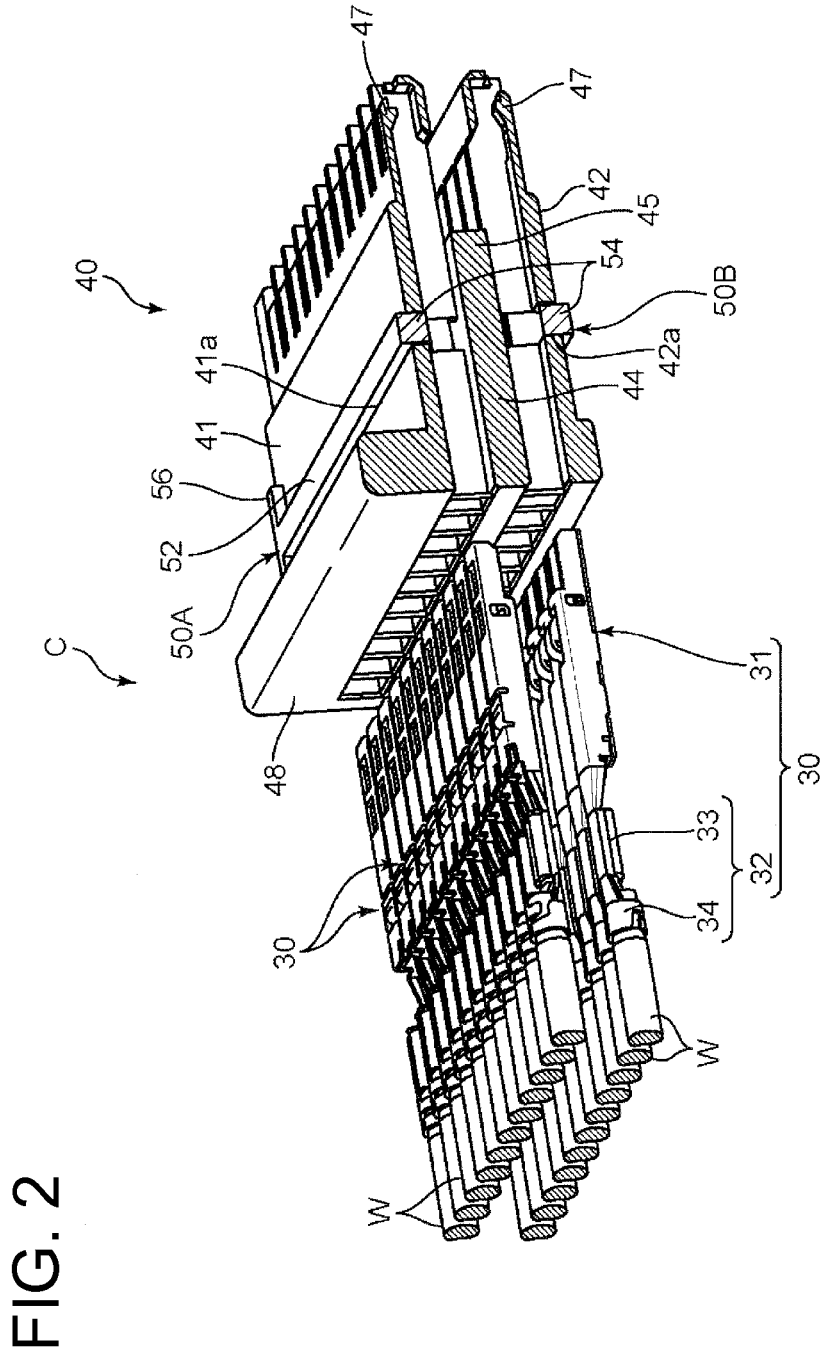
FIG. 2 is a perspective view in section showing a state before connector terminals are inserted into a housing of the connector in the electronic circuit unit.

1) Insertion of the Connector Terminals 30 into the Housing 40 (FIG. 2)

Each connector terminal 30 is inserted into each terminal accommodating chamber of the housing 40 from behind in a state where the retainers 50A, 50B are at the connector terminal releasing position. The inserted connector terminals 30 are engaged with the locking lances 43 in the housing 40 to be locked (primary locking). In this way, the respective connector terminals 30 are arranged in two upper and lower rows and held in the common housing 40 in such postures that the contact end parts 35*a* thereof face inward.

Figure 3:
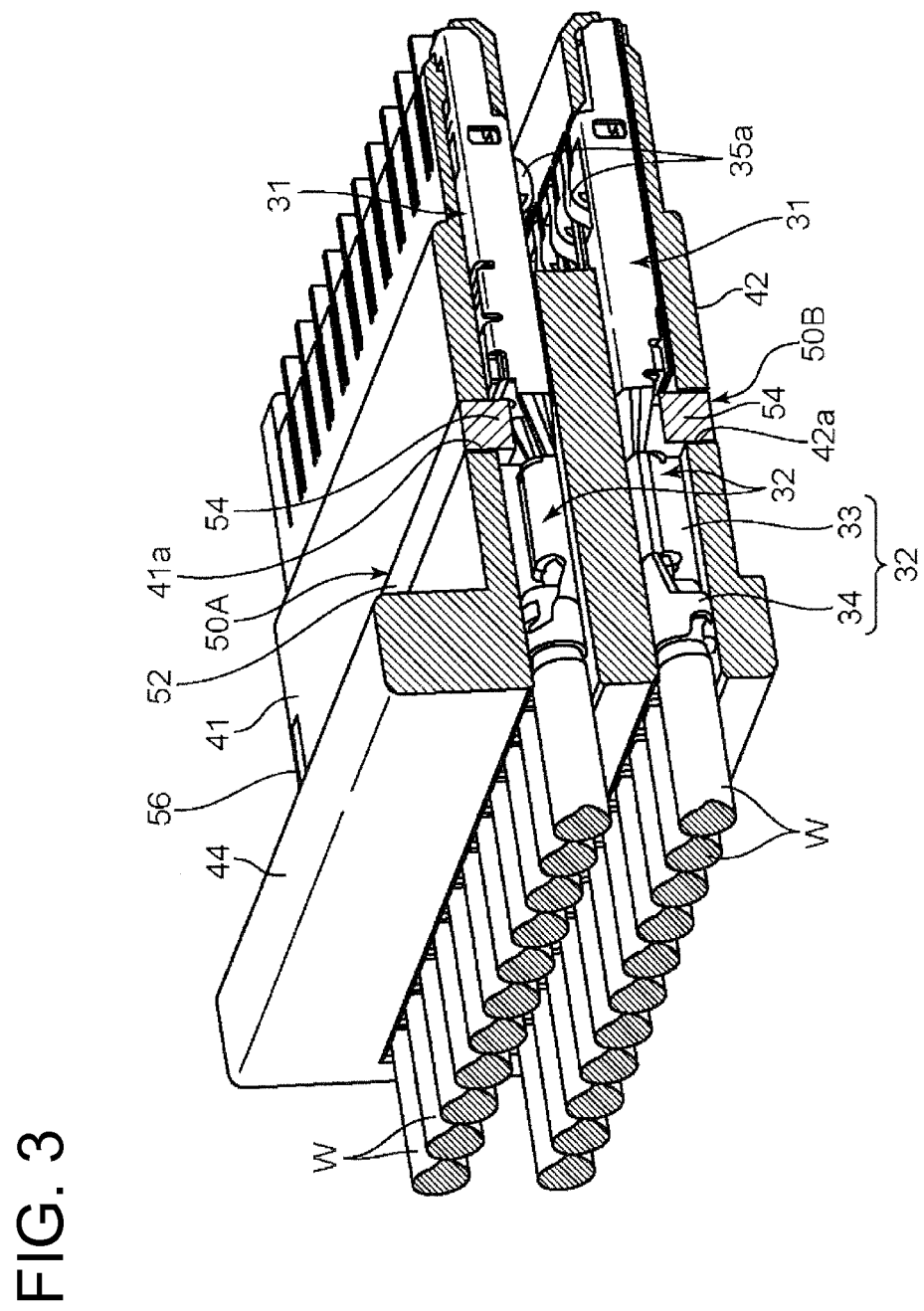
FIG. 3 is a perspective view in section showing a state where the connector terminals are inserted in the housing.

2) Double Locking by the Retainers 50A, 50B (FIG. 3)

Each connector terminal 30 is doubly locked by switching the retainers 50A, 50B from the connector terminal releasing position to the connector terminal locking position. Specifically, the retainers 50A, 50B are switched to the connector terminal locking position by being pressed inwardly and the locking walls 54 thereof are inserted deep into the respective terminal accommodating chambers to lock predetermined parts of the connector terminals 30.

Note that, although not shown, the housing 40 is provided with unillustrated locking portions for lightly locking the retainers 50A, 50B at the connector terminal releasing position and the connector terminal locking position.

Figure 4:
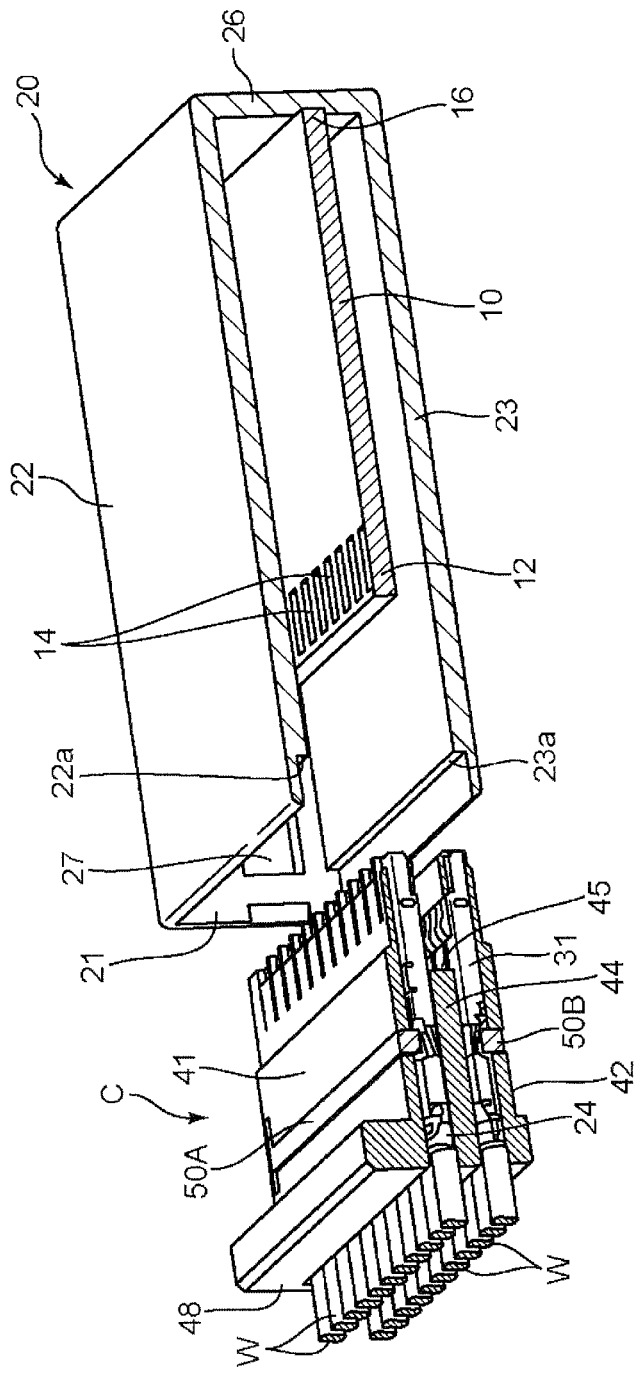
FIG. 4 is a perspective view in section showing a state before the connector is mounted into the case of the electronic circuit unit.
Figure 5:
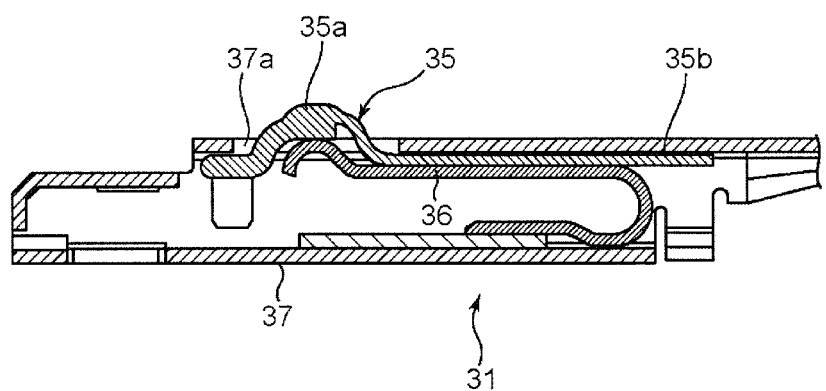
FIG. 5A is a sectional side view of the connector terminal and FIG. 5B is a sectional side view showing a state where a resilient contact piece is held in contact with a conductor for connection of an edge part of the circuit board while being deflected.
Figure 5:
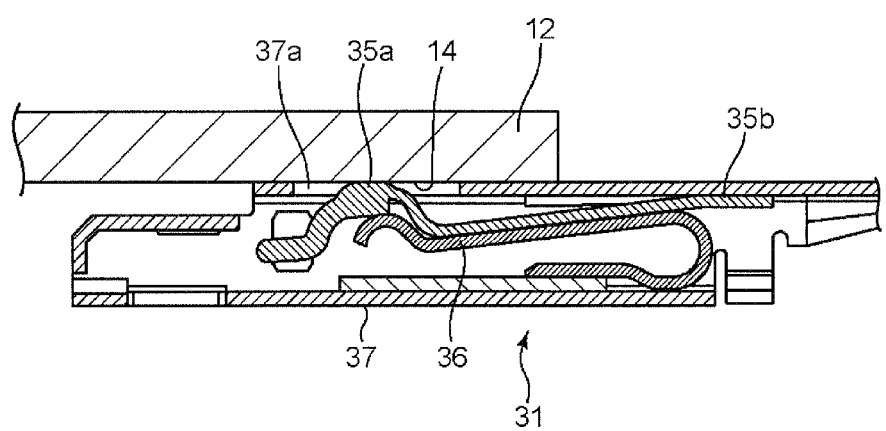

3) Insertion of the Circuit Board 10 into the Case 20 (FIG. 4)

In parallel with or before or after the processes 1) and 2), the circuit board 10 is inserted into the case 20 in the board inserting direction through the opening 21 with the edge part 16 opposite to the edge part 12 in the lead. The circuit board 10 is inserted up to the position (board holding position) where the edge part 16 comes into contact with the end wall 26 of the case 20.

4) Insertion of the Connector C into the Case 20 (FIGS. 6 to 10)

The connector C is further inserted into the opening 21 of the case 20. The housing 40 can be inserted until the front end 45 of the intermediate wall 44 comes into contact with the end surface of the edge part 12 of the circuit board 10 if the retainers 50A, 50B are completely pushed into the housing 40 to reach the connector terminal locking position in this connector (FIGS. 6 and 7). Associated with this insertion, the engaging projections 47 of the housing 40 are fitted into the locking holes 27 of the case 20 to lock the housing 40. States described below are simultaneously maintained by this locking.

a) The intermediate wall 44 and the end wall 26 sandwich the circuit board 10 from opposite sides in the board inserting direction to fix the circuit board 10 at the board holding portion.

b) The resilient contact piece 35 of each connector terminal 30 held in the housing 40 is in contact with the conductor for connection 14 of the circuit board 10 to electrically connect the conductor for connection 14 to the corresponding wire W.

c) The lid portion 48 of the housing 40 closes the opening of the case 20.

That is, in this electronic circuit unit, the locking of the connector C by the case 20 contributes not only to the closing of the opening 21, but also to the confirmation of the board holding position of the circuit board 10 and the maintenance of a connector terminal connected state. Accordingly, the circuit board 10 and the wires W can be electrically connected with high reliability without using two housings, i.e. a terminal-side housing and a board-side housing as before. Further, an operator can easily confirm the electrical connection by the locking (mounting) of the connector C.

On the other hand, if either one of the retainers 50A, 50B has been incompletely pushed and remains at the connector terminal releasing position, it prevents the housing 40 from being completely inserted into and locked in the case 20. For example, if the upper retainer 50A remains at the connector terminal releasing position as shown in FIGS. 8 to 10, the step portions 24*a* of the side walls 24 of the case 20 come into contact with the side walls 56 of that retainer 50A to prevent the housing 40 from being completely inserted. Further, if the lower retainer 50B remains at the connector terminal releasing position, the step portion 23*a* of the bottom wall 23 of the case 20 comes into contact with the outer wall 52 of that retainer 50B to prevent the housing 40 from being completely inserted. These automatically prevent the connector C from being erroneously mounted into the case 20 although the double locking by the retainers 50A, 50B has not been completed yet, thereby enhancing the reliability of the electronic circuit unit.

In this embodiment, the both edge parts 12, 16 of the circuit board 10 are restrained in the board inserting direction by the end wall 26 and the board restraining portion of the housing 40, i.e. the front end 45 of the intermediate wall 44 to fix the circuit board 10 at the board holding position. Thus, the case 20 needs not particularly include a mechanism for locking the circuit board 10. However, in the present invention, the case 20 may include a mechanism for actively locking the circuit board 10 in position. In such a case, the housing 40 needs not necessarily include the board restraining portion that comes into contact with the edge part 12, and it is sufficient to guarantee the contact of each connector terminal 30 and each conductor for connection 14 of the circuit board 10 at the position where the housing 40 is locked to the case 20.

Further, the processes 3) and 4) may be reversed in the above assembling procedure. That is, the circuit board 10 and the connector C may be inserted as an integral assembly into the case 20 through the opening 21 after the edge part 12 of the circuit board 10 is inserted between the connector terminals 30 in the upper row and those in the lower row in the connector C.

Figure 11:
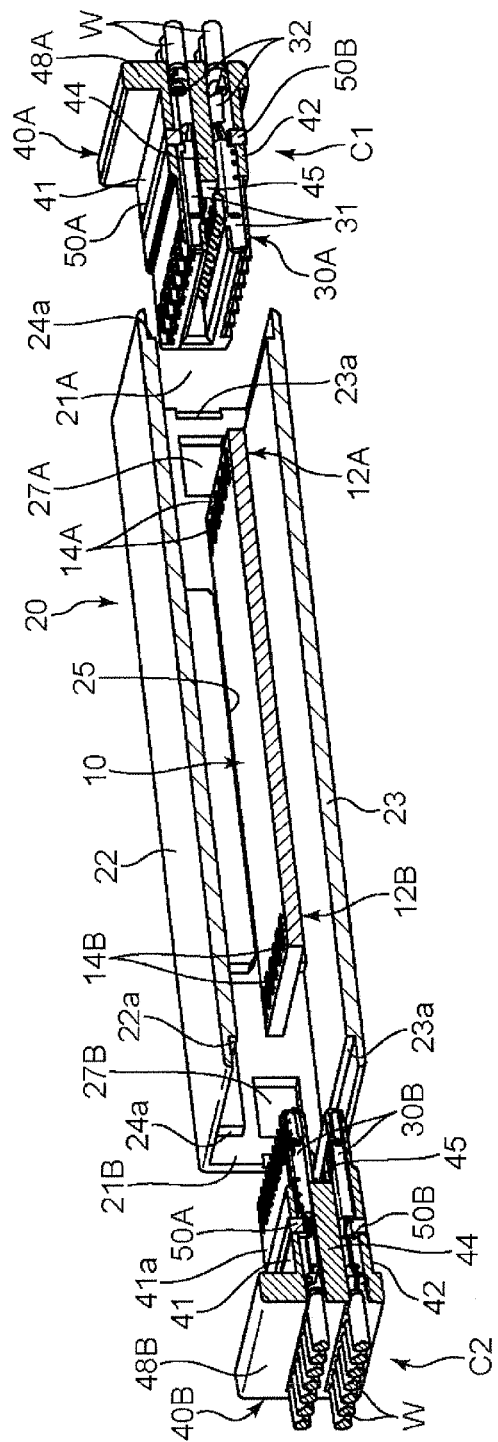
FIG. 11 is an exploded perspective view in section showing a circuit board, a case, a first connector and a second connector of an electronic circuit unit according to a second embodiment of the present invention.
Figure 12:
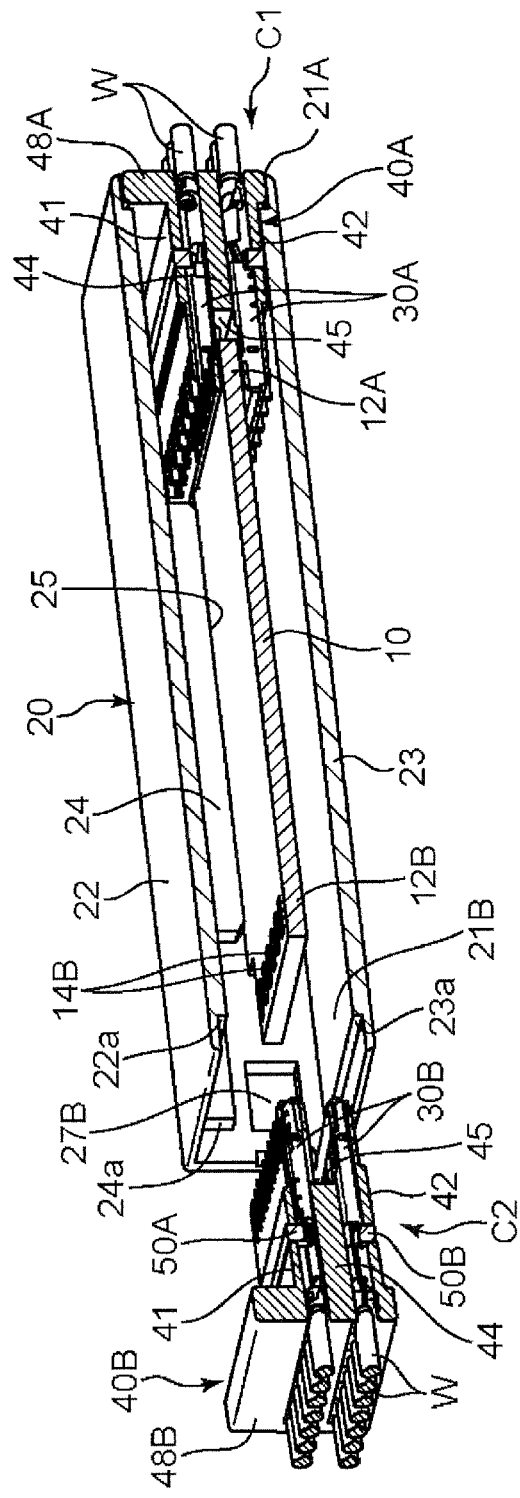
FIG. 12 is a perspective view in section showing a state where a first housing of the first connector is mounted in the case shown in FIG. 11.
Figure 13:
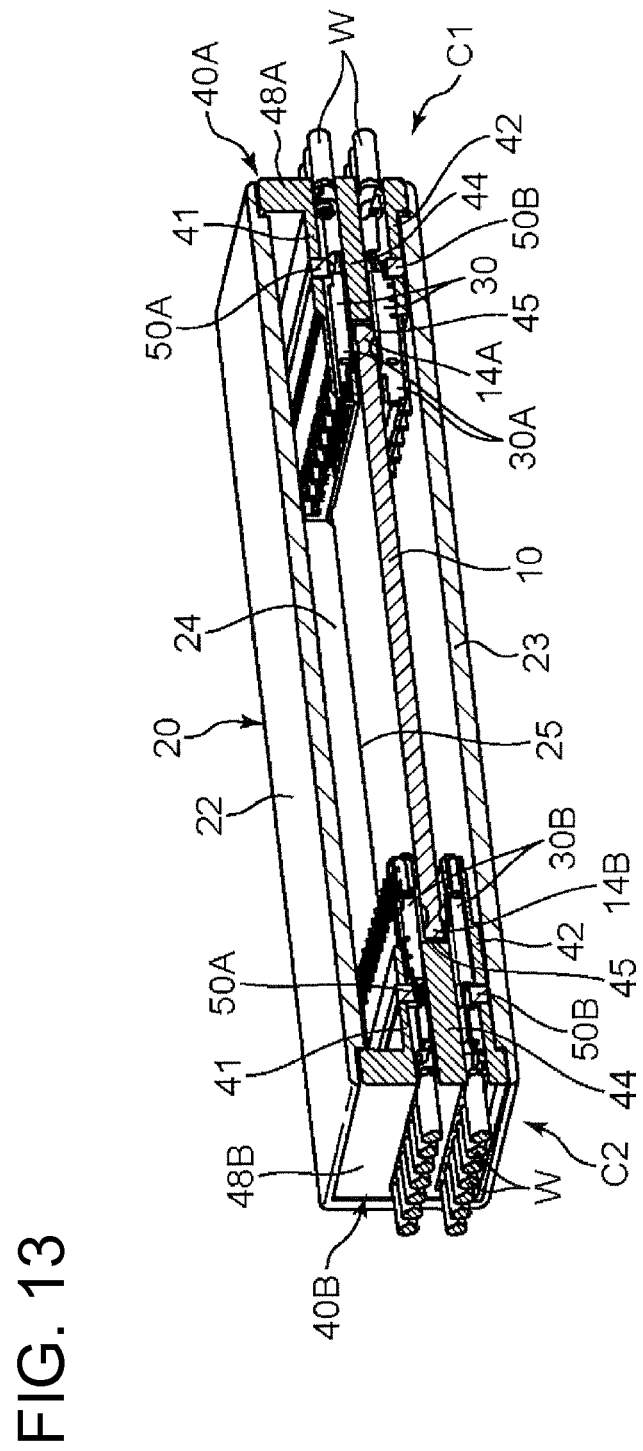
FIG. 13 is a perspective view in section showing a state where a second housing of the second connector is mounted in the case shown in FIG. 11 in addition to the first housing.
Figure 14:
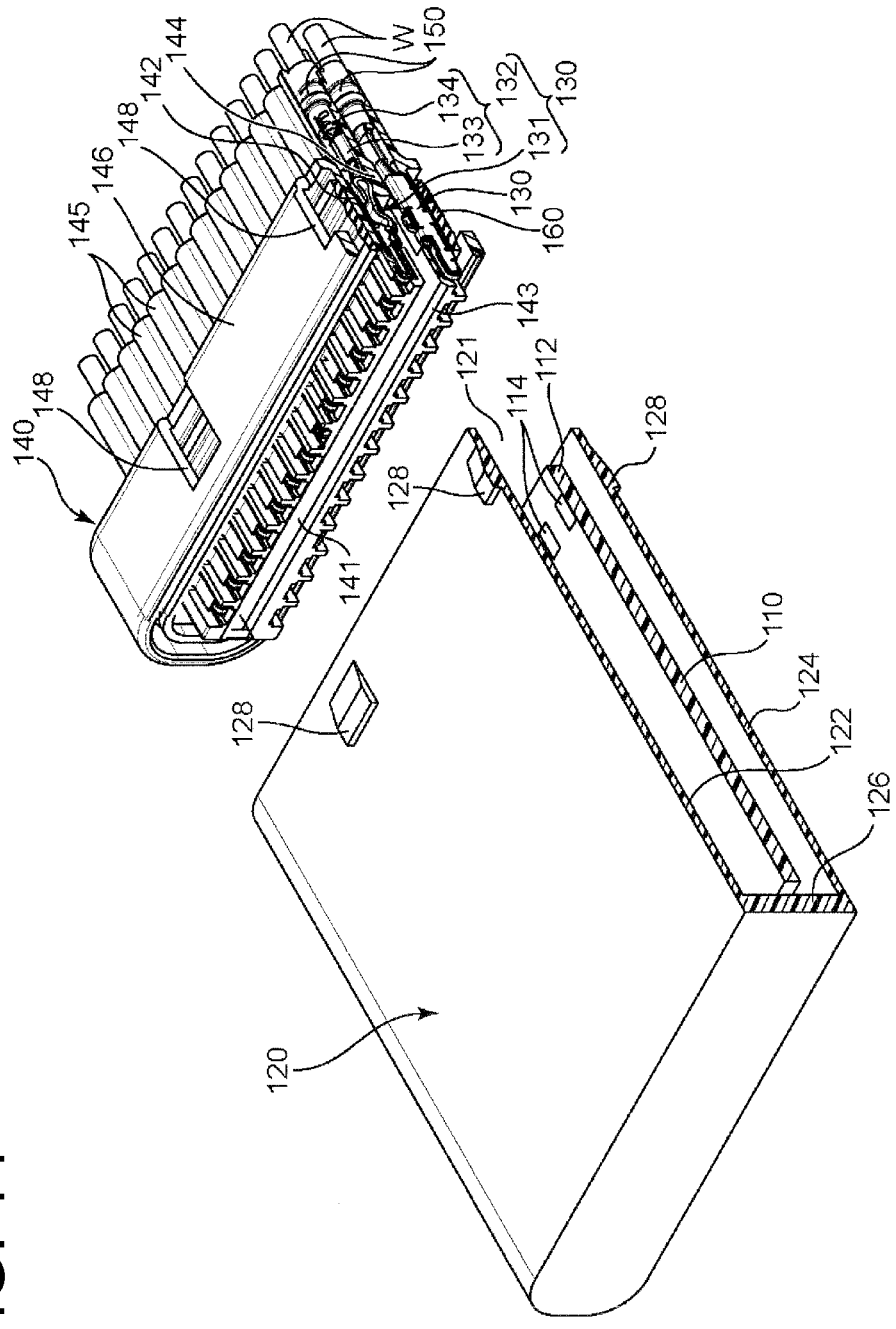
FIG. 14 is an exploded perspective view partly in section showing a state before a connector is mounted into a case of an electronic circuit unit according to a third embodiment of the present invention.
Figure 15:
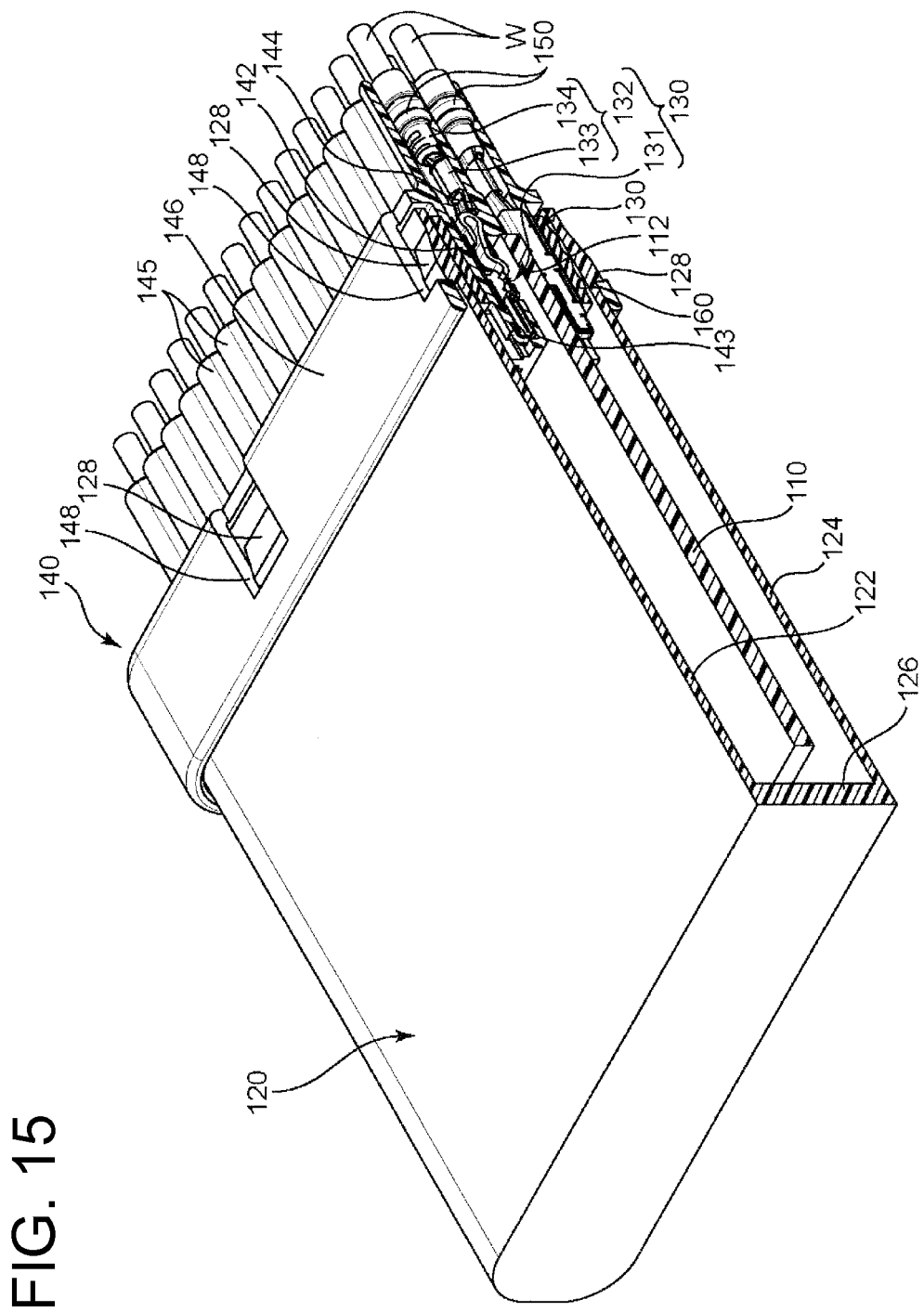
FIG. 15 is a perspective view partly in section showing a state where the connector is mounted in the case shown in FIG. 14.

Next, a second embodiment of the present invention is described mainly with reference to FIGS. 11 to 13.

An electronic circuit unit according to this embodiment includes a circuit board 10, a case 20 for housing the circuit board 10, and a first connector C1 and a second connector C2 for connecting a plurality of wires W to the circuit board 10.

The circuit board 10 is, for example, a printed circuit board, conductor patterns for circuit configuration are arranged on both sides thereof, and electronic components constituting circuits are mounted thereon. The circuit board 10 according to this embodiment has a rectangular shape. A plurality of first conductors for connection 14A and a plurality of second conductors for connection 14B in the form of thin plates are respectively provided on the top surface and the under surface of each of a first edge part 12A and a second edge part 12B (left and right edge parts in FIGS. 11 to 13) on opposite sides of the circuit board 10 in a specific direction. These conductors for connection 14A, 14B are arranged along the edge parts 12A, 12B.

The case 20 is formed into a substantially rectangular parallelepipedic shape, includes a first opening 21A which is open in the specific direction (leftward direction in FIGS. 11 to 13) and a second opening 21B which is open in a direction opposite to the specific direction and is shaped to allow the circuit board 10 to be inserted in a board inserting direction (either leftward or rightward direction in FIGS. 11 to 13) perpendicular to a plate thickness direction of the circuit board 10 through one of the openings with an edge part (second edge part 12B in the case of insertion through the first opening 21A, first edge part 12A in the case of insertion through the second opening 21B) opposite to the edge part corresponding to the one opening in the lead. Specifically, the case 20 includes a ceiling wall 22, a bottom wall 23 and a pair of left and right side walls 24 (only the side wall 24 on a back side is shown). The ceiling wall 22 and the bottom wall 23 are arranged on upper and lower sides in postures parallel to each other. The both side walls 24 are arranged between the ceiling wall 22 and the bottom wall 23 and form a rectangular tube body together with the ceiling wall 22 and the bottom wall 23.

A guiding groove 25 is formed in the inner side surface of each side wall 24. The respective guiding grooves 25 extend in the board inserting direction and have a width enabling left and right edge parts of the circuit board 10 to be inserted thereinto. By the insertion of the circuit board 10 into the case 20 associated with this insertion, the left and right edge parts of the circuit board 10 are held from both sides (upper and lower sides in this embodiment) by the both side walls 24.

The first and second openings 21A, 21B of the case 20 have the same shape as the opening 21 of the case 20 according to the first embodiment.

The first connector C1 includes a plurality of first connector terminals 30A, a first housing 40A for collectively holding these terminals and a pair of upper and lower retainers 50A, 50B, and the second connector C2 includes a plurality of second connector terminals 30B, a second housing 40B for collectively holding these terminals and a pair of upper and lower retainers 50B, 50B. The structures of the connector terminals 30A, 30B, those of the housings 40A, 40B and those of the retainers 50A, 50B are respectively equivalent to those of the connector terminals 30, that of the housing 40 and those of the retainers 50A, 50B of the connector C according to the first embodiment. Thus, these structures are not described here.

The first connector C1 is mounted in a part of the case 20 on the side of the first opening 21A. Accordingly, the first connector terminals 30A of the first connector C1 are arranged to simultaneously come into contact with the first conductors for connection 14A of the circuit board 10, a front end 45 of an intermediate wall 44 of the first housing 40A of the first connector C1 constitutes a first board restraining portion capable of coming into contact with an end surface of the first edge part 12A of the circuit board 10 at a position where the first connector terminals 30A come into contact with the first conductors for connection 14A, and the first housing 40A is shaped to close the first opening 21A.

Similarly, the second connector C2 is mounted in a part of the case 20 on the side of the second opening 21B. Accordingly, the second connector terminals 30B of the second connector C2 are arranged to simultaneously come into contact with the second conductors for connection 14B of the circuit board 10, a front end 45 of an intermediate wall 44 of the second housing 40B of the second connector C2 constitutes a second board restraining portion capable of coming into contact with an end surface of the second edge part 12B of the circuit board 10 at a position where the second connector terminals 30B come into contact with the second conductors for connection 14B, and the second housing 40B is shaped to close the second opening 21B.

First locking holes 27A and second locking holes 27B respectively located near the first and second openings 21A, 21B are provided in the side walls 24 of the case 20. Contrary to this, unillustrated first engaging projections to be fitted into the first locking holes 27A to be locked to the case 20 at a position where a first lid portion 48A closes the first opening 21A are formed on side walls 46 of the first housing 40A, and unillustrated second engaging projections to be fitted into the second locking holes 27B to be locked to the case 20 at a position where a second lid portion 48B closes the second opening 21B are formed on side walls 46 of the second housing 40B.

As a feature of this embodiment, lateral dimensions of the circuit board 10 and the case 20 are so set that the first engaging projections of the first housing 40A and the second engaging projections of the second housing 40B are respectively fitted into the first and second locking holes 27A, 27B in a state where the first and second edge parts 12A, 12B of the circuit board 10 are respectively in contact with the front ends 45 of the intermediate walls 44 of the first and second housings 40A, 40B.

Similarly to the opening 21 in the first embodiment, a step portion 22a of the ceiling wall 22, a step portion 23a of the bottom wall 23 and step portions 24a of the side walls 24 are respectively formed near the first and second openings 21A, 21B. Accordingly, similarly to the connector C of the first embodiment, if the upper retainer 50A of the first or second connector C1 or C2 remains at the connector terminal releasing position, the step portion 24a near the first or second openings 21A or 21B comes into contact with side walls 56 of the retainer 50A, thereby preventing the first or second housing 40A or 40B from being mounted. Similarly, if the lower retainer 50A of the first or second connector C1 or C2 remains at the connector terminal releasing position, the step portion 23a near the first or second openings 21A or 21B comes into contact with the outer wall 52 of the retainer 50B, thereby preventing the first or second housing 40A or 40B from being mounted.

Also in this second embodiment, the retainers 50A, 50B can be omitted. Further, the conductors for connection 14A, 14B may not necessarily be arranged on both sides of the circuit board 10 and may be formed only on one of them.

Next, an assembling procedure of this electronic circuit unit is described. Note that the insertion of the connector terminals 30A, 30B into the respective housings 40A, 40B and double locking by the retainers 50A, 50B are not described since being similar to those in the first embodiment.

1) Insertion of the Circuit Board 10 into the Case 20 (FIG. 11)

The circuit board 10 is inserted into the case 20 through either one of the openings 21A, 21B. The circuit board 10 is inserted up to a substantially middle position of the case 20 in a longitudinal direction (board inserting direction).

2) Insertion of the First Connector C1 into the Case 20 (FIG. 12)

The first connector C1 is inserted into the first opening 21A of the case 20 and the first housing 40A thereof is locked to the case 20 by the first locking holes 27A of the case 20. At this stage, the position of the circuit board 10 is not determined yet. Further, also in this second embodiment, the first housing 40A is prevented from being completely inserted and mounted into the case 20 if the retainer 50A or 50B of the first connector C1 has not reached the connector terminal locking position.

3) Insertion of the Second Connector C2 into the Case 20 (FIG. 13)

The second connector C2 is inserted into the second opening 21B of the case 20. At this time, if the first housing 40A is normally locked to the case 20 on the side of the first opening 21A, the second housing 40B is locked to the case 20 by the second locking holes 27B in a state where the front end 45 of the intermediate wall 44 in the second housing 40B of the second connector C2 is in contact with an end surface of the second edge part 12B and the front end 45 of the intermediate wall 44 in the first housing 40A of the first connector C1 is in contact with an end surface of the first edge part 12A. At this point of time, the following states are determined.

a) The intermediate walls 44 of the both housings 40A, 40B sandwich the circuit board 10 from opposite sides in the board inserting direction to fix the circuit board 10 at the board holding portion.

b) Resilient contact pieces 35 of the respective connector terminals 30A, 30B held in the respective housings 40A, 40B are in contact with the conductors for connection 14A, 14B of the circuit board 10 to electrically connect the conductors for connection 14 to corresponding wires W.

c) The lid portions 48 of the housings 40A, 40B close the first and second openings 21A, 21B of the case 20.

That is, in the electronic circuit unit according to this embodiment, it is possible not only to double the number of the connectable wires W using the first and second connectors C1, C2, but also to guarantee contact states of the connector terminals 30A, 30B in the respective connectors C1, C2 and the conductors for connection 14A, 14B of the circuit board 10 utilizing the case 20 for holding the circuit board 10 from opposite sides in the plate thickness direction of the circuit board 10. There is also an advantage of being able to easily confirm this. Further, by preventing the housings 40A, 40B from being mounted when either one of the retainers 50A, 50B is in a connector terminal releasing state, it is automatically prevented that the connectors C1, C2 are erroneously mounted into the case 20 although the double locking by the retainers 50A, 50B has not been completed yet, thereby enhancing the reliability of the electronic circuit unit.

In this second embodiment, the both connectors C1, C2 may not be identical. For example, the sizes, the numbers of poles, specific arrangements of the connector terminals may differ from each other.

A third embodiment of the present invention is described with reference to FIGS. 14 to 19.

An electronic circuit unit according to this third embodiment is a unit of a type similar to the electronic circuit unit of the first embodiment and has a waterproof function. Specifically, this electronic circuit unit includes a circuit board 110, a case 120 for housing the circuit board 110, a connector for connecting a plurality of wires W to the circuit board 110, a plurality of waterproof plugs 150 as a plurality of wire-side seal members, and a seal ring 160 as a connector-side seal member, and the connector includes a plurality of connector terminals 130 and a housing 140 for holding these.

The circuit board 110 is, for example, a printed circuit board, conductor patterns for circuit configuration are arranged on both sides thereof, and electronic components constituting circuits are mounted thereon. The circuit board 110 according to this third embodiment has a rectangular shape. A plurality of conductors for connection 114 in the form of thin plates are provided on each of the top surface and the under surface of one edge part (right edge part in FIGS. 14 to 16) 112. These conductors for connection 114 are arranged along the edge part 112.

Figure 16:
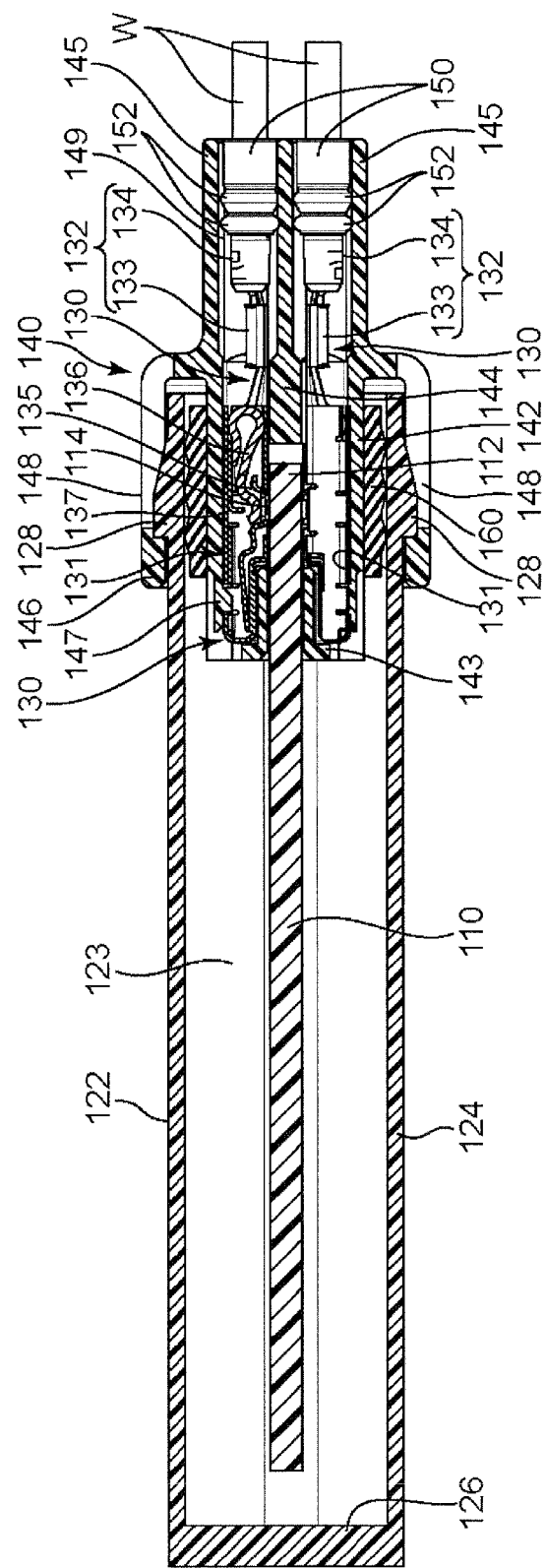
FIG. 16 is a sectional front view showing the state of FIG. 15.
Figure 17:
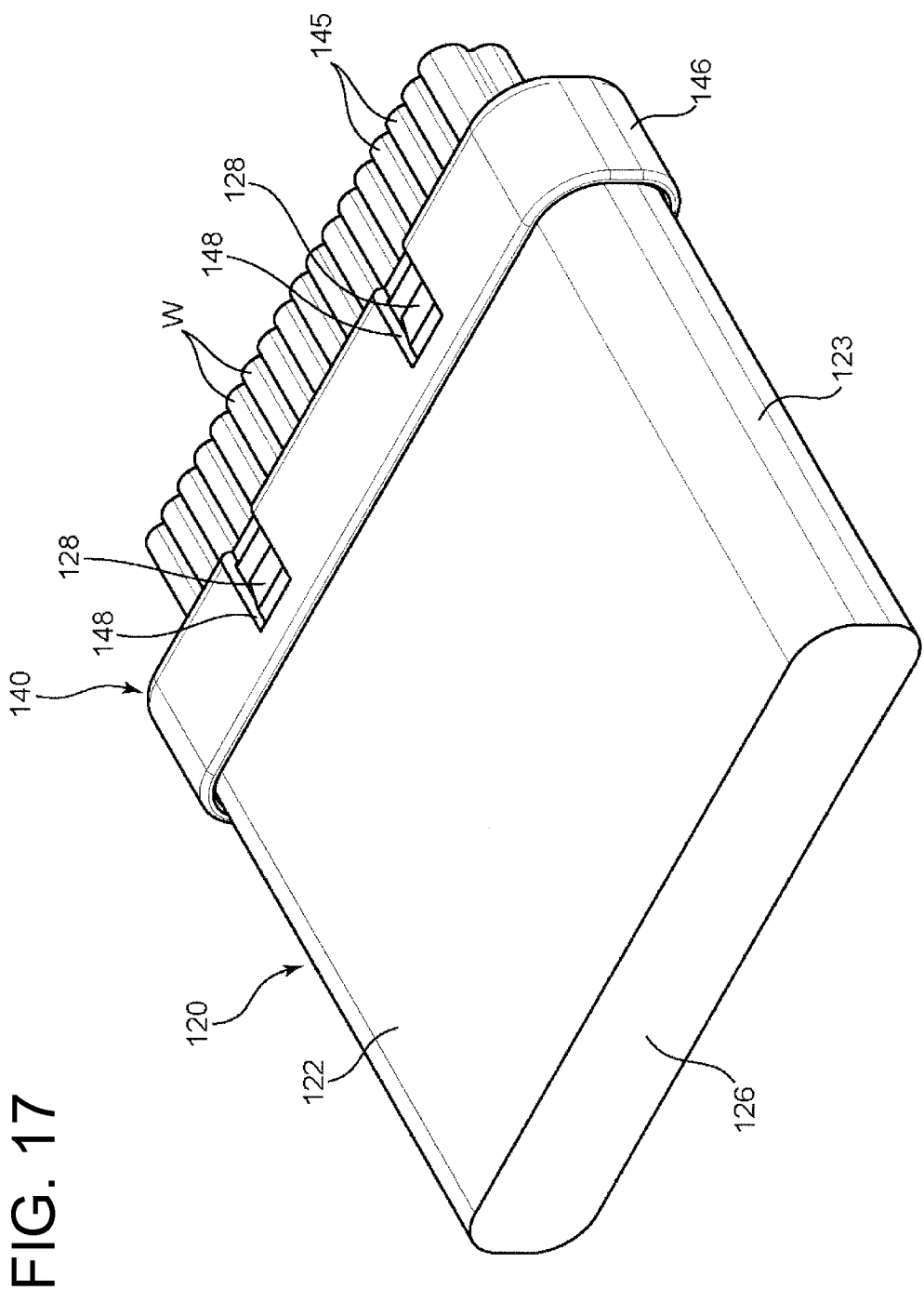
FIG. 17 is a perspective view showing the state of FIG. 15.

The case 120 is formed into a substantially rectangular parallelepipedic shape, includes an opening 121 which is open in a specific direction (rightward direction in FIGS. 14 to 16) and is shaped to allow the circuit board 110 to be inserted in a board inserting direction (leftward direction in FIGS. 14 to 16 in this third embodiment) perpendicular to a plate thickness direction of the circuit board 110 through this opening 121 with an edge part opposite to the edge part 112 in the lead. Specifically, the case 120 includes a ceiling wall 122, a bottom wall 124, a pair of left and right side walls 123 (only the side wall 123 on a back side is shown in FIG. 16) and an end wall 126. The ceiling wall 122 and the bottom wall 124 are arranged on upper and lower sides in postures parallel to each other. The both side walls 123 are arranged between the ceiling wall 122 and the bottom wall 124 and form a rectangular tube body together with the ceiling wall 122 and the bottom wall 123. The end wall 126 is integrally connected to the respective walls 122 to 124 to close an opening (left opening in FIGS. 14 to 16) of this rectangular tube body opposite to the opening 121. A plurality of locking projections 28 as a housing locking portion for locking the housing 140 of the connector as described later are formed to project outward on parts of the ceiling wall 122 and the bottom wall 124 near the opening 121.

Each connector terminal 130 is mounted on an end of a corresponding wire W and brought into contact with each conductor for connection 114 of the circuit board 110 to electrically connect the circuit board 110 and the wire W. The housing 140 is formed of an insulating material such as synthetic resin and mounted into the case 120 while collectively holding the connector terminals 130.

The wire W is composed of an unillustrated conductor and an insulation coating covering the conductor. The insulation coating is partly removed at the end of the wire W to expose the conductor. The waterproof plug 150 is mounted at a position immediately behind the part where the conductor is exposed in this way. This waterproof plug 150 is made of a resiliently deformable material such as rubber and has a tubular shape to surround the wire W from an outer side.

Each connector terminal 130 is made of an electrically conductive metal plate and integrally includes a board connecting portion 131 located on a front side and a wire connecting portion 132 located on a rear side. The wire connecting portion 132 includes left and right conductor barrels 133 and left and right insulation barrels 134 located behind the conductor barrels 133. The both conductor barrels 133 are so crimped to the conductor as to embrace the conductor exposed at the end of the wire W, thereby being electrically conductively connected to the conductor. The both insulation barrels 134 are so crimped to the wire W as to embrace a part of the insulation coating located behind the exposed part of the conductor and a front end part of the waterproof plug 150 located at an outer side together. In this way, the waterproof plug 150 is mounted on the wire W to be held in close contact with the outer peripheral surface of the wire W.

Figure 18:
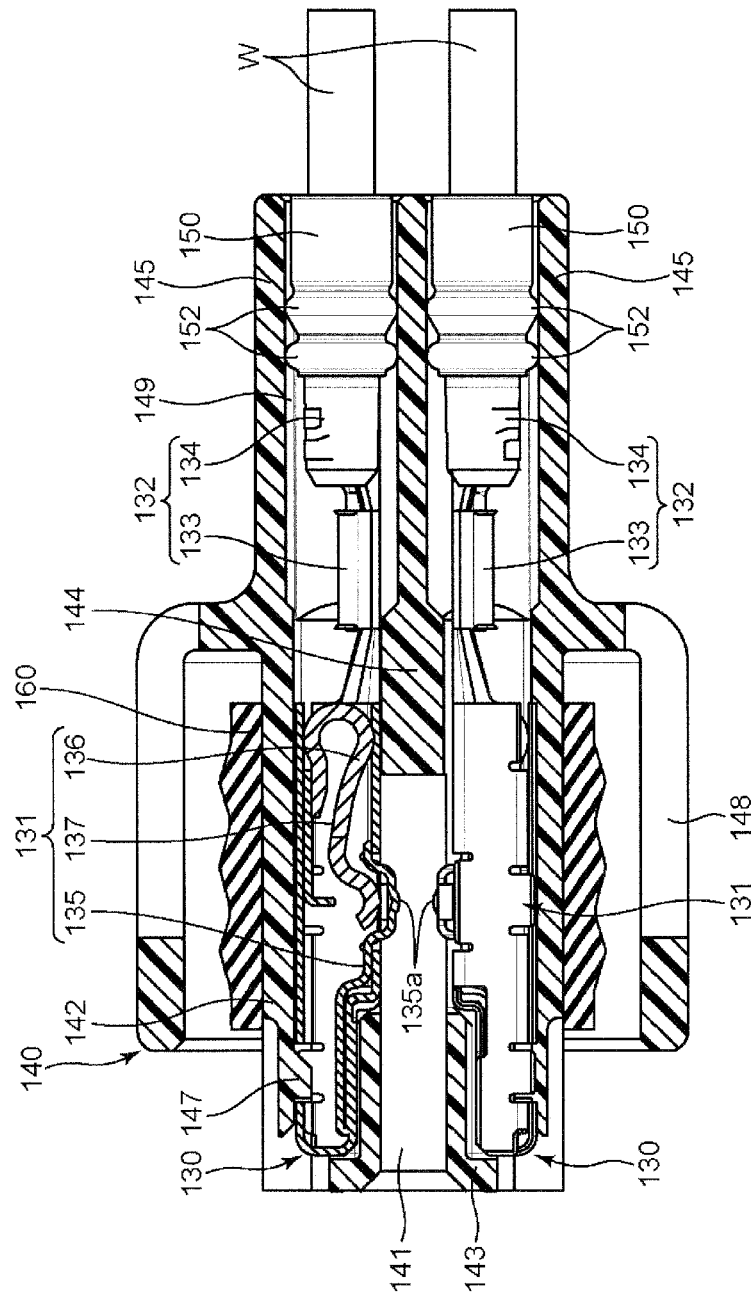
FIG. 18 is a sectional front view showing the connector shown in FIG. 14 and a connector-side seal member fixed to a housing of the connector.
Figure 19:
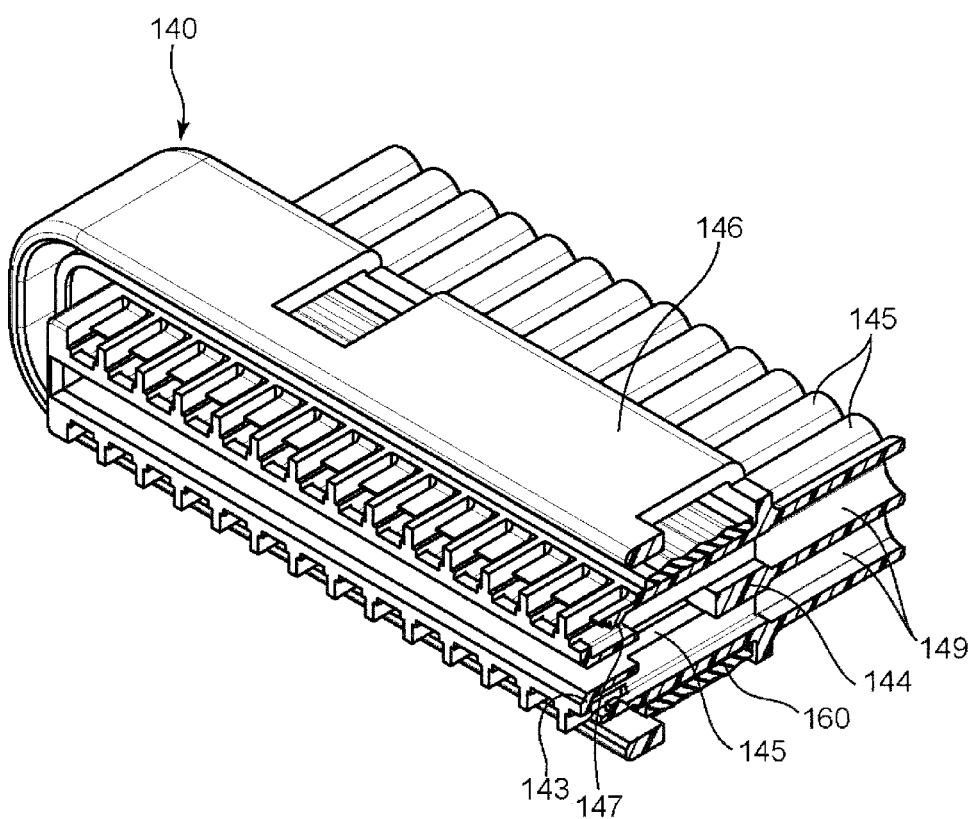
FIG. 19 is a perspective view partly in section showing the housing of the connector shown in FIG. 14 and the connector-side seal member fixed to the housing.
Figure 20:
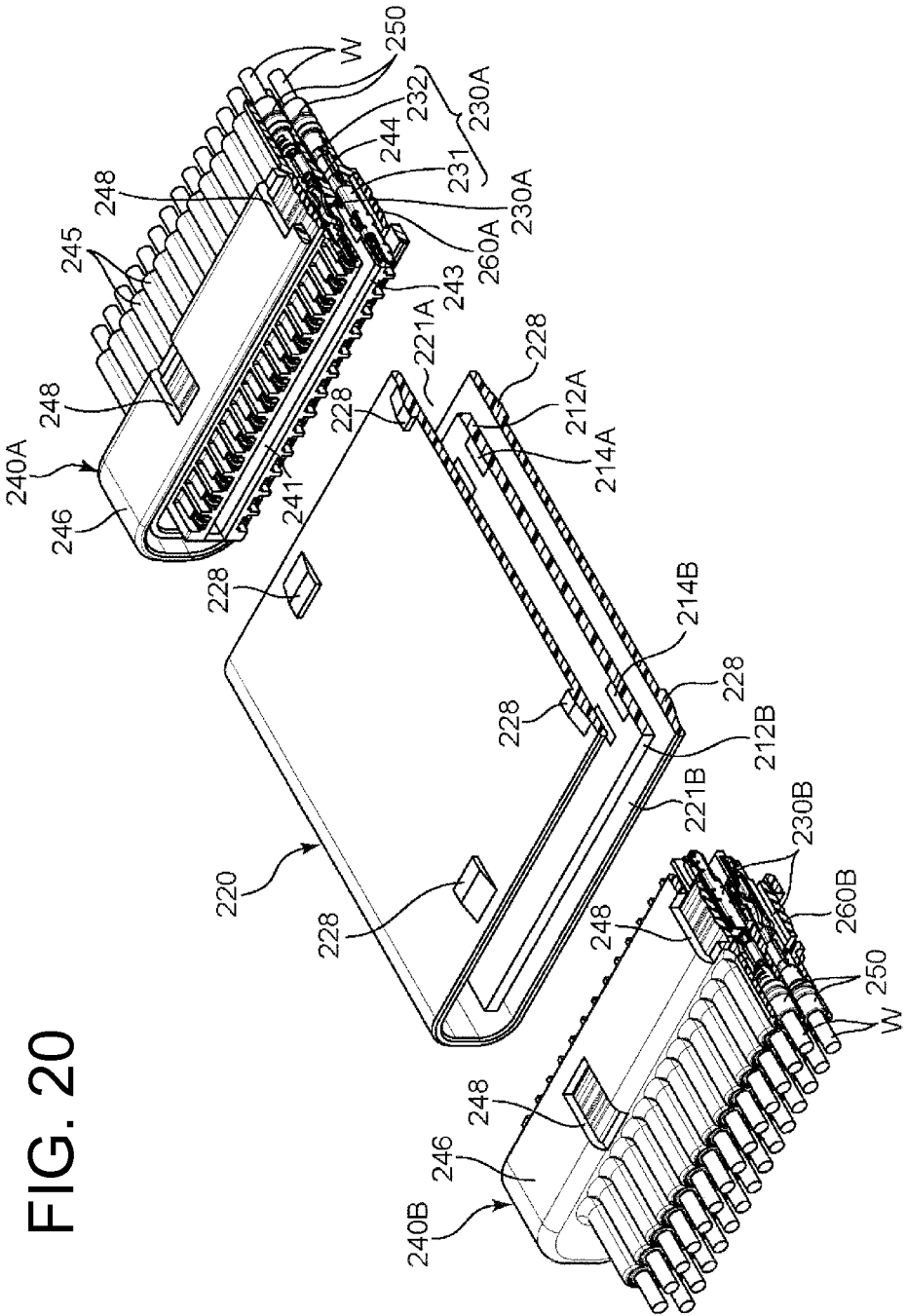
FIG. 20 is an exploded perspective view partly in section showing a state before a first connector and a second connector are mounted into a case of an electronic circuit unit according to a fourth embodiment of the present invention.
Figure 21:
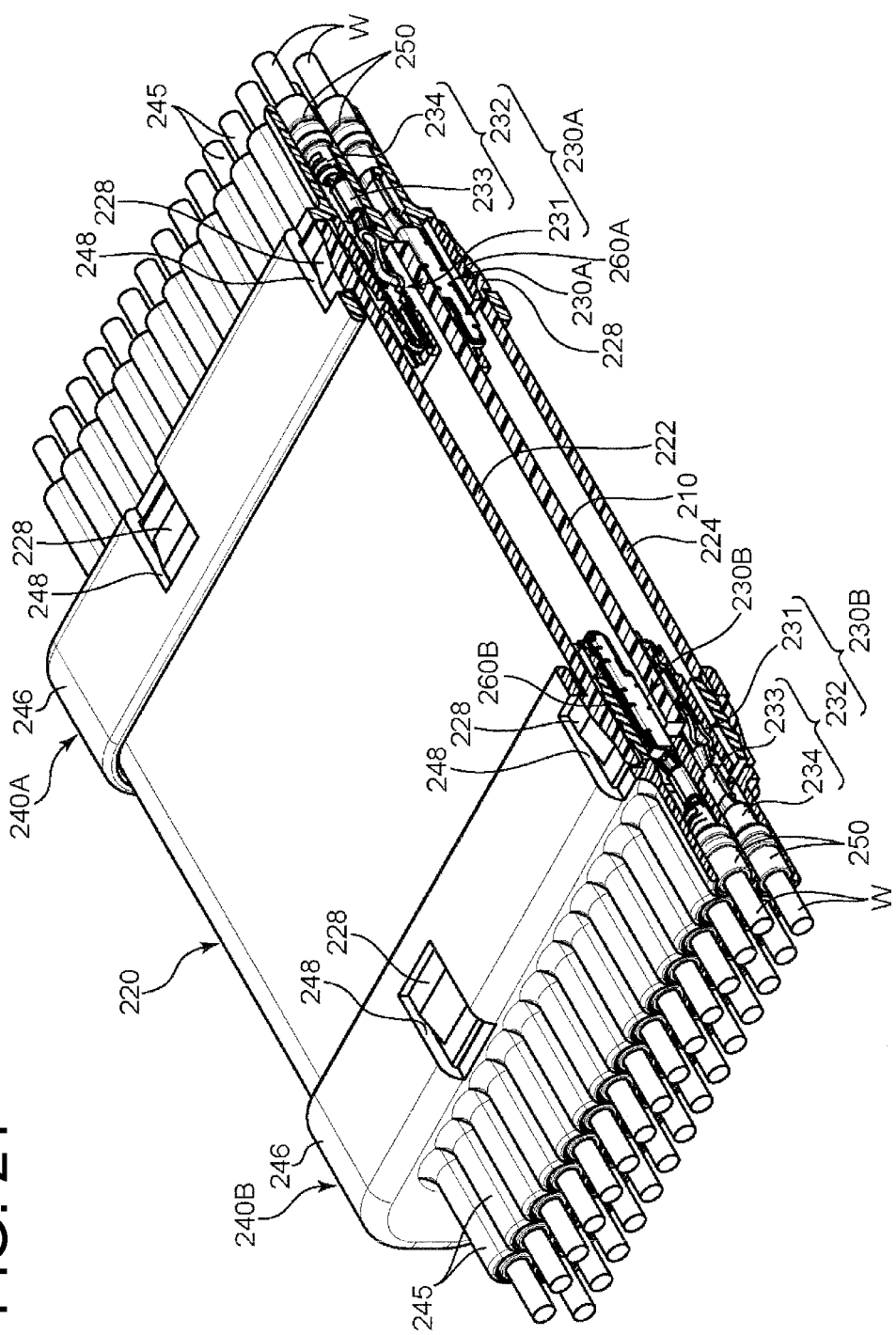
FIG. 21 is a perspective view partly in section showing a state where the first and second connectors are mounted in the case shown in FIG. 20.

The board connecting portion 131 is composed of a main body 137, a resilient contact piece 135 and a resilient force reinforcing member 136 as shown in FIGS. 16 and 18. The main body 137 is integrally formed to the wire connecting portion 132 and has a rectangular tube shape. The resilient contact piece 135 extends in an axial direction of the connector terminal 130, a front end part thereof is integrally connected to the main body 137, and a rear end part thereof can be vertically deflected and displaced with the front end part as a support point. This rear end part constitutes a contact end part 135a (FIG. 18) to be brought into contact with the conductor for connection 114 of the circuit board 110 while being resiliently displaced. The resilient contact piece 135 is shaped to project outward from the main body 137 in a state where the resilient contact piece 135 is not deformed as shown in FIG. 18. However, when coming into contact with the edge part 112 of the circuit board 110 as shown in FIG. 16, the contact end part 135a receives a reaction force from the edge part 112, is deflected and displaced to retract into the main body 137 and is pressed into contact with the conductor for connection 114 on the edge part 112 by a resilient force thereof. The resilient force reinforcing member 136 is so provided in the main body 137 as to be resiliently deformed as the contact end part 135a is deflected and displaced, and reinforces a resilient restoring force of the contact end part 135a by a resilient force resulting from the resilient deformation thereof.

The housing 140 collectively holds the connector terminals 130 in such an arrangement that the contact end parts 135a of the resilient contact pieces 135 in the respective connector terminals 130 simultaneously come into contact with the conductors for connection 114 on the opposite surfaces of the edge part 112 of the circuit board 110. Specifically, this housing 140 integrally includes a terminal holding portion, a plurality of terminal inserting portions 145 located behind the terminal holding portion, and a cover portion 146.

The terminal holding portion is shaped to be insertable into the opening 121 of the case 120 while mainly holding the board contact portion 131 of each connector terminal 130, and holds each connector terminal 130 such that each board connecting portion 131 and each conductor for connector 114 of the circuit board 110 can come into contact with each other in an inserted state thereof.

The terminal holding portion according to this third embodiment includes a front inner wall 143, a rear inner wall 144 spaced backward from the front inner wall 143, and a peripheral wall 142 surrounding these inner walls 143, 144, and a plurality of terminal accommodating chambers for holding the accommodated board connecting portions 131 of the respective connector terminals 130 are formed between the inner walls 143, 144 and the peripheral wall 142. The front inner wall 143 surrounds a board insertion space 141 into which the edge part 112 of the circuit board 110 is insertable from front, and the rear inner wall 144 is located behind the board insertion space 141.

A contact space is ensured between the both inner walls 143, 144, and each connector terminal 130 is so held in the housing 140 that the contact end part 135a of the resilient contact piece 135 of each board connecting portion 131 projects into this contact space. Specifically, the connector terminals 130 (connector terminals 130 in an upper row) accommodated in the terminal accommodating chambers between the both inner walls 143, 144 and an upper part of the peripheral wall 142 are so held in the housing 140 that the contact end parts 135a thereof face downward, and the connector terminals 130 (connector terminals 130 in a lower row) accommodated in the terminal accommodating chambers between the both inner walls 143, 144 and a lower part of the peripheral wall 142 are so held in the housing 140 that the contact end parts 135a thereof face upward. Holding positions of the respective connector terminals 130 in the housing 140 are so set that the contact end parts 135a of the connector terminals 130 simultaneously come into contact with the conductors for connection 114 of the circuit board 110 in a state where the edge part 112 of the circuit board 110 is inserted to a predetermined depth in the board insertion space. Specifically, the housing 140 holds the connector terminals 130 such that the connector terminals 130 to be respectively connected to the conductors for connection 114 arranged on one surface (upper surface in FIGS. 14 to 16 and 18) of the circuit board 110 are juxtaposed in a direction along the edge part 112 of the circuit board 110 to form a first connector terminal row (upper connector terminal row in FIGS. 14 to 16 and 18) and the connector terminals 130 to be respectively connected to the conductors for connection 114 arranged on the other surface (lower surface in FIGS. 14 to 16 and 18) of the circuit board 110 are juxtaposed in a direction parallel to the first connector terminal row to form a second connector terminal row (lower connector terminal row in FIGS. 14 to 16 and 18).

A plurality of locking lances (connector terminal locking portions) extend forward from the front end of the peripheral wall 142. Each locking lance 147 is for locking the board connecting portion 131 of the connector terminal 130, and the front end thereof is deflected and displaced in a direction to be retracted from the connector terminal 130 with the rear end thereof as a support point. The locking lance 147 locks an appropriate position of the connector terminal 130 by being resiliently restored when the insertion of the connector terminal 130 is completed.

Each terminal inserting portion 145 has such an inner peripheral surface surrounding a connector terminal insertion hole 149 into which the board connecting portion 131 of the corresponding connector terminal 130 is insertable from behind, and is integral to and extends backward from the terminal holding portion. Each terminal inserting portion 145 according to this third embodiment has a cylindrical shape and includes a cylindrical inner peripheral surface surrounding the connector terminal insertion hole. These terminal inserting portions 145 are respectively formed at such positions that the board connecting portions 131 of the connector terminals 130 inserted into the connector terminal insertion holes 149 surrounded by the terminal inserting portions 145 from behind are directly accommodated in the terminal accommodating chambers of the terminal holding portion.

Here, to seal the interior of the case 120, each waterproof plug 150 is shaped to be held in close contact with the inner peripheral surface of the corresponding terminal inserting portion 145 over the entire circumference in a state where the board connecting portion 131 is inserted in the terminal accommodating chamber. Specifically, a plurality of elongated projections 152 projecting radially outward and extending over the entire circumference are formed on the outer peripheral surface of each waterproof plug 150, and the entrance of moisture into the housing 140 through the terminal inserting portion 145 is prevented by these elongated projections 152 being held in contact with the inner peripheral surface of the terminal inserting portion 145 over the entire circumference while being resiliently deformed.

The cover portion 146 is shaped to cover the terminal holding portion and the seal ring 160 from an outer side. Specifically, the cover portion 146 integrally includes a part projecting outward from the rear end of the peripheral wall 142 and a part extending further forward from this part and covering the peripheral wall 142 and also an end part (part surrounding the opening 121) of the case 120, into which the peripheral wall 142 is inserted, from an outer part. The cover portion 146 is formed with through holes 148 into which locking projections 128 of the case 120 are fittable from an inner side. These through holes 148 form engaging portions for holding a mounted state of the housing 140 in the case 120 by being engaged with the respective locking projections 128, specifically holding the housing 140 at a position where each connector terminal 130 held in the terminal holding portion of the housing 140 can be held in contact with the corresponding conductor for connection 114 of the circuit board 110 in the case 120.

The seal ring 160 is made of a resiliently deformable material such as rubber and for bringing the case 120 and the housing 140 into close contact to seal the interior of the case 120. In this third embodiment, the seal ring 160 is in the form of an endless strip surrounding the peripheral wall 142 and fixed in a state held in close contact with the outer peripheral surface of the peripheral wall 142 over the entire circumference. This seal ring 160 has an outer peripheral surface to be held in close contact with the inner peripheral surface of the case 120 over the entire circumference while being resiliently deformed in a state where the terminal holding portion of the housing 140 is inserted in the case 120 through the opening 121. The entrance of moisture into the case 120 through a clearance between the case 120 and the peripheral wall 142 is prevented by this close contact. In this third embodiment, a plurality of circumferentially elongated projections are formed on the outer peripheral surface of the seal ring 160 to facilitate the resilient deformation of the seal ring 160.

Next, an example of an assembling procedure of this electronic circuit unit is described.

1) Insertion of the Connector Terminals 130 into the Housing 140

The board connecting portion 131 of each connector terminal 130 is inserted into each connector terminal insertion hole 149 of the housing 140 from behind. This board connecting portion 131 reaches the terminal accommodating chamber of the terminal holding portion and is locked by the locking lance 147. In this way, the respective connector terminals 130 are arranged in two upper and lower rows and held in the common housing 140 in such postures that the contact end parts 135a thereof face inward. At this time, the waterproof plugs 150 mounted on the wires W behind the respective connector terminals 130 are held in close contact with the inner peripheral surfaces of the terminal inserting portions 45 surrounding the connector terminal insertion holes 149 over the entire circumference, thereby providing sealing between the wires W and the terminal inserting portions 145. Specifically, waterproofing on the side of the wires W is performed.

2) Insertion and Holding of the Circuit Board 110 into the Case 120

The circuit board 110 is inserted into the case 120 through the opening 121 with the edge part opposite to the edge part 112 in the lead and held at a predetermined position, specifically at a position where the edge part 112 of this circuit board 110 is insertable into the board insertion space 141 of the housing 140. In the present invention, a specific means for holding the circuit board 110 in this case 120 does not matter. For example, the case 120 and the circuit board 110 may be coupled using a dedicated member other than the case 120, or the circuit board 110 may be held in the case 120 by forming holding grooves, into which left and right edge parts of the circuit board 110 are respectively fittable, in the inner side surfaces of the both side walls 123 and fitting the left and right edge parts into these holding grooves. With respect to the board inserting direction, the circuit board 110 may be restrained between the end wall 126 of the case 120 and the rear inner wall 144 of the housing 140 of the connector without forming any clearance or with a small clearance formed, or the circuit board 110 may be positioned by the shape of the holding grooves. Alternatively, the circuit board 110 may be held in the connector only by connecting forces of the circuit board 110 and the respective connector terminals 130 (forces of the connector terminals 130 in the upper and lower rows sandwiching the circuit board 110) or a structure for reinforcing this holding may be added to the housing 140 of the connector. In the latter case, i.e. in the case of holding the circuit board 110 singly by the connector, the circuit board 110 is inserted into the case 120 after the circuit board 110 and the connector are connected.

3) Mounting of the Connector into the Case 120

The connector is mounted into an end part of the case 120 on the side of the opening 121. Specifically, the terminal holding portion of the housing 140 of this connector is inserted into the case 120 through the opening 121 and the locking projections 128 of the case 120 are fitted into the through holes 148 of the cover portion 146 of the housing 140, whereby the housing 140 is locked to the case 120.

When this locking is performed or when the circuit board 110 and the connector are connected in advance, the edge part 112 of the circuit board 110 is inserted into the board insertion space 141 of the housing 140, whereby each conductor for connection 114 arranged on the edge part 112 and the board connecting portion 131 of each connector terminal held in the housing 140, more specifically the contact end part 135a of the resilient contact piece 135, come into contact with each other. In this way, the circuit board 110 and each wire W are electrically connected via each connector terminal 130. Further, at the position where the housing 140 is locked as described above, the outer peripheral surface of the seal ring 160 as the connector-side seal member is held in contact with the inner peripheral surface of the end part of the case 120 on the side of the opening 121 over the entire circumference, thereby preventing the entrance of moisture into the case 120 through the clearance between the inner peripheral surface of the case 120 and the outer peripheral surface of the peripheral wall 142 of the housing 140. Specifically, waterproofing on the connector side is performed.

As just described, the electronic circuit unit shown in FIGS. 14 to 19 includes the case 120 for housing the circuit board 110 and, in addition, the housing 140 for holding each connector terminal 130 is utilized as a lid for closing the opening 121 of the case 120. Thus, connected parts of the circuit board 110 and the connector (specifically, contact parts of the respective conductors for connection 114 and the board connecting portions 131 of the respective connector terminals 130) can be reliably waterproofed by a simple structure including only a plurality of wire-side seal members (the plurality of waterproof plugs 150 in this third embodiment) to be mounted on the respective wires W and the connector-side seal member (seal ring 160 in this third embodiment) to be interposed between the terminal holding portion of the housing 140 and the case 120 as members for waterproofing.

A fourth embodiment of the present invention is described with reference to FIGS. 20 to 25.

An electronic circuit unit according to this fourth embodiment is a unit of a type similar to the electronic circuit unit of the second embodiment and has a waterproof function as in the third embodiment. Specifically, this electronic circuit unit includes a circuit board 210, a case 220 for housing the circuit board 210, a first connector and a second connector for connecting a plurality of wires W to the circuit board 210, a plurality of waterproof plugs 250 as a plurality of wire-side seal members, a first seal ring 260A as a first connector-side seal member and a second seal ring 260B as a second connector-side seal member. The first connector includes a plurality of first connector terminals 230A and a first housing 240A for holding these, and the second connector includes a plurality of second connector terminals 230B and a second housing 240B for holding these.

The circuit board 10 is, for example, a printed circuit board, conductor patterns for circuit configuration are arranged on both sides thereof, and electronic components constituting circuits are mounted thereon. The circuit board 210 according to this fourth embodiment has a rectangular shape. A plurality of first conductors for connection 214A in the form of thin plates are respectively provided on the top surface and the under surface of a first edge part 212A, which is one edge part (right edge part in FIGS. 20 to 22). Similarly, a plurality of second conductors for connection 214B in the form of thin plates are respectively provided on the top surface and the under surface of a second edge part 212B, which is an edge part (left edge part in FIGS. 20 to 22) opposite to the first edge part 212A. These conductors for connection 214A, 214B are respectively arranged along the first and second edge parts 212A, 212B.

Figure 22:
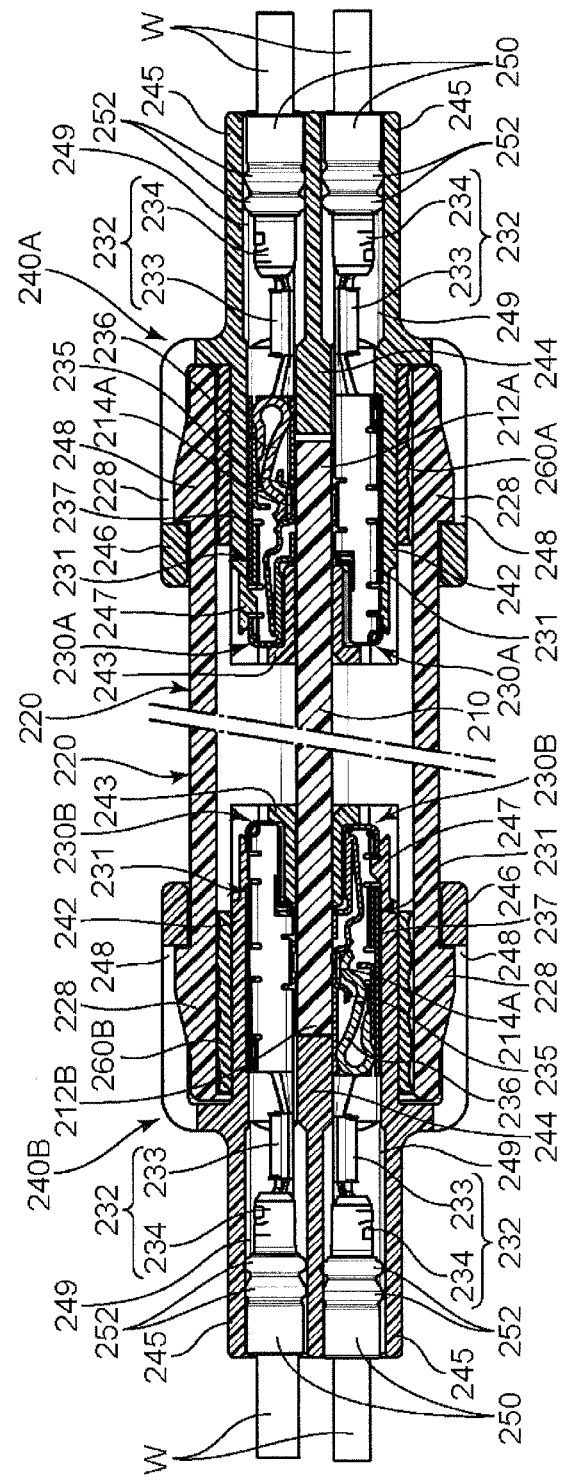
FIG. 22 is a sectional front view showing the state of FIG. 21.
Figure 23:
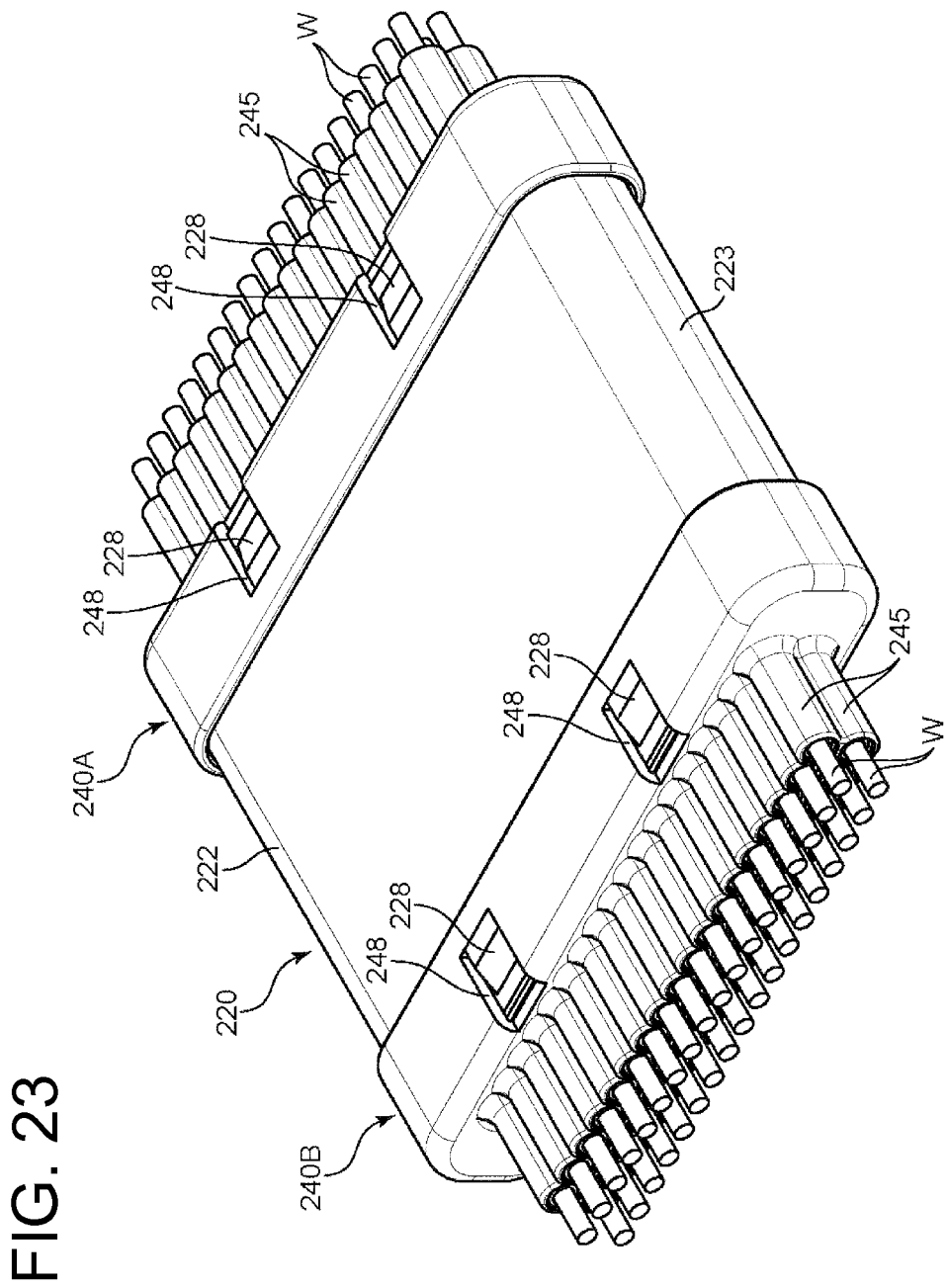
FIG. 23 is a perspective view showing the state of FIG. 21.

The case 220 is formed into a substantially rectangular parallelepipedic shape, includes a first opening 221A which is open in a specific direction (leftward direction in FIGS. 20 to 22) and a second opening 221B which is open in a direction opposite to the specific direction and is shaped to allow the circuit board 210 to be inserted in a board inserting direction (leftward direction in FIGS. 20 to 22 in this fourth embodiment) perpendicular to a plate thickness direction of the circuit board 210 through at least one of the first and second openings 221A, 221B with the edge part (second edge part 212B in the case of insertion through the first opening 221A, first edge part 212A in the case of insertion through the second opening 221B) opposite to the edge part corresponding to the one opening in the lead. Specifically, the case 220 includes a ceiling wall 222, a bottom wall 224 and a pair of left and right side walls 223 (only the side wall 223 on a back side is shown in FIG. 22). The ceiling wall 222 and the bottom wall 224 are arranged on upper and lower sides in postures parallel to each other. The both side walls 223 are arranged between the ceiling wall 222 and the bottom wall 224 and form a rectangular tube body together with the ceiling wall 222 and the bottom wall 224. A plurality of locking projections 228 as a first housing locking portion and a second housing locking portion for locking the first housing 240A of the first connector and the second housing 240B of the second connector as described later are formed to project outward on parts of the ceiling wall 222 and the bottom wall 224 near the openings 221A, 221B.

The first and second connectors according to this fourth embodiment are shaped and structured identical to each other. Each first connector terminal 230A of the first connector is mounted on an end of a corresponding wire W and comes into contact with the corresponding first conductor for connection 214A of the circuit board 210 to electrically connect the circuit board 210 and the wire W. Similarly, each second connector terminal 230B of the second connector is mounted on an end of a corresponding wire W and comes into contact with the corresponding second conductor for connection 214B of the circuit board 210 to electrically connect the circuit board 210 and the wire W. Each of the first and second housings 240A and 240B is made of an insulating material such as synthetic resin, the first housing 240A is mounted into the case 220 while collectively holding the first connector terminals 230A and the second housing 240B is mounted into the case 220 while collectively holding the second connector terminals 230B.

Each wire W according to this fourth embodiment is also composed of unillustrated conductor and an insulation coating covering the conductor. The insulation coating is partly removed at the end of the wire W to expose the conductor. The waterproof plug 250 is mounted at a position immediately behind the part where the conductor is exposed in this way. This waterproof plug 250 is made of a resiliently deformable material such as rubber and has a tubular shape to surround the wire W from an outer side.

Each of the first and second connector terminals 230A, 230B is made of an electrically conductive metal plate and integrally includes a board connecting portion 231 located on a front side and a wire connecting portion 232 located on a rear side. The wire connecting portion 232 includes left and right conductor barrels 233 and left and right insulation barrels 234 located behind the conductor barrels 233. The both conductor barrels 233 are so crimped to the conductor as to embrace the conductor exposed at the end of the wire W, thereby being electrically conductively connected to the conductor. The both insulation barrels 234 are so crimped to the wire W as to embrace a part of the insulation coating located behind the exposed part of the conductor and a front end part of the waterproof plug 250 located at an outer side together. In this way, the waterproof plug 250 is mounted on the wire W to be held in close contact with the outer peripheral surface of the wire W.

Figure 24:
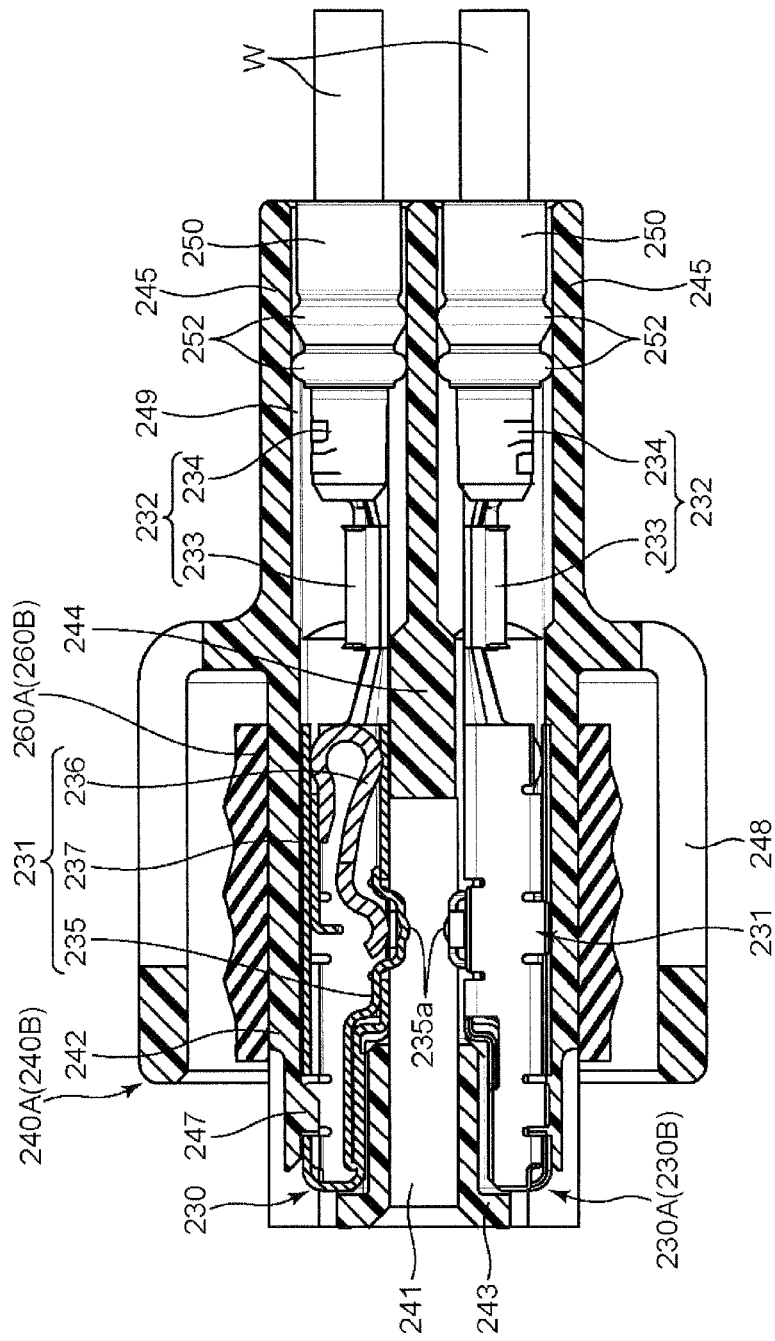
FIG. 24 is a sectional front view showing the first connector (or second connector) and a first connector-side seal member (or second connector-side seal member) fixed to the first housing (or second housing) thereof.
Figure 25:
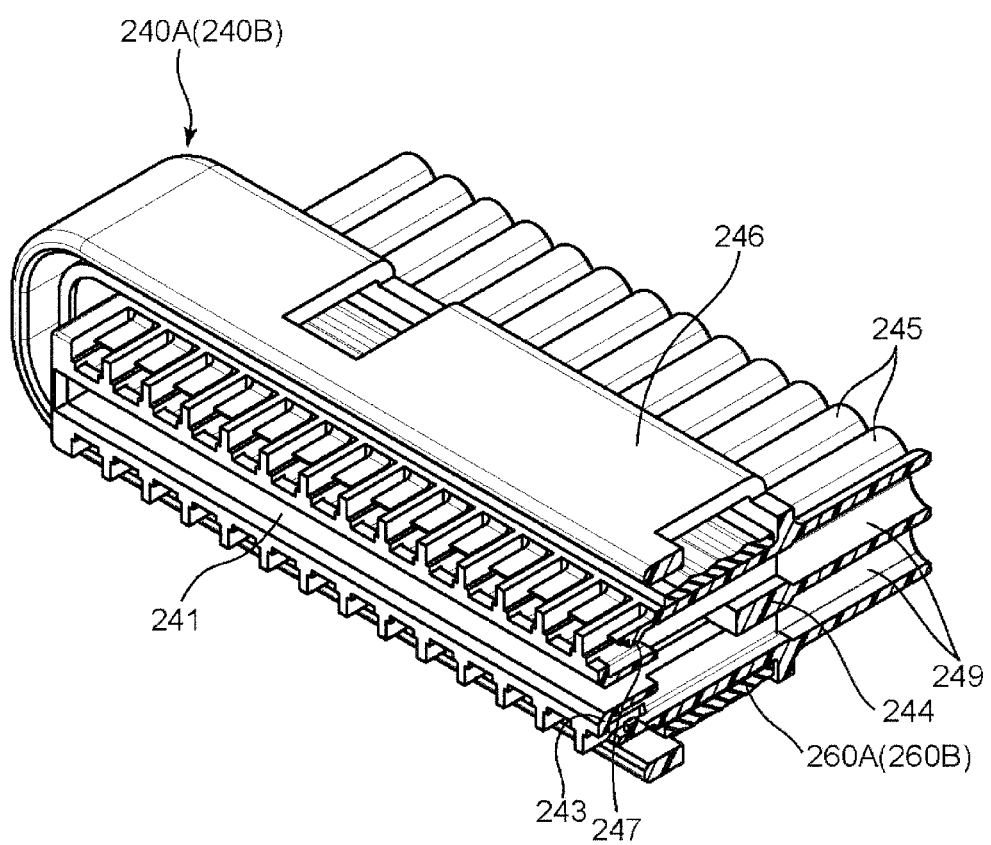
FIG. 25 is a perspective view partly in section showing the first housing (or second housing) and the first connector-side seal member (or second connector-side seal member) fixed thereto.
Figure 26:
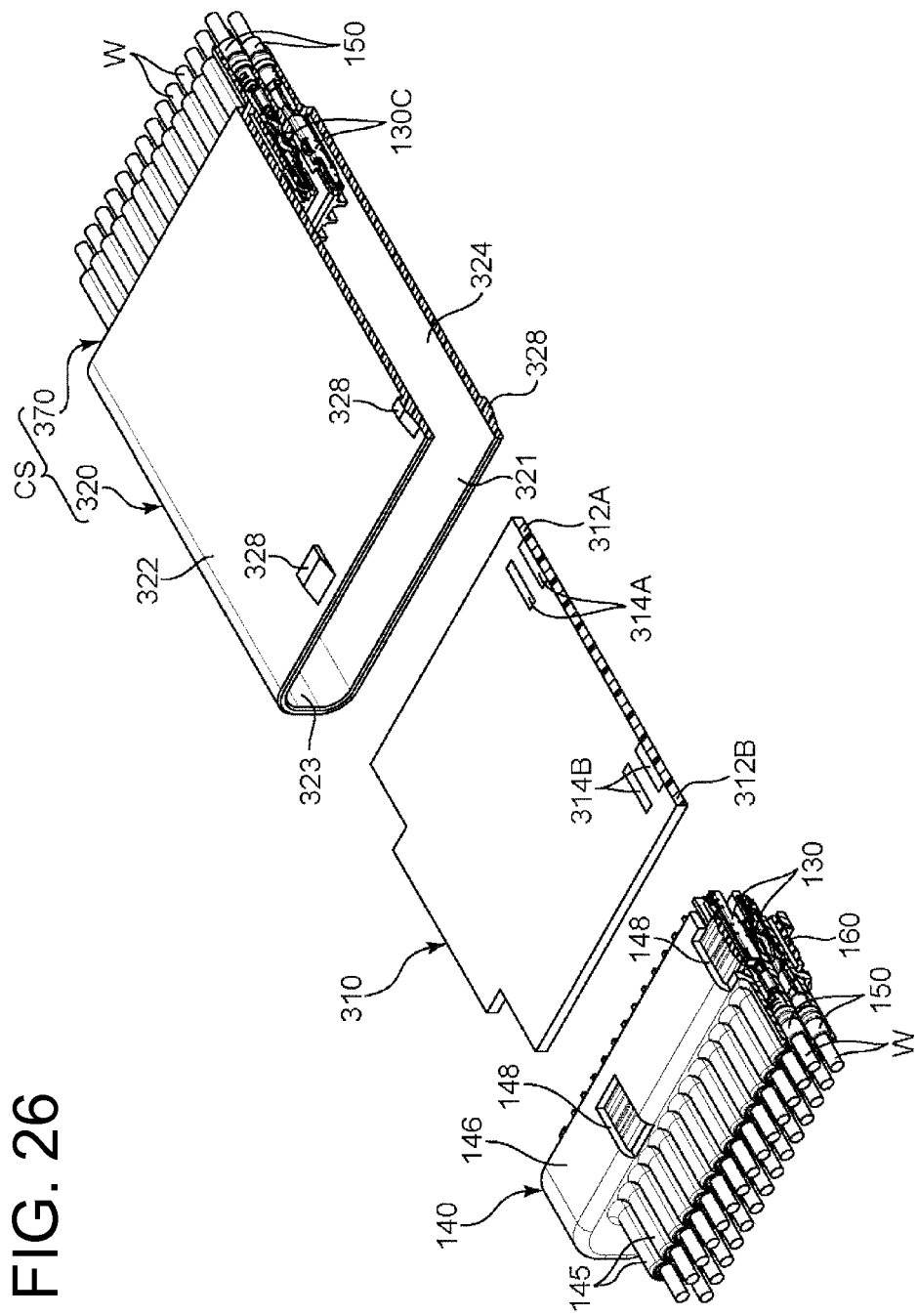
FIG. 26 is an exploded perspective view partly in section showing a state before a connector is mounted into a case of an electronic circuit unit according to a fifth embodiment of the present invention.
Figure 27:
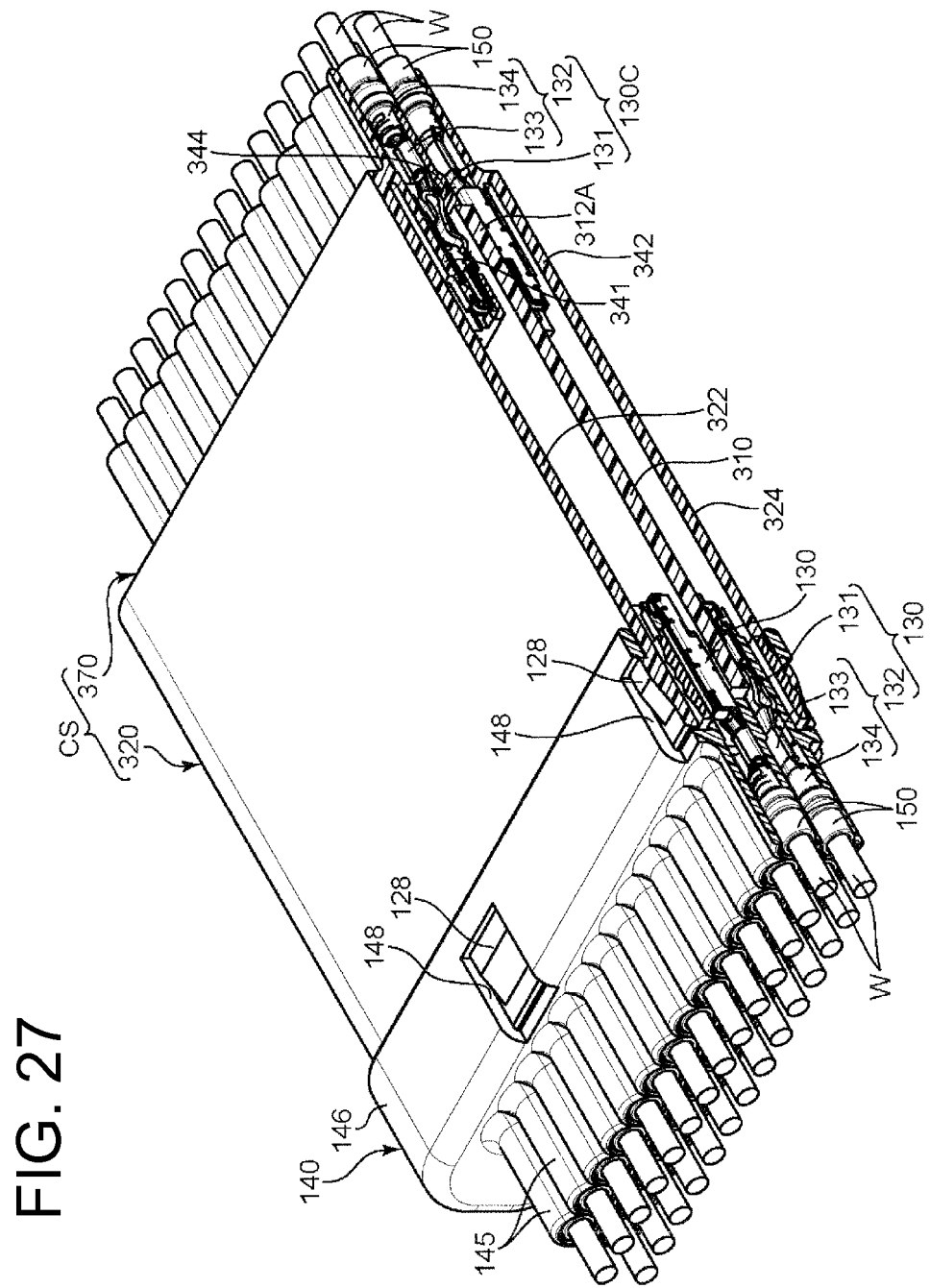
FIG. 27 is a perspective view partly in section showing a state where the connector is mounted in the case shown in FIG. 26.

The board connecting portion 231 is composed of a main body 237, a resilient contact piece 235 and a resilient force reinforcing member 236 as shown in FIGS. 22 and 24. The main body 237 is integrally formed to the wire connecting portion 232 and has a rectangular tube shape. The resilient contact piece 235 extends in an axial direction of the connector terminal 230A, 230B, a front end part thereof is integrally connected to the main body 237, and a rear end part thereof can be vertically deflected and displaced with the front end part as a support point. This rear end part constitutes a contact end part 235a (FIG. 24) to be brought into contact with the first or second conductor for connection 214A or 214B of the circuit board 210 while being resiliently displaced. The resilient contact piece 235 is shaped to project outward from the main body 237 in a state where the resilient contact piece 235 is not deformed as shown in FIG. 24. However, when coming into contact with the first or second edge part 212A or 212B of the circuit board 210 as shown in FIG. 22, the contact end part 235a receives a reaction force from the edge part 212A or 212B, is deflected and displaced to retract into the main body 237 and is pressed into contact with the first or second conductor for connection 214A or 214B by a resilient force thereof. The resilient force reinforcing member 236 is so provided in the main body 237 as to be resiliently deformed as the contact end part 235a is deflected and displaced, and reinforces a resilient restoring force of the contact end part 235a by a resilient force resulting from the resilient deformation thereof.

The first housing 240A collectively holds the first connector terminals 230A in such an arrangement that the contact end parts 235a of the resilient contact pieces 235 in the respective first connector terminals 230A simultaneously come into contact with the first conductors for connection 214A on the opposite surfaces of the first edge part 212A of the circuit board 210. Similarly, the second housing 240B collectively holds the second connector terminals 230B in such an arrangement that the contact end parts 235a of the resilient contact pieces 235 in the respective second connector terminals 230B simultaneously come into contact with the second conductors for connection 214B on the opposite surfaces of the second edge part 212B of the circuit board 210.

Specifically, each of the first and second housings 240 integrally includes a terminal holding portion, a plurality of terminal inserting portions 245 located behind the terminal holding portion, and a cover portion 246.

The terminal holding portion is shaped to be insertable into the opening 221A (221B) of the case 220 while mainly holding the board contact portion 231 of each first connector terminal 230A (second connector terminal 230B), and holds each connector terminal 230A (230B) such that each board connecting portion 231 and each conductor for connector 214A (or conductor for connector 214B) of the circuit board 210 can come into contact with each other in an inserted state thereof.

The terminal holding portion according to this fourth embodiment includes a front inner wall 243, a rear inner wall 244 spaced backward from the front inner wall 243, and a peripheral wall 242 surrounding these inner walls 243, 244, and a plurality of terminal accommodating chambers for holding the accommodated board connecting portions 231 of the respective connector terminals 230A (230B) are formed between the inner walls 243, 244 and the peripheral wall 242. The front inner wall 243 surrounds a board insertion space 241 into which the first edge part 212A (second edge part 212B) of the circuit board 210 is insertable from front, and the rear inner wall 244 is located behind the board insertion space 241.

A contact space is ensured between the both inner walls 243, 244, and each connector terminal 230A (230B) is so held in the housing 240A (240B) that the contact end part 235a of the resilient contact piece 235 of each board connecting portion 231 projects into this contact space. Specifically, the first or second connector terminals 230A or 230B (connector terminals in an upper row) accommodated in the terminal accommodating chambers between the both inner walls 243, 244 and an upper part of the peripheral wall 242 are so held in the housing 240A (240B) that the contact end parts 235a thereof face downward, and the first or second connector terminals 230A or 230B (connector terminals in a lower row) accommodated in the terminal accommodating chambers between the both inner walls 243, 244 and a lower part of the peripheral wall 242 are so held in the housing 240A (240B) that the contact end parts 235a thereof face upward. Holding positions of the respective connector terminals 230A, 230B in each housing 240A, 240B are so set that the contact end parts 235a of the respective connector terminals 230A (230B) simultaneously come into contact with the respective conductors for connection 21A (214B) of the circuit board 210 in a state where the edge part 212A (212B) of the circuit board 210 is inserted to a predetermined depth in the board insertion space 241. Specifically, the first housing 240A holds the first connector terminals 230A such that the connector terminals 230A to be respectively connected to the first conductors for connection 214A arranged on one surface (upper surface in FIGS. 20 to 22 and 24) of the circuit board 210 are juxtaposed in a direction along the first edge part 212A of the circuit board 210 to form a first connector terminal row (upper connector terminal row in FIGS. 20 to 22 and 24) and the connector terminals to be respectively connected to the first conductors for connection 214A arranged on the other surface (lower surface in FIGS. 20 to 22 and 24) of the circuit board 210 are juxtaposed in a direction parallel to the first connector terminal row to form a second connector terminal row (lower connector terminal row in FIGS. 20 to 22 and 24). Similarly, the second housing 240B holds the second connector terminals 230B such that the connector terminals 230B to be respectively connected to the second conductors for connection 214B arranged on one surface (upper surface in FIGS. 20 to 22 and 24) of the circuit board 210 are juxtaposed in a direction along the second edge part 212B of the circuit board 210 to form a first connector terminal row (upper connector terminal row in FIGS. 20 to 22 and 24) and the connector terminals to be respectively connected to the second conductors for connection 214B arranged on the other surface (lower surface in FIGS. 20 to 22 and 24) of the circuit board 210 are juxtaposed in a direction parallel to the first connector terminal row to form a second connector terminal row (lower connector terminal row in FIGS. 20 to 22 and 24).

A plurality of locking lances (connector terminal locking portions) extend forward from the front end of the peripheral wall 242 of each housing 240A, 240B. The locking lances 247 are for locking the board connecting portions 231 of the first and second connector terminals 230, and the front ends thereof are deflected and displaced in a direction to be retracted from the connector terminals 230A, 230B with the rear ends thereof as support points. The locking lances 247 lock appropriate positions of the connector terminals 230A, 230B by being resiliently restored when the insertion of the connector terminals 230A, 230B is completed.

Each terminal inserting portion 245 has such an inner peripheral surface surrounding a connector terminal insertion hole 249 into which the board connecting portion 231 of the corresponding first or second connector terminal 230A or 230B is insertable from behind, and is integral to and extends backward from the terminal holding portion. Each terminal inserting portion 245 according to this fourth embodiment has a cylindrical shape and includes a cylindrical inner peripheral surface surrounding the connector terminal insertion hole 49. These terminal inserting portions 245 are respectively formed at such positions that the board connecting portions 231 of the first or second connector terminals 230A or 230B inserted into the connector terminal insertion holes 49 surrounded by the terminal inserting portions 245 from behind are accommodated in the terminal accommodating chambers of the terminal holding portion.

Here, to seal the interior of the case 220, each waterproof plug 250 is shaped to be held in close contact with the inner peripheral surface of the corresponding terminal inserting portion 245 over the entire circumference in a state where the board connecting portion 231 is inserted in the terminal accommodating chamber. Specifically, a plurality of elongated projections 252 projecting radially outward and extending over the entire circumference are formed on the outer peripheral surface of each waterproof plug 250, and the entrance of moisture into the first or second housing 240A, 240B through the terminal inserting portion 245 is prevented by these elongated projections 52 being held in contact with the inner peripheral surface of the terminal inserting portion 245 over the entire circumference while being resiliently deformed.

The cover portion 246 integrally includes a part projecting outward from the rear end of the peripheral wall 242 and a part extending further forward from this part and covering the peripheral wall 242 and also an end part (part surrounding the opening 221A, 221B) of the case 220, into which the peripheral wall 242 is inserted, from an outer side. The cover portion 246 is formed with through holes 248 into which locking projections 228 of the case 220 are fittable from an inner side. The through holes 248 form engaging portions for holding a mounted state of the housing (first housing 240A or second housing 240B) in the case 220 by being engaged with the respective locking projections 228 on the side of the first opening 221A of the case 220, specifically holding this housing at a position where each connector terminal 230 (first connector terminal 230A or second connector terminal 230B) held in the terminal holding portion of this housing can be held in contact with the corresponding first or second conductor for connection 214A or 214B on the edge part (first edge part 212A or second edge part 212B) of the circuit board 210 in the case 220.

The first and second seal rings 260A, 260B are respectively made of a resiliently deformable material such as rubber and interposed between the case 220 and the first and second connectors to seal the interior of the case 220. In this fourth embodiment, the seal ring 260A, 26B is in the form of an endless strip fixed in a state held in close contact with the outer peripheral surface of the peripheral wall 242 over the entire circumference. The first seal ring 260A has an outer peripheral surface to be held in close contact with the inner peripheral surface of the case 220 over the entire circumference while being resiliently deformed in a state where the terminal holding portion of the first housing 240A is inserted in the case 220 through the first opening 221A. The entrance of moisture into the case 220 through a clearance between the case 220 and the peripheral wall 242 is prevented by this close contact. Similarly, the second seal ring 260B has an outer peripheral surface to be held in close contact with the inner peripheral surface of the case 220 over the entire circumference while being resiliently deformed in a state where the terminal holding portion of the second housing 240B is inserted in the case 220 through the second opening 221B. The entrance of moisture into the case 220 through a clearance between the case 220 and the peripheral wall 242 is prevented by this close contact. In this fourth embodiment, a plurality of circumferentially elongated projections are formed on the outer peripheral surface of the seal ring 260A, 260B to facilitate the resilient deformation of the seal ring 260A, 260B.

Next, an example of an assembling procedure of this electronic circuit unit is described.

1) Insertion of the Connector Terminals 230A, 230B into the Housings 240A, 240B

This insertion is not described since being equivalent to the insertion of the connector terminals 130 into the housing 140 according to the third embodiment.

2) Insertion and Holding of the Circuit Board 210 into the Case 220

The circuit board 210 is inserted into the case 220 through the first or second opening 221A or 221B and held at a predetermined position, specifically at a position where the first and second edge parts 212A, 212B of this circuit board 210 are respectively insertable into the board insertion spaces 241 of the first and second housings 240A, 240B of the first and second connectors.

Also in this fourth embodiment, a specific means for holding the circuit board 210 in this case 220 does not matter as in the third embodiment. With respect to the board inserting direction, the circuit board 210 can be restrained between the rear end walls 244 of the both housings 240A, 240B without forming any clearance or with a small clearance formed.

3) Mounting of the Connector into the Case 220

The first connector and the second connector are respectively mounted into an end part of the case 220 on the side of the first opening 221A and an end part thereof on the side of the second opening 221B. Specifically, the terminal holding portions of the first and second housings 240A, 240B are respectively inserted into the case 220 through the first and second openings 221A, 221B and the locking projections 228 of the case 220 are fitted into the through holes 248 of the cover portions 246 of the respective housings 240A, 240B, whereby the respective housings 240A, 240B are locked to the case 220.

At this time or when the circuit board 210 and the connectors are connected in advance, the first and second edge parts 212A, 212B of the circuit board 210 are inserted into the board insertion spaces 241 of the first and second housings 240A, 240B, whereby the respective first and second conductors for connection 214A, 214B arranged on the first and second edge parts 212A, 12B and the board connecting portions 231 of the respective first and second connector terminals 230A, 230B held in the first and second housings 240A, 240B, more specifically the contact end parts 235a of the resilient contact pieces 235, come into contact with each other. In this way, the circuit board 210 and the respective wires W are electrically connected via the respective first and second connector terminals 230A, 230B. Further, at the positions where the housings 240A, 240B are locked to the case 220 as described above, the outer peripheral surfaces of the first and second seal rings 260A, 260B as the first and second connector-side seal members are held in contact with the inner peripheral surfaces of the end parts of the case 220 on the sides of the first and second openings 221A, 221B over the entire circumference, thereby preventing the entrance of moisture into the case 220 through the clearances between the inner peripheral surface of the case 220 and the outer peripheral surfaces of the peripheral walls 242 of the respective housings 240A, 240B. Specifically, waterproofing on the connector sides is performed.

As just described, the electronic circuit unit shown in FIGS. 20 to 25 includes the case 220 for housing the circuit board 210 and, in addition, the first and second housings 240A, 240B for respectively holding the first and second connector terminals 230A, 230B are utilized as lids for closing the first and second openings 221A, 221B of the case 220. Thus, connected parts of the circuit board 210 and the first and second connectors (specifically, contact parts of the respective first and second conductors for connection 214A, 214B and the board connecting portions 231 of the first and second connector terminals 230A, 230B) can be reliably waterproofed by a simple structure including only a plurality of wire-side seal members (the plurality of waterproof plugs 250 in this fourth embodiment) to be mounted on the respective wires W and the first and second connector-side seal members (first and second seal rings 260A, 260B in this fourth embodiment) to be interposed between the terminal holding portion of the housing 240 and the case 220 as members for waterproofing. Further, the number of the wires W connectable to the circuit board 210 is doubled as compared with the third embodiment.

A fifth embodiment of the present invention is described with reference to FIGS. 26 to 30.

An electronic circuit unit according to this fifth embodiment includes a case 320 formed by adding a terminal holding portion to the case 220 according to the third embodiment and, in addition to this case 320, includes a circuit board 310 to be housed in this case 320, case terminals 130 and a connector for connecting a plurality of wires W to the circuit board 310, a plurality of waterproof plugs 350 as a plurality of wire-side seal members, and a seal ring 160 as a connector-side seal member, and the connector includes a plurality of connector terminals 130 and a housing 140 for holding these.

The connector terminals 130 and the housing 140 constituting the connector, the respective waterproof plugs 150 and the seal ring 160 are not described here since being exactly equivalent to the connector terminals 130, the housing 140, the respective waterproof plugs 150 and the seal ring 160 according to the third embodiment. Further, the respective case terminals 130C are also not described since being exactly equivalent to the connector terminals 130.

The circuit board 310 is, for example, a printed circuit board, conductor patterns for circuit configuration are arranged on both sides thereof, and electronic components constituting circuits are mounted thereon. The circuit board 310 according to this fifth embodiment has a rectangular shape. A plurality of first conductors for connection 314A in the form of thin plates are respectively provided on the top surface and the under surface of a first edge part (right edge part in FIGS. 26 to 28) 312A, which is one edge part, and these first conductors for connection 314A are arranged along the first edge part 312A. Similarly, a plurality of second conductors for connection 314B in the form of thin plates are respectively provided on the top surface and the under surface of a second edge part (left edge part in FIGS. 26 to 28) 312B located opposite to the first edge part 312A, and these conductors for connection 314B are arranged along the second edge parts 312B.

Figure 28:
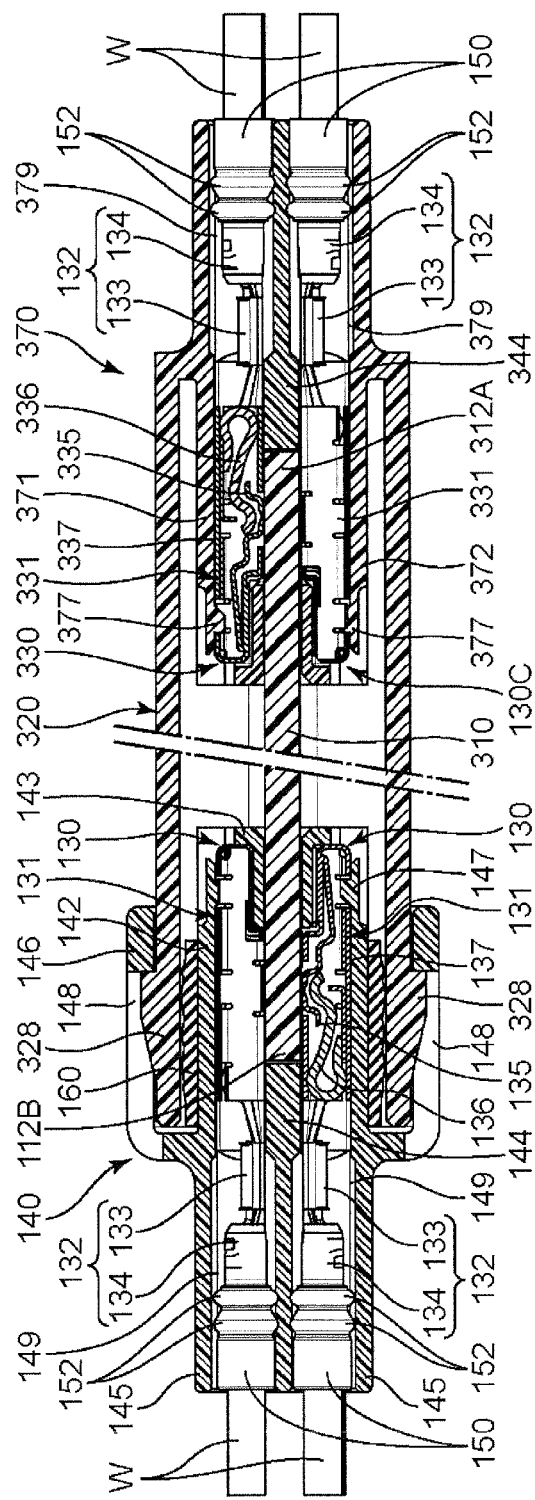
FIG. 28 is a sectional front view showing the state of FIG. 27.
Figure 29:
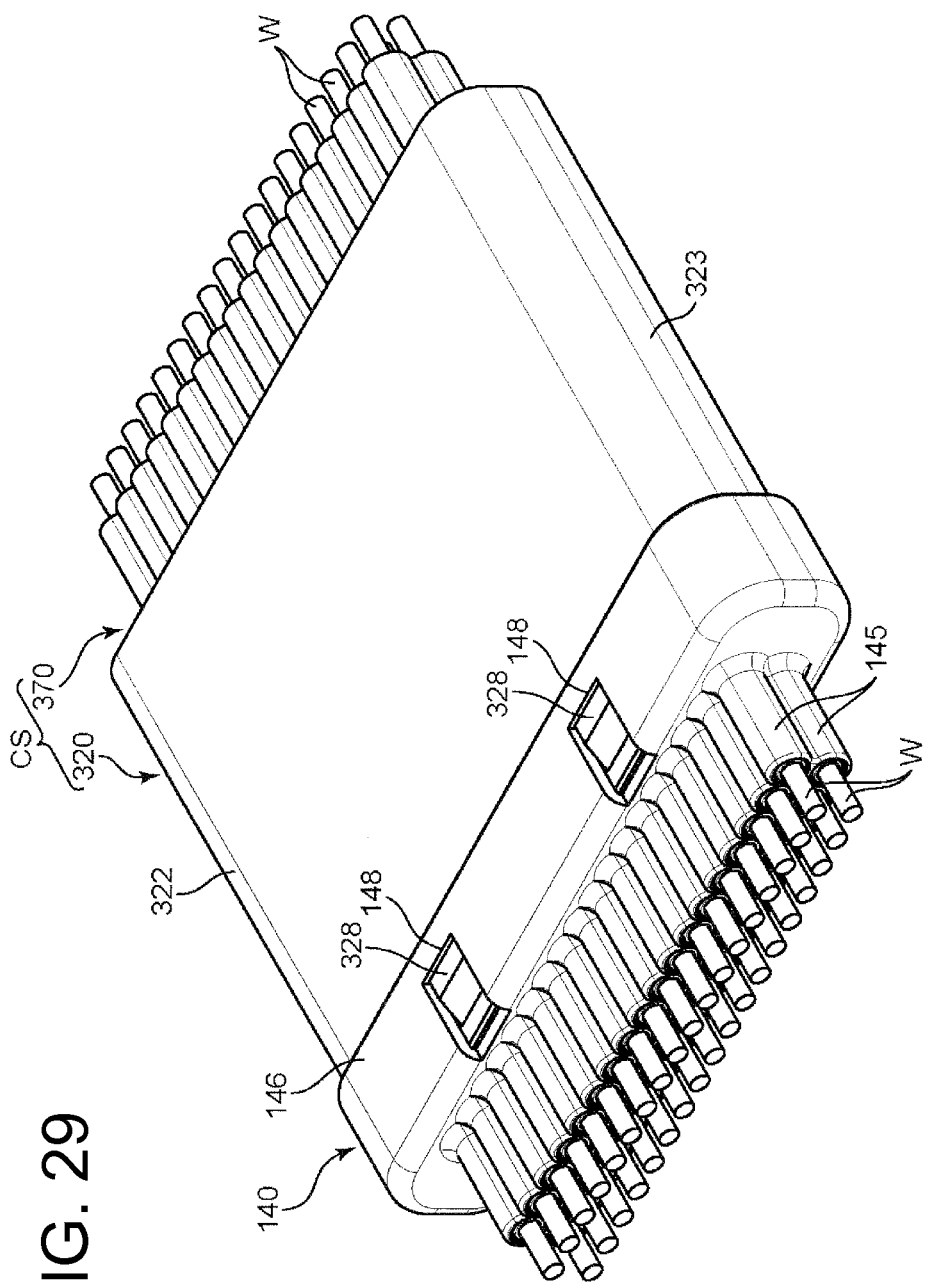
FIG. 29 is a perspective view showing the state of FIG. 27.
Figure 30:
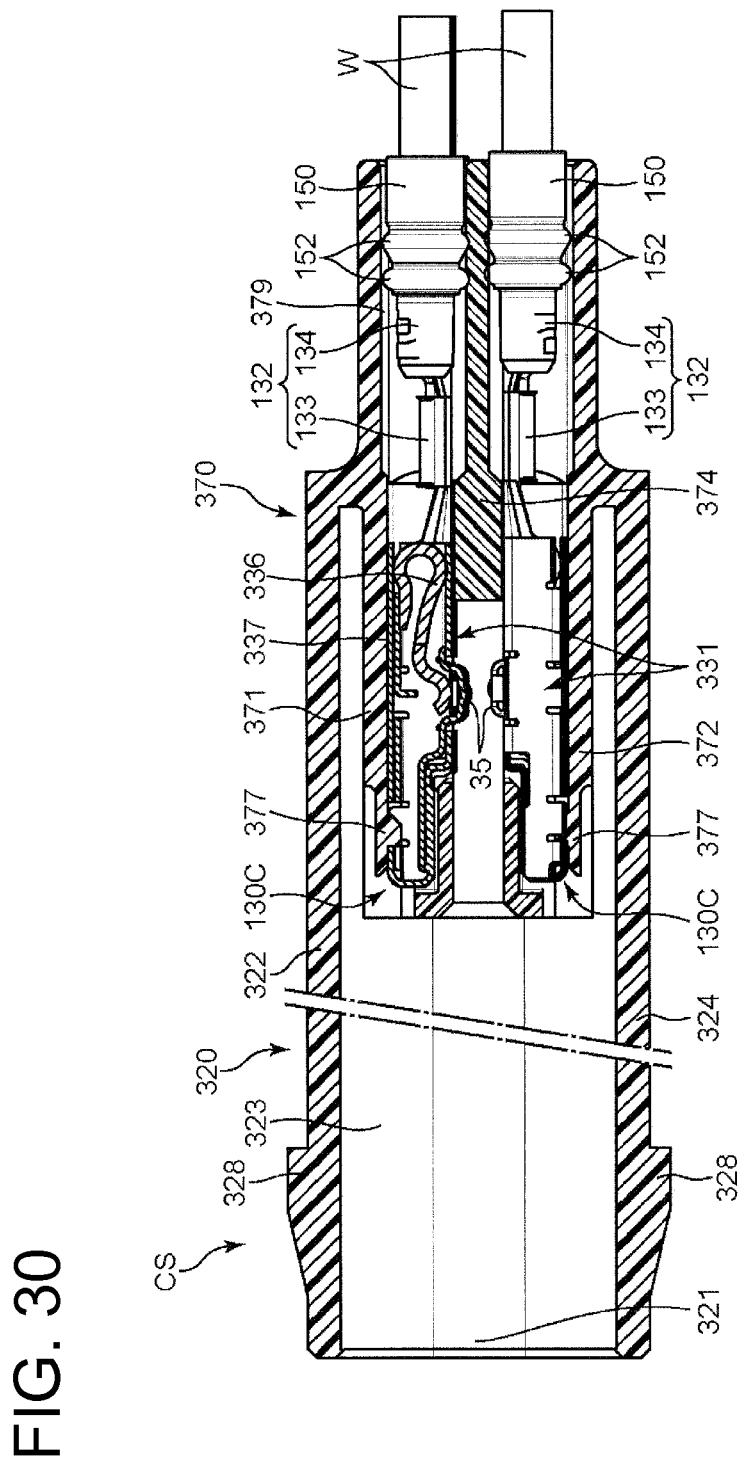
FIG. 30 is a sectional front view showing the case shown in FIG. 26 and first terminals held in a first terminal holding portion.
Figure 31:
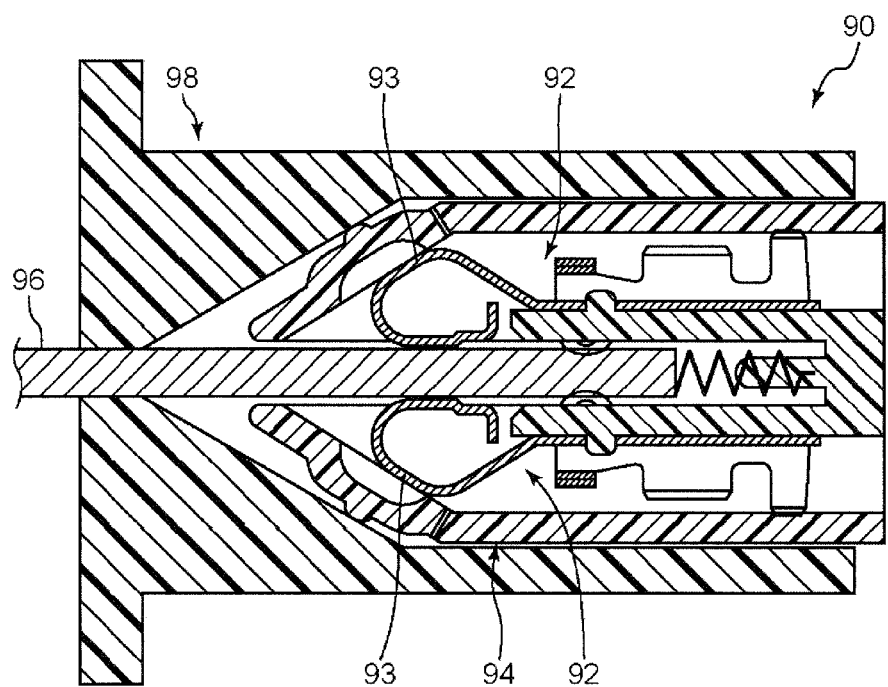
FIG. 31 is a section showing an example of a conventional card edge connector.

The case 320 is formed into a substantially rectangular parallelepipedic shape, includes an opening 321 which is open in a specific direction (rightward direction in FIGS. 26 to 28) and is shaped to allow the circuit board 310 to be inserted in a board inserting direction (leftward direction in FIGS. 26 to 28 in this fifth embodiment) perpendicular to a plate thickness direction of the circuit board 310 through this opening 321 with the first edge part 312A in the lead. Specifically, the case 320 includes a ceiling wall 322, a bottom wall 324, a pair of left and right side walls 323 (only the side wall 323 on a back side is shown in FIG. 28) and an end wall 326. The ceiling wall 322 and the bottom wall 324 are arranged on upper and lower sides in postures parallel to each other. The both side walls 323 are arranged between the ceiling wall 322 and the bottom wall 324 and form a rectangular tube body together with the ceiling wall 322 and the bottom wall 324. The end wall 326 is so integrally connected to the respective walls 322 to 324 as to close an opening (right opening in FIGS. 26 to 28) of the rectangular tube body opposite to the opening 321.

This case 320 is formed with a terminal holding portion (first terminal holding portion) 370 for holding each case terminal 130C in a posture penetrating through the end wall 326 and terminal inserting portions (first terminal inserting portions) 375 located behind the terminal holding portion 370. These are described in detail later. A plurality of locking projections 328 as a housing locking portion for locking the housing 140 of the connector as described later are formed to project outward on parts of the ceiling wall 322 and the bottom wall 324 near the opening 321.

The terminal holding portion 370 of the case 320 collectively holds the case terminals 130C in such an arrangement that contact end parts 135a of resilient contact pieces 135 in the respective case terminals 130C simultaneously come into contact with the conductors for connection 314A on the opposite surfaces of the first edge part 312A. This terminal holding portion 370 projects inwardly of the case 320, i.e. toward the opening 312, from the end wall 326 and mainly holds board connecting portions 131 of the respective case terminals 130C. Specifically, the terminal holding portion 370 holds each case terminal 130C such that the board connecting portion 131 and each conductor for connection 314A on the first edge part 312A of the circuit board 310 can come into contact with each other.

The terminal holding portion 370 includes a front inner wall 373, a rear inner wall 374 spaced backward from the front inner wall 373, and a peripheral wall 372 surrounding these inner walls 373, 374, and a plurality of terminal accommodating chambers for holding the accommodated board connecting portions 131 of the respective case terminals 130C are formed between the inner walls 373, 374 and the peripheral wall 372. The front inner wall 373 surrounds a board insertion space 371 into which the first edge part 312A of the circuit board 310 is insertable from front, and the rear inner wall 374 is located behind the board insertion space 371.

A contact space is ensured between the both inner walls 373, 374, and each case terminal 130C is so held in the housing 370 that the contact end part 135a of the contact piece 135 of each board connecting portion 131 projects into this contact space. Specifically, the case terminals 130C (case terminals 130C in an upper row) accommodated in the terminal accommodating chambers between the both inner walls 373, 374 and an upper part of the peripheral wall 372 are so held in the housing 370 that the contact end parts 135a thereof face downward, and the case terminals 130C (case terminals 130C in a lower row) accommodated in the terminal accommodating chambers between the both inner walls 373, 374 and a lower part of the peripheral wall 372 are so held in the housing 370 that the contact end parts 135a thereof face upward. Holding positions of the respective case terminals 130C in the housing 370 are so set that the contact end parts 135a of the case terminals 130C simultaneously come into contact with the conductors for connection 314A of the circuit board 310 in a state where the first edge part 312A of the circuit board 310 is inserted to a predetermined depth in the board insertion space 371. Specifically, the terminal holding portion 370 holds the case terminals 130C such that the case terminals 130C to be respectively connected to the conductors for connection 314A arranged on one surface (upper surface in FIGS. 26 to 28 and 30) of the first edge part 312A of the circuit board 310 are juxtaposed in a direction along the first edge part 312A of the circuit board 310 to form a first terminal row (upper terminal row in FIGS. 26 to 28 and 30) and the terminals to be respectively connected to the conductors for connection 314A arranged on the other surface (lower surface in FIGS. 26 to 28 and 30) of the first edge part 312A are juxtaposed in a direction parallel to the first terminal row to form a second terminal row (lower terminal row in FIGS. 26 to 28 and 30).

A plurality of locking lances (terminal locking portions) 377 extend forward from the front end of the peripheral wall 372. Each locking lance 377 is for locking the board connecting portion 131 of the case terminal 130C, and the front end thereof is deflected and displaced in a direction to be retracted from the case terminal 130C with the rear end thereof as a support point. The locking lance 377 locks an appropriate position of the case terminal 130C by being resiliently restored when the insertion of the case terminal 130C is completed.

Each terminal inserting portion 375 has such an inner peripheral surface surrounding a terminal insertion hole 379 into which the board connecting portion 131 of the corresponding case terminal 130C is insertable from behind, and is integral to and extends backward from the terminal holding portion. Each terminal inserting portion 375 according to this fifth embodiment has a cylindrical shape and includes a cylindrical inner peripheral surface surrounding the terminal insertion hole 379. These terminal inserting portions 375 are respectively formed at such positions that the board connecting portions 131 of the case terminals 130C inserted into the terminal insertion holes 379 surrounded by the terminal inserting portions 375 from behind are directly accommodated in the terminal accommodating chambers of the terminal holding portion 370.

The housing 140 of the connector includes a terminal holding portion and terminal inserting portions 145 exactly as in the third embodiment.

The terminal holding portion (second terminal holding portion) of the housing 140 is shaped to be insertable into the opening 321 of the case 320 while mainly holding the board contact portion 131 of each first connector terminals 130, and holds each connector terminal 130 such that each board connecting portion 131 and each conductor for connector 314B of the circuit board 310 can come into contact with each other in an inserted state thereof. The configuration of this terminal holding portion is exactly equivalent to that of the housing 140 of the third embodiment, and holding positions of the respective connector terminals 130 in the housing 140 are so set that the contact end parts 135a of the respective connector terminals 130 simultaneously come into contact with the respective conductors for connection 314B of the circuit board 310 in a state where the second edge part 212B of the circuit board 310 is inserted to a predetermined depth in the board insertion space 141 formed by this terminal holding portion. Specifically, the housing 140 holds the connector terminals 130 such that the connector terminals 130 to be respectively connected to the conductors for connection 314B arranged on one surface (upper surface in FIGS. 26 to 28) of the second edge part 312B of the circuit board 310 are juxtaposed in a direction along the first edge part 312A of the circuit board 310 to form a first terminal row (upper terminal row in FIGS. 26 to 28) and the terminals to be respectively connected to the conductors for connection 314B arranged on the other surface (lower surface in FIGS. 26 to 28) of the second edge part 312B are juxtaposed in a direction parallel to the first terminal row to form a second terminal row (lower terminal row in FIGS. 26 to 28).

To seal the interior of the case 320, each waterproof plug 150 according to this fifth embodiment is shaped to be held in close contact with the inner peripheral surface of the corresponding terminal inserting portion 375 or the corresponding terminal inserting portion 145 of the housing 140 over the entire circumference in a state where the board connecting portion 131 of the terminal 130C, 130 is inserted in the terminal accommodating chamber of the terminal holding portion 370 or the housing 140. Specifically, a plurality of elongated projections 152 projecting radially outward and extending over the entire circumference are formed on the outer peripheral surface of each waterproof plug 150, and the entrance of moisture into the housing 140 through the terminal inserting portion 375 or 145 is prevented by these elongated projections 152 being held in contact with the inner peripheral surface of the terminal inserting portion 375 or 145 over the entire circumference while being resiliently deformed.

As in the third embodiment, the cover portion 146 of the housing 140 integrally includes a part covering the peripheral wall 142 and also an end part (part surrounding the opening 321) of the case 320, into which the peripheral wall 142 is inserted, from an outer side, and is formed with through holes 148 into which locking projections 328 of the case 320 are fittable from an inner side. These through holes 148 form engaging portions for holding a mounted state of the housing 140 in the case 320 by being engaged with the respective locking projections 328, specifically holding the housing 140 at a position where each connector terminal 130 held in the terminal holding portion of the housing 140 can be held in contact with the corresponding conductor for connection 314B of the circuit board 310 in the case 320.

In exactly the same manner as the seal ring 160 according to the third embodiment is interposed between the case 320 and the connector, the seal ring 160 is interposed between the case 320 and the connector to seal the interior of the case 320. This seal ring 160 has an outer peripheral surface to be held in close contact with the inner peripheral surface of the case 320 over the entire circumference while being resiliently deformed in a state where the terminal holding portion of the housing 140 is inserted in the case 320 through the opening 321. The entrance of moisture into the case 320 through a clearance between the case 320 and the peripheral wall 142 is prevented by this close contact.

Next, an example of an assembling procedure of this electronic circuit unit is described.

1) Insertion of the Terminals 130C, 130 into the Terminal Holding Portion 370 and the Housing 140

The board connecting portions 131 of the respective case terminals 130C and the respective connector terminals 130 are inserted into the respective terminal insertion holes 379 of the terminal holding portion 370 and the respective terminal insertion holes 149 of the housing 140 from behind. Out of these, the insertion of the connector terminals 130 into the housing 140 is not described since being exactly the same as that in the third embodiment. In the terminal holding portion 370 (first terminal holding portion), the board connecting portions 131 reach the terminal accommodating chambers and are locked by the locking lances 147. In this way, the respective case terminals 130C are arranged in two upper and lower rows and held in the common terminal holding portion 370 in such postures that the contact end parts 135a thereof face inward, and the waterproof plugs 150 mounted on the wires W behind the case terminals 130C are held in close contact with the inner peripheral surfaces of the terminal inserting portions 375 surrounding the terminal insertion holes 379, thereby providing sealing between the wires W and the terminal inserting portions 375. Specifically, waterproofing on the side of the wires W is performed.

2) Insertion and Holding of the Circuit Board 310 into the Case 320

The circuit board 310 is inserted into the case 320 through the opening 321 and held at a predetermined position, specifically at a position where the first edge part 312A of this circuit board 310 is inserted into the board insertion space 371 of the terminal holding portion 370 and the second edge part 312B of the circuit board 310 is insertable into the board insertion space 41 of the housing 140 of the connector mounted into the case 320 as described later.

Also in this fifth embodiment, a specific means for holding the circuit board 310 in this case 320 does not matter. With respect to the board inserting direction, the circuit board 310 can be restrained between the rear inner wall 374 of the terminal holding portion 370 and the rear inner wall 144 of the housing 140 to be locked to the case 320 as described later without forming any clearance or with a small clearance formed.

3) Mounting of the Connector into the Case 320

The connector is mounted into an end part of the case 320 on the side of the opening 321. Specifically, the terminal holding portion of the housing 140 of this connector is inserted into the case 320 through the opening 321 and the locking projections 328 of the case 320 are fitted into the through holes 148 of the cover portion 146 of the housing 140, whereby the housing 140 is locked to the case 320.

At this time or when the circuit board 310 and the connector are connected in advance, the second edge part 312B of the circuit board 310 is inserted into the board insertion space 41 of the housing 140 of the connector, whereby each conductor for connection 314B arranged on the second edge part 312B and the board connecting portion 131 of each terminal held in the housing 140, more specifically the contact end part 135a of the resilient contact piece 135, come into contact with each other. In this way, the circuit board 310 and each wire W are electrically connected via each connector terminal 130. Further, at the position where the housing 140 is locked to the case 320 as described above, the outer peripheral surface of the seal ring 160 as the connector-side seal member is held in contact with the inner peripheral surface of the end part of the case 320 on the side of the opening 321 over the entire circumference, thereby preventing the entrance of moisture into the case 320 through the clearance between the inner peripheral surface of the case 320 and the outer peripheral surface of the peripheral wall 142 of the housing 140. Specifically, waterproofing on the connector side is performed.

As just described, the electronic circuit unit according to the fifth embodiment includes the case 320 for housing the circuit board 310 and, in addition, the case terminals 130C out of the terminals 130C, 130 to be connected to the circuit board 310 are held in the terminal holding portion 370 and the housing 140 for holding the connector terminals 130 is utilized as a lid for closing the opening 321 of the case 320. Thus, connected parts of the circuit board 310 and the respective terminals 130C, 130 (specifically, contact parts of the respective conductors for connection 314A, 314B and the board connecting portions 131 of the respective terminals 130C, 130) can be reliably waterproofed by a simple structure including only a plurality of wire-side seal members (the plurality of waterproof plugs 150 in this fifth embodiment) to be mounted on the respective wires W and the connector-side seal member (seal ring 160 in this fifth embodiment) to be interposed between the terminal holding portion of the housing 140 and the case 320 as members for waterproofing. Further, the number of the wires connectable to the circuit board is doubled as compared with the third embodiment.

In the present invention, the specific structure of each connector terminal (including the first and second connector terminals of the second and fourth embodiments) is not limited to that according to each embodiment. The connector terminal according to the present invention has only to include a part electrically conductively connected to the conductor for connection of the circuit board by coming into contact therewith and a part mountable on the end of the wire.

The connector-side seal member according to the third to fifth embodiments (including the first and second connector-side seal members according to the fourth embodiment) has only to be interposed between the case and the housing to exhibit a waterproof function and needs not necessarily be fixed to the housing. However, the connector-side seal member fixed to the terminal holding portion of the housing in advance enables the interior of the case to be sealed by a simple operation of only inserting the terminal holding portion and the connector-side seal member as an integral assembly into the opening of the case. Further, it is also possible to form the connector-side seal member and the housing by molding.

Alternatively, the connector-side seal member may be made of a material with a low fluidity such as grease and interposed between the case and the housing to fill up a clearance therebetween. Also in this case, the interior of the case can be sealed. Each wire-side seal member may also be made of a similar material with a low fluidity and interposed between each wire and the inner peripheral surface of the terminal insertion hole to fill up a clearance therebetween.

It is possible to omit the cover portions 146, 246A and 246B of the housings 140, 240A and 240B according to the third to fifth embodiments. However, these cover portions can effectively protect the sealed part between the terminal holding portion and the case by covering it from the outer side. Further, by providing the cover portion with the engaging portions such as the through holes 148, i.e. parts to be locked by the housing locking portion (e.g. locking projections 128 in the third embodiment) of the case, the housing can be locked to the case outside the case without affecting this sealed part.

As described above, the present invention provides an electronic circuit unit which can be miniaturized and simplified in structure.

A first electronic circuit unit provided by the present invention includes a circuit board including an edge part and a plurality of conductors for connection provided on a surface thereof, a case for housing the circuit board, and a connector for connecting wires to the conductors for connection of the circuit board. The case includes an opening which is open in a specific direction and is so shaped that the circuit board is insertable into the case in a board inserting direction perpendicular to a plate thickness direction of the circuit board through the opening with an edge part opposite to the former edge part in the lead. The connector includes a plurality of connector terminals connected to ends of the respective wires and electrically conductively connectable to the conductors for connection of the circuit board by respectively coming into contact with the conductors and a housing for holding the connector terminals in such an arrangement that the respective connector terminals can simultaneously come into contact with the respective conductors for connection. This housing is shaped to be mountable into the case to close the opening of the case at a position where each connector terminal held in the housing comes into contact with each conductor for connection of the circuit board at the board holding position, and the case includes a housing locking portion for locking the housing of the connector at the position where each connector terminal of the connector comes into contact with each conductor for connection of the circuit board housed in the case.

In this electronic circuit unit, the contact of each connector terminal of the connector and each conductor for connection of the circuit board is guaranteed by a simple structure utilizing the case without requiring the use of both a terminal-side housing and a board-side housing as before. Specifically, the housing is mounted into and locked to the case to close the opening of the case in a state where the circuit board is housed in the case. In this way, without using a plurality of housings, a state where each connector terminal of the connector and each conductor for connection of the circuit board are in contact is maintained and the circuit board is housed in the case to be protected.

Preferably, to hold the circuit board in the case, the case includes side walls extending in the board inserting direction and configured to hold the circuit board from opposite sides in the plate thickness direction while guiding the circuit board in the board inserting direction, and an end wall located on a side opposite to the opening with respect to the board inserting direction, the housing includes a board restraining portion capable of coming into contact with an end surface of the edge part of the circuit board to restrain the end surface in the board inserting direction, and the circuit board is held in the case by being sandwiched between this board restraining portion and the end wall. In this example, the circuit board is held while being sandwiched between the end wall and the board restraining portion at the board holding position where the opposite edge parts of the circuit board are located between the end wall and the board restraining portion of the housing. Thus, the board holding position is stabilized and the reliability of the contact of the conductors for connection of the circuit board and the respective connector terminals of the connector is enhanced.

More preferably, the housing of the connector further includes a retainer provided to be movable between a connector terminal locking position and a connector terminal releasing position, the retainer doubly locks the connector terminals held in the housing at the connector terminal locking position and allows the insertion of the connector terminals into the housing at the connector terminal releasing position. In this case, it can be prevented utilizing the case that the housing is erroneously mounted into the case although the retainer is not at the connector terminal locking position. Specifically, the case may be provided with a mounting preventing portion for allowing the housing to be mounted into the case when the retainer is at the connector terminal locking position while preventing the housing from being mounted into the case by coming into the contact with the retainer when the retainer is at the connector terminal releasing position.

In the electronic circuit unit, contact parts of the respective connector terminals of the connector and the respective conductors for connection of the circuit board can be waterproofed by including a connector-side seal member to be interposed between the case and the connector and a plurality of wire-side seal members provided for the respective wires. Specifically, the housing of the connector may include terminal inserting portions having an inner peripheral surface surrounding each of a plurality of connector terminal insertion holes through which the respective connector terminals are insertable from an outer side and a terminal holding portion shaped to receive and hold the connector terminals inserted through the terminal inserting portions and to be insertable into the case through the opening of the case and configured to hold each connector terminal such that each connector terminal can come into contact with each conductor for connection of the circuit board in an inserted state, the connector-seal member may be interposed between the housing and the case to seal the interior of the case, each wire-side seal member may be interposed between the wire and the inner peripheral surface of the terminal inserting portion to close the interior of the case, and the housing locking portion of the case may lock the housing at a position where each connector terminal held in the terminal holding portion of the housing comes into contact with each conductor for connection of the circuit board in the case and the connector-side seal member is interposed between the housing and the case to seal the interior of the case.

In this electronic circuit unit, the circuit board is inserted into the case through the opening provided on the case, the terminal holding portion of the housing of the connector is inserted into the opening and the housing is locked by the housing locking portion of the case, whereby contact parts of the circuit board and the connector terminals of the connector are stored in the case and the opening of the case is closed by the housing. Thus, the contact parts can be waterproofed by being sealed in the case by a simple structure including only the connector-side seal member to be interposed between the housing and the case and the plurality of wire-side seal members provided for the respective wires.

The connector-side seal member is made of, for example, a resiliently deformable material and is shaped to be held in close contact with the outer peripheral surface of the terminal holding portion of the housing and the inner peripheral surface of the case over the entire circumference while being resiliently deformed, whereby the interior of the case can be sealed by a simple shape.

In this case, the connector-side seal member is preferably fixed on the outer peripheral surface of the terminal holding portion of the housing. In this case, the interior of the case can be sealed by a simple operation of only inserting the terminal holding portion and the connector-side seal member as an integral assembly into the opening of the case.

On the other hand, each wire-side seal member is preferably made of a resiliently deformable material and shaped to be mounted in close contact with the outer peripheral surface of the wire and held in close contact with the inner peripheral surface of the terminal inserting portion over the entire circumference while being resiliently deformed.

The housing of the connector preferably includes a cover portion shaped to cover an end part of the case on the opening side from an outer side in a state where the terminal holding portion is inserted in the opening of the case. This cover portion can more effectively protect a sealed part between the terminal holding portion and the case by covering the sealed part from the outer side.

Further, by providing this cover portion with an engaging portion to be locked by the housing locking portion of the case, the housing can be locked to the case outside the case without affecting the sealed part.

The connector can be configured as a so-called card edge connector which is connected to the circuit board to sandwich the edge part of the circuit board from opposite sides. Specifically, the conductors for connection are arranged on each of opposite surfaces of the edge part of the circuit board, and the housing holds the connector terminals such that the connector terminals to be connected to the respective conductors for connection arranged on one surface of the circuit board are juxtaposed in a direction along the edge part of the circuit board to form a first connector terminal row and the connector terminals to be connected to the respective conductors for connection arranged on the other surface of the circuit board are juxtaposed in a direction parallel to the first connector terminal row to form a second connector terminal row, whereby more connector terminals and wires can be connected to the circuit board.

A second electronic circuit unit provided by the present invention includes a circuit board including a first edge part and a second edge part facing opposite sides and first conductors for connection and second conductors for connection provided on surfaces of the respective edge parts, a case for housing the circuit board, a first connector for connecting wires to the respective first conductors for connection of the circuit board and a second connector for connecting wires to the respective second conductors for connection of the circuit board. The case includes a first opening which is open in a specific direction and a second opening which is open in a direction opposite to the specific direction, and is so shaped that the circuit board is insertable into the case in a board inserting direction perpendicular to a plate thickness direction of the circuit board through at least one opening with the edge part opposite to the edge part corresponding to the one opening out of the first and second edge parts in the lead. The first connector includes a plurality of first connector terminals connected to ends of the wires and electrically conductively connectable to the first conductors for connection by respectively coming into contact with the first conductors for connection and a first housing for holding the first connector terminals in such an arrangement that the respective first connector terminals can simultaneously come into contact with the respective first conductors for connection, and this first housing is shaped to be mountable into the case to close the first opening of the case. The second connector includes a plurality of second connector terminals connected to ends of the wires and electrically conductively connectable to the second conductors for connection by respectively coming into contact with the second conductors for connection and a second housing for holding the second connector terminals in such an arrangement that the respective second connector terminals can simultaneously come into contact with the respective second conductors for connection, and this second housing is shaped to be mountable into the case to close the second opening of the case. The case includes a first housing locking portion for locking the first housing of the first connector at a position where each first connector terminal of the first connector comes into contact with each first conductor for connection of the circuit board housed in the case and a second housing locking portion for locking the second housing of the second connector at a position where each second connector terminal of the second connector comes into contact with each second conductor for connection of the circuit board housed in the case.

In this electronic circuit unit, the first and second connectors can be connected to the common circuit board. In addition, each connector needs not use both a terminal-side housing and a board-side housing as before, and the contact of the connector terminals of each connector and the conductors for connection of the circuit board is guaranteed by a combination of each housing (first housing and second housing) and the case. Specifically, the first and second edge parts of the circuit board are restrained in the board inserting direction by a first board restraining portion of the first housing and a second board restraining portion of the second housing, the first and second housings are respectively locked by the first and second housing locking portions of the case in a state where a first lid portion of the first housing and a second lid portion of the second housing respectively close the first and second openings, whereby a state where the first and second connector terminals respectively held by the both housings and the respective first conductors for connection and the respective second conductors for connection on the circuit board are in contact is maintained.

In this electronic circuit unit, preferably, the first housing of the first connector includes the first board restraining portion capable of coming into contact with an end surface of the first edge part in a state where each first connector terminal is in contact with the first conductor for connection, and the second housing of the second connector includes the second board restraining portion capable of coming into contact with an end surface of the second edge part in a state where each second connector terminal is in contact with the second conductor for connection. The both board restraining portions enable the circuit board in the case to be restrained from opposite sides in the board inserting direction, utilizing the both connectors.

Also in this second electronic circuit unit, preferably, at least one of the first and second connectors is a connector with a retainer provided in the housing thereof to be movable between a connector terminal locking position and a connector terminal releasing position, and the retainer doubly locks the connector terminals held in the housing at the connector terminal locking position and allows the insertion of the connector terminals into the housing at the connector terminal releasing position. In this case, the case is preferably provided with a mounting preventing portion for allowing the housing of the connector with the retainer to be mounted into the case when the retainer is at the connector terminal locking position while preventing the housing of the connector with the retainer from being mounted into the case by coming into the contact with the retainer when the retainer is at the connector terminal releasing position.

In this electronic circuit unit, contact parts of the first and second connector terminals of the first and second connectors and the first and second conductors for connection of the circuit board can be waterproofed by further including a first connector-side seal member to be interposed between the case and the first connector, a second connector-side seal member to be interposed between the case and the second connector and a plurality of wire-side seal members provided for the respective wires. Specifically, the first housing of the first connector may include terminal inserting portions having an inner peripheral surface surrounding each of a plurality of connector terminal insertion holes through which the respective first connector terminals are insertable from an outer side and a terminal holding portion shaped to receive and hold the first connector terminals inserted through the terminal inserting portions and to be insertable into the case through the first opening of the case and configured to hold each first connector terminal such that each first connector terminal can come into contact with each first conductor for connection of the first edge part of the circuit board in an inserted state. The second housing of the second connector may include terminal inserting portions having an inner peripheral surface surrounding each of a plurality of connector terminal insertion holes through which the respective second connector terminals are insertable from an outer side and a terminal holding portion shaped to receive and hold the second connector terminals inserted through the terminal inserting portions and to be insertable into the case through the second opening of the case and configured to hold each second connector terminal such that each second connector terminal can come into contact with each conductor for connection of the second edge part of the circuit board in an inserted state. The first connector-seal member may be interposed between the first housing and the case to seal the interior of the case, the second connector-seal member may be interposed between the second housing and the case to seal the interior of the case, and the respective wire-side seal members may be interposed between the respective wires and the inner peripheral surfaces of the terminal inserting portions of the first and second housings to close the interior of the case. The first housing locking portion of the case may lock the first housing at a position where each first connector terminal held in the terminal holding portion of the first housing comes into contact with each conductor for connection of the first edge part of the circuit board in the case and the first connector-side seal member is interposed between the first housing and the case to seal the interior of the case, and the second housing locking portion of the case may lock the second housing at a position where each second connector terminal held in the terminal holding portion of the second housing comes into contact with each conductor for connection of the second edge part of the circuit board in the case and the second connector-side seal member is interposed between the second housing and the case to seal the interior of the case.

In this electronic circuit unit, the circuit board is inserted into the case through the first or second opening provided on the case, the terminal holding portions of the first and second housings of the first and second connectors are inserted into the first and second openings and the first and second housings are locked by the first and second housing locking portions of the case, whereby contact parts of the circuit board and the first and second connector terminals of the first and second connectors can be stored in the case and the first and second openings of the case can be closed by the first and second housings. Thus, the contact parts can be waterproofed by being sealed in the case by a simple structure including only the first and second connector-side seal members to be interposed between the first and second housings and the case and the plurality of wire-side seal members provided for the respective wires.

The first connector-side seal member is made of, for example, a resiliently deformable material and is shaped to be held in close contact with the outer peripheral surface of the terminal holding portion of the first housing and the inner peripheral surface of the case over the entire circumference while being resiliently deformed, whereby the interior of the case can be sealed by a simple shape.

In this case, the first connector-side seal member is preferably fixed on the outer peripheral surface of the terminal holding portion of the first housing. This enables the interior of the case to be sealed by a simple operation of only inserting the terminal holding portion and the first connector-side seal member as an integral unit into the first opening of the case.

Similarly, the second connector-side seal member is made of a resiliently deformable material and is shaped to be held in close contact with the outer peripheral surface of the terminal holding portion of the second housing and the inner peripheral surface of the case over the entire circumference while being resiliently deformed, whereby the interior of the case can be sealed by a simple shape.

Also in this case, the second connector-side seal member is preferably fixed on the outer peripheral surface of the terminal holding portion of the second housing. This enables the interior of the case to be sealed by a simple operation of only inserting the terminal holding portion and the second connector-side seal member as an integral unit into the second opening of the case.

On the other hand, each wire-side seal member is preferably made of a resiliently deformable material and shaped to be mounted in close contact with the outer peripheral surface of the wire and held in close contact with the inner peripheral surface of the terminal inserting portion over the entire circumference while being resiliently deformed.

The first housing preferably includes a cover portion shaped to cover an end part of the case on the side of the first opening from an outer side in a state where the terminal holding portion thereof is inserted in the case through the first opening. The cover portion of this first housing can more effectively protect a sealed part between the terminal holding portion and the case by covering the sealed part from the outer side. Similarly, the second housing preferably includes a cover portion shaped to cover an end part of the case on the side of the second opening from an outer side in a state where the terminal holding portion thereof is inserted in the case through the second opening. The cover portion of this second housing can more effectively protect a sealed part between the terminal holding portion of the second housing and the case by covering the sealed part from the outer side.

Further, by providing the cover portion with an engaging portion to be locked by the first housing locking portion of the case and providing the cover portion with an engaging portion to be locked by the second housing locking portion of the case, the first and second housings can be locked to the case outside the case without affecting the sealed parts.

Both first and second connectors according to the present invention can be configured as so-called card edge connectors which are connected to the circuit board to sandwich edge parts of the circuit board from opposite sides. Specifically, for the first connector, the conductors for connection are arranged on each of opposite surfaces of the first edge part of the circuit board, and the first housing holds the first connector terminals such that the first connector terminals to be connected to the respective conductors for connection arranged on one surface of the first edge part of the circuit board are juxtaposed in a direction along the first edge part of the circuit board to form a first connector terminal row and the first connector terminals to be connected to the respective conductors for connection arranged on the other surface of the first edge part of the circuit board are juxtaposed in a direction parallel to the first connector terminal row to form a second connector terminal row, whereby more first connector terminals and wires can be connected to the circuit board. Similarly, for the second connector, the conductors for connection are arranged on each of opposite surfaces of the second edge part of the circuit board, and the second housing holds the second connector terminals such that the second connector terminals to be connected to the respective conductors for connection arranged on one surface of the second edge part of the circuit board are juxtaposed in a direction along the second edge part of the circuit board to form a first connector terminal row and the second connector terminals to be connected to the respective conductors for connection arranged on the other surface of the second edge part of the circuit board are juxtaposed in a direction parallel to the first connector terminal row to form a second connector terminal row, whereby more second connector terminals and wires can be connected to the circuit board.

A third electronic circuit unit provided by the present invention includes a circuit board including a first edge part and a second edge part located on a side opposite to the first edge part and a plurality of conductors for connection provided on surfaces of the first and second edges, a case configured to house the circuit board, including an opening which is open in a specific direction and shaped such that the circuit board is insertable in a board inserting direction perpendicular to a plate thickness direction of the circuit board through the opening with the first edge part in the lead, case terminals mounted on ends of a plurality of wires and configured to connect the conductors for connection and the wires by being held in the case and coming into contact with the respective conductors for connection of the first edge part of the circuit board housed in the case, and a connector to be mounted into the case to connect a plurality of wires different from the wires, on which the case terminals are mounted, to the respective conductors for connection of the circuit board housed in the case. The case includes a first terminal holding portion located on a side opposite to the opening and configured to hold the respective case terminals in such an arrangement that the case terminals simultaneously come into contact with the respective conductors for connection of the first edge part and first terminal inserting portions located outside the first terminal holding portion, having an inner peripheral surface surrounding each of a plurality of terminal insertion holes into which the case terminals are insertable from an outer side and configured to guide the inserted terminals to the first terminal holding portion. The connector includes a plurality of connector terminals connected to ends of wires and electrically conductively connectable to the conductors for connections of the second edge part of the circuit board by respectively coming into contact with the conductors, and a housing for holding the connector terminals in such an arrangement that the respective connector terminals can simultaneously come into contact with the respective conductors for connection. This housing includes second terminal inserting portions having an inner peripheral surface surrounding each of a plurality of terminal insertion holes through which the connector terminals are insertable from an outer side and a second terminal holding portion shaped to receive and hold the terminals inserted through the second terminal inserting portions and to be insertable into the case through the opening of the case and configured to hold each connector terminal such that each connector terminal can come into contact with each conductor for connection of the second edge part of the circuit board in an inserted state. The connector-side seal member is interposed between the housing and the case to seal the interior of the case. Each wire-side seal member is interposed between the wire and the inner peripheral surface of the first or second terminal inserting portion to seal the interior of the case. The case includes a housing locking portion for locking the housing at a position where each connector terminal held in the second terminal holding portion of the housing comes into contact with each conductor for connection of the second edge of the circuit board in the case.

In this electronic circuit unit, it is not necessary to use both a terminal-side housing and a board-side housing as before and the contact of the connector terminals of the connector and the conductors for connection of the circuit board is guaranteed by a simple structure utilizing the case. Specifically, the case of the circuit board includes a first holding portion for holding the plurality of case terminals, and the circuit board is inserted into the case through the opening of the case, whereby the conductors for connection arranged on the first edge part of the circuit board come into contact with the respective case terminals, and the second terminal holding portion of the housing of the connector is inserted into the case through the opening and the housing is locked by the housing locking portion of the case, whereby contact parts of the circuit board and the respective case terminals and the respective connector terminals are stored in the case and the opening of the case is closed by the housing. In this way, without using a plurality of housings, a state where the respective connector terminals of the connector and the respective conductors for connection on the circuit board are in contact is maintained and the circuit board is protected by being housed in the case. Furthermore, the wires and the circuit board can be connected not only in the connector, but also in the case by the contact of the second conductors for connection of the circuit board housed in the case and the case terminals held by the terminal holding portion of the case.

Further, in this electronic circuit unit, contact parts of the respective conductors for connection of the circuit board and the respective connector terminals and the respective case terminals can be waterproofed by including the connector-side seal member to be interposed between the case and the connector to seal the interior of the case and a plurality of wire-side seal members to be interposed between the respective wires and the inner peripheral surfaces of the first and second terminal inserting portions to seal the interior of the case. In this case, the housing locking portion of the case may lock the housing at a position where the connector-side seal member is interposed between the housing and the case to seal the interior of the case.

As just described, the contact parts can be sealed in the case and waterproofed by a simple structure including only the connector-side seal member to be interposed between the housing of the connector and the case and the plurality of wire-side seal members provided for the respective wires.

The connector-side seal member is made of, for example, a resiliently deformable material and is shaped to be held in close contact with the outer peripheral surface of the second terminal holding portion of the housing and the inner peripheral surface of the case over the entire circumference while being resiliently deformed, whereby the interior of the case can be sealed by a simple shape.

In this case, the connector-side seal member is preferably fixed on the outer peripheral surface of the second terminal holding portion of the housing. This enables the interior of the case to be sealed by a simple operation of only inserting the second terminal holding portion and the connector-side seal member as an integral assembly into the opening of the case.

On the other hand, each wire-side seal member is preferably made of a resiliently deformable material and shaped to be mounted in close contact with the outer peripheral surface of the wire and held in close contact with the inner peripheral surface of the first or second terminal inserting portion over the entire circumference while being resiliently deformed.

The housing of the connector preferably includes a cover portion shaped to cover an end part of the case on the opening side from an outer side in a state where the second terminal holding portion is inserted in the opening of the case. This cover portion can more effectively protect a sealed part between the second terminal holding portion and the case by covering the sealed part from the outer side.

Further, by providing this cover portion with an engaging portion to be locked by the housing locking portion of the case, the housing can be locked to the case outside the case without affecting the sealed part.

The first terminal holding portion of the case according to the present invention can be configured as a so-called card edge connector which is connected to the circuit board to sandwich the first edge part of the circuit board from opposite sides. Specifically, the conductors for connection on the first edge part are arranged on each of opposite surfaces of the first edge part of the circuit board, and the first terminal holding portion holds the case terminals such that the case terminals to be connected to the respective conductors for connection arranged on one surface of the first edge part of the circuit board are juxtaposed in a direction along the first edge part of the circuit board to form a first terminal row and the case terminals to be connected to the respective conductors for connection arranged on the other surface of the first edge part of the circuit board are juxtaposed in a direction parallel to the first terminal row to form a second terminal row, whereby more case terminals and wires can be connected to the circuit board.

Similarly, the connector according to the present invention can be configured as a so-called card edge connector which is connected to the circuit board to sandwich the second edge part of the circuit board from opposite sides. Specifically, the conductors for connection on the second edge part are arranged on each of opposite surfaces of the second edge part of the circuit board, and the second terminal holding portion of the housing of the connector holds the connector terminals such that the connector terminals to be connected to the respective conductors for connection arranged on one surface of the second edge part of the circuit board are juxtaposed in a direction along the second edge part of the circuit board to form a first terminal row and the connector terminals to be connected to the respective conductors for connection arranged on the other surface of the second edge part are juxtaposed in a direction parallel to the first terminal row to form a second terminal row, whereby more connector terminals and wires can be connected to the circuit board.

The invention claimed is:
1. An electronic circuit unit, comprising:
a circuit board including an edge part and first and second opposite surfaces extending from the edge part, a plu- rality of first conductors for connection provided on the first surface thereof and a plurality of second conductors for connection provided on the second surface thereof;

a case for housing the circuit board; and a connector for connecting wires to the conductors for connection of the circuit board;

wherein:

the case includes an opening that is open in a specific direction and is so shaped that the circuit board is insertable into the case in a board inserting direction perpendicular to a plate thickness direction of the circuit board through the opening with the edge part in the lead;

the connector includes a board insertion space configured for receiving the edge part of the circuit board therein, first and second pluralities of terminal accommodating chambers disposed respectively on first and second sides of the board insertion space, first and second pluralities of connector terminals connected to ends of the respective wires and disposed respectively in the first and second terminal accommodating chambers, the first and second pluralities of connector terminals being electrically conductively connectable respectively to the first and second pluralities of conductors for connection of the circuit board by respectively coming into contact with the conductors, the housing being configured for holding the connector terminals in such an arrangement that the respective connector terminals simultaneously come into contact with the respective conductors for connection, the housing being shaped to be mountable into the case to close the opening of the case at a position where each connector terminal held in the housing comes into contact with each conductor for connection of the circuit board at a board holding position; and the case includes a housing locking portion for locking the housing of the connector at the position where each connector terminal of the connector comes into contact with each conductor for connection of the circuit board housed in the case.

2. The electronic circuit unit of claim 1, wherein:

the case includes side walls extending in the board inserting direction and configured to hold the circuit board from opposite sides in the plate thickness direction while guiding the circuit board in the board inserting direction, and an end wall located on a side opposite to the opening with respect to the board inserting direction;

the housing includes a board restraining portion capable of coming into contact with an end surface of the edge part of the circuit board, and the circuit board is held in the case at a position where the circuit board is restrained in the board inserting direction by the board restraining portion and the end wall.

3. The electronic circuit unit of claim 1, wherein:

the housing of the connector further includes a retainer provided to be movable between a connector terminal locking position and a connector terminal releasing position, the retainer doubly locks the connector terminals held in the housing at the connector terminal locking position and allows the insertion of the connector terminals into the housing at the connector terminal releasing position, the case includes a mounting preventing portion for allowing the housing to be mounted into the case when the retainer is at the connector terminal locking position while preventing the housing from being mounted into the case by coming into the contact with the retainer when the retainer is at the connector terminal releasing position.

4. The electronic circuit unit of claim 1, wherein the first plurality of connector terminals are juxtaposed in a direction along the edge part of the circuit board to form a first connector terminal row and the second plurality of connector terminals are juxtaposed in a direction parallel to the first connector terminal row to form a second connector terminal row.

5. The electronic circuit unit of claim 1, wherein the housing of the connector includes a cover portion shaped to cover an end part of the case on the opening side from an outer side in a state where the terminal holding portion is inserted in the opening of the case.

6. The electronic circuit unit of claim 5, wherein the cover portion includes an engaging portion to be locked to the case.

7. The electronic circuit unit of claim 1, further comprising:

a connector-side seal member to be interposed between the case and the connector; and a plurality of wire-side seal members provided for the respective wires;

wherein the housing of the connector includes terminal inserting portions having an inner peripheral surface surrounding each of a plurality of connector terminal insertion holes through which the respective connector terminals are insertable from an outer side and a terminal holding portion shaped to receive and hold the connector terminals inserted through the terminal inserting portions and to be insertable into the case through the opening of the case and configured to hold each connector terminal such that the connector terminal comes into contact with each conductor for connection of the circuit board in an inserted state, the connector-seal member is interposed between the housing and the case to seal the interior of the case, each wire-side seal member is interposed between the wire and the inner peripheral surface of the terminal inserting portion to close the interior of the case, and the housing locking portion of the case locks the housing at a position where each connector terminal held in the terminal holding portion of the housing comes into contact with each conductor for connection of the circuit board in the case and the connector-side seal member is interposed between the housing and the case to seal the interior of the case.

8. The electronic circuit unit of claim 7, wherein each wire-side seal member is made of a resiliently deformable material and shaped to be mounted in close contact with the outer peripheral surface of the wire and held in close contact with the inner peripheral surface of the terminal inserting portion over the entire circumference while being resiliently deformed.

9. The electronic circuit unit of claim 7, wherein the connector-side seal member is made of a resiliently deformable material and is shaped to be held in close contact with the outer peripheral surface of the terminal holding portion of the housing and the inner peripheral surface of the case over the entire circumference while being resiliently deformed.

10. The electronic circuit unit of claim 9, wherein the connector-side seal member is fixed on the outer peripheral surface of the terminal holding portion of the housing.

11. An electronic circuit unit, comprising:

a circuit board including a first edge part and a second edge part facing opposite sides, opposite first and second surfaces extending between the edge parts and first conductors for connection and second conductors for connection provided respectively on the first and second surfaces at the edge parts;

a case for housing the circuit board;

a first connector for connecting wires to the first and second conductors for connection at the first edge part of the circuit board; and a second connector for connecting wires to the first and second conductors for connection at the second edge part in red is the of the circuit board;

wherein:

the case includes a first opening facing the first edge part and a second opening opposite the first opening and facing the second edge part, the case is so shaped that the circuit board is insertable into the case in a board inserting direction perpendicular to a plate thickness direction of the circuit board through at least one of the first and second openings with one of the first and second edge parts in the lead;

the first connector includes a first housing having a first board insertion space configured for receiving the first edge part of the circuit board therein, a plurality of first terminal accommodating chambers disposed on opposite sides of the first board insertion space, a plurality of first connector terminals connected to ends of the wires and disposed in the first terminal accommodating chambers and being electrically conductively connectable to the conductors for connection at the first edge part by respectively coming into contact with the conductors for connection at the first edge part and the first housing being configured for holding the first connector terminals in such an arrangement that the respective first connector terminals simultaneously come into contact with the respective conductors for connection at the first edge part, the first housing being shaped to be mountable into the case to close the first opening of the case;

the second connector includes a second housing having a second board insertion space configured for receiving the second edge part of the circuit board therein, a plurality of first terminal accommodating chambers disposed on opposite sides of the second board insertion space a plurality of second connector terminals connected to ends of the wires and disposed in the second terminal accommodating chambers and being electrically conductively connectable to the conductors for connection at the second edge part by respectively coming into contact with the conductors for connection at the second edge part and the second housing being configured for holding the second connector terminals in such an arrangement that the respective second connector terminals simultaneously come into contact with the respective conductors for connection at the second edge part, the second housing being shaped to be mountable into the case to close the second opening of the case; and the case includes a first housing locking portion for locking the first housing of the first connector at a position where each first connector terminal of the first connector comes into contact with each first conductor for connection of the circuit board housed in the case and a second housing locking portion for locking the second housing of the second connector at a position where each second connector terminal of the second connector comes into contact with each second conductor for connection of the circuit board housed in the case.

12. The electronic circuit unit of claim 11, wherein the first housing of the first connector includes a first board restraining portion capable of coming into contact with an end surface of the first edge part in a state where each first connector terminal is in contact with the first conductor for connection, and the second housing of the second connector includes the second board restraining portion capable of coming into contact with an end surface of the second edge part in a state where each second connector terminal is in contact with the second conductor for connection.

13. The electronic circuit unit of claim 11, wherein at least one of the first and second connectors is a connector with a retainer provided in the housing thereof to be movable between a connector terminal locking position and a connector terminal releasing position, the retainer doubly locks the connector terminals held in the housing at the connector terminal locking position and allows the insertion of the connector terminals into the housing at the connector terminal releasing position, and the case includes a mounting preventing portion for allowing the housing of the connector provided with the retainer to be mounted into the case when the retainer is at the connector terminal locking position while preventing the housing of the connector provided with the retainer from being mounted into the case by coming into the contact with the retainer when the retainer is at the connector terminal releasing position.

14. The electronic circuit unit of claim 11, wherein the first connector terminals to be connected to the respective conductors for connection arranged on the first surface of the circuit board are juxtaposed in a direction along the first edge part of the circuit board to form a first connector terminal row and the first connector terminals to be connected to the respective conductors for connection arranged on the second surface of the circuit board are juxtaposed in a direction parallel to the first connector terminal row to form a second connector terminal row.

15. The electronic circuit unit of claim 11, wherein the second connector terminals to be connected to the respective conductors for connection arranged on the first surface of the circuit board are juxtaposed in a direction along the second edge part of the circuit board to form a first connector terminal row and the second connector terminals to be connected to the respective conductors for connection arranged on the second surface of the circuit board are juxtaposed in a direction parallel to the first connector terminal row to form a second connector terminal row.

16. The electronic circuit unit of claim 11, further comprising:

a first connector-side seal member to be interposed between the case and the first connector;

a second connector-side seal member to be interposed between the case and the second connector; and a plurality of wire-side seal members made of a resiliently deformable material and to be respectively mounted on the wires;

wherein:

the first housing of the first connector includes terminal inserting portions having an inner peripheral surface surrounding each of a plurality of connector terminal insertion holes through which the respective first connector terminals are insertable from an outer side and a terminal holding portion shaped to receive and hold the first connector terminals inserted through the terminal inserting portions and to be insertable into the case through the first opening of the case and configured to hold each first connector terminal such that the first connector terminal comes into contact with each first conductor for connection of the first edge part of the circuit board in an inserted state, the second housing of the second connector includes terminal inserting portions having an inner peripheral surface surrounding each of a plurality of connector terminal insertion holes through which the respective second connector terminals are insertable from an outer side and a terminal holding portion shaped to receive and hold the second connector terminals inserted through the terminal inserting portions and to be insertable into the case through the second opening of the case and configured to hold each second connector terminal such that the second connector terminal comes into contact with each conductor for connection of the second edge part of the circuit board in an inserted state, the first connector-seal member is interposed between the first housing and the case to seal the interior of the case, the second connector-seal member is interposed between the second housing and the case to seal the interior of the case, each wire-side seal member is interposed between the wire and the inner peripheral surface of the terminal inserting portion of the first or second housing to close the interior of the case, the first housing locking portion of the case locks the first housing at a position where each first connector terminal held in the terminal holding portion of the first housing comes into contact with each conductor for connection of the first edge part of the circuit board in the case and the first connector-side seal member is interposed between the first housing and the case to seal the interior of the case, and the second housing locking portion of the case locks the second housing at a position where each second connector terminal held in the terminal holding portion of the second housing comes into contact with each conductor for connection of the second edge part of the circuit board in the case and the second connector-side seal member is interposed between the second housing and the case to seal the interior of the case.

17. The electronic circuit unit of claim 16, wherein each wire-side seal member is made of a resiliently deformable material and shaped to be mounted in close contact with the outer peripheral surface of the wire and held in close contact with the inner peripheral surface of the terminal inserting portion over the entire circumference while being resiliently deformed.

18. The electronic circuit unit of claim 16, wherein the first connector-side seal member is made of a resiliently deformable material and shaped to be held in close contact with the outer peripheral surface of the terminal holding portion of the first housing and the inner peripheral surface of the case over the entire circumference while being resiliently deformed.

19. The electronic circuit unit of claim 18, wherein the first connector-side seal member is fixed on the outer peripheral surface of the terminal holding portion of the first housing.

20. The electronic circuit unit of claim 16, wherein the second connector-side seal member is made of a resiliently deformable material and shaped to be held in close contact with the outer peripheral surface of the terminal holding portion of the second housing and the inner peripheral surface of the case over the entire circumference while being resiliently deformed.

21. The electronic circuit unit of claim 20, wherein the second connector-side seal member is fixed on the outer peripheral surface of the terminal holding portion of the second housing.

22. The electronic circuit unit of claim 16, wherein the first housing includes a cover portion shaped to cover an end part of the case on the side of the first opening from an outer side in a state where the terminal holding portion is inserted in the case through the first opening.

23. The electronic circuit unit of claim 22, wherein the cover portion of the first housing includes an engaging portion to be locked to the case.

24. The electronic circuit unit claim 16, wherein the second housing includes a cover portion shaped to cover an end part of the case on the side of the second opening from an outer side in a state where the terminal holding portion is inserted in the case through the second opening.

25. The electronic circuit unit of claim 24, wherein the cover portion of the second housing includes an engaging portion to be locked to the case.

26. An electronic circuit unit capable of external connection, comprising:
  a circuit board including a first edge part and a second edge part located on a side opposite to the first edge part and opposite first and second surfaces extending between the edge parts, a plurality of first conductors for connection and a plurality of second conductors for connection provided respectively on the first and second surfaces of the circuit board and extending into proximity to the edge parts;
  a case configured to house the circuit board, the case including a first end and a second end that defines an opening that is open in a direction toward the first end and is shaped such that the circuit board is insertable in a board inserting direction perpendicular to a plate thickness direction of the circuit board through the opening with the first edge part in the lead;
  case terminals mounted on ends of a plurality of wires and configured to connect the conductors for connection and the wires by being held in the case and coming into contact with the respective conductors for connection at the first edge part of the circuit board housed in the case; and
  a connector to be mounted into the case to connect a plurality of wires different from the wires on which the case terminals are mounted to the respective conductors for connection of the circuit board housed in the case;
  wherein:
  the case includes a first terminal holding portion located on a side opposite to the opening and configured to hold the respective case terminals in such an arrangement that the case terminals simultaneously come into contact with the respective conductors for connection of the first edge part and first terminal inserting portions located outside the first terminal holding portion, having an inner peripheral surface surrounding each of a plurality of terminal insertion holes into which the case terminals are insertable from an outer side and configured to guide the inserted terminals to the first terminal holding portion;
  the connector includes a housing having a board insertion space configured for receiving the second edge part of the circuit board therein, first and second pluralities of terminal accommodating chambers disposed respectively on first and second sides of the board insertion space, a plurality of connector terminals connected to ends of wires and electrically conductively connectable to the conductors for connections at the second edge part of the circuit board by respectively coming into contact with the conductors, and the housing holding the connector terminals in such an arrangement that the respective connector terminals simultaneously come into contact with the respective conductors for connection;
  the housing includes second terminal inserting portions having an inner peripheral surface surrounding each of a plurality of terminal insertion holes through which the connector terminals are insertable from an outer side and a second terminal holding portion shaped to receive and hold the terminals inserted through the second terminal inserting portions and to be insertable into the case through the opening of the case and configured to hold each connector terminal such that each connector terminal comes into contact with each conductor for connection at the second edge part of the circuit board in an inserted state; and the case includes a housing locking portion for locking the housing at a position where each connector terminal held in the second terminal holding portion of the housing comes into contact with each conductor for connection of the second edge of the circuit board in the case.

27. The electronic circuit unit of claim 26, wherein the conductors for connection on the first edge part are arranged on each of opposite first and second surfaces of the circuit board, and the first terminal holding portion of the case holds the case terminals such that the case terminals to be connected to the respective conductors for connection arranged on the first surface of the circuit board are juxtaposed in a direction along the first edge part of the circuit board to form a first terminal row and the case terminals to be connected to the respective conductors for connection arranged on the second surface of the circuit board are juxtaposed in a direction parallel to the first terminal row to form a second terminal row.

28. The electronic circuit unit of claim 26, wherein the conductors for connection on the second edge part are arranged on each of opposite first and second surfaces of the circuit board, and the first terminal holding portion of the housing holds the connector terminals such that the connector terminals to be connected to the respective conductors for connection arranged on the first surface of the circuit board are juxtaposed in a direction along the second edge part of the circuit board to form a first terminal row and the connector terminals to be connected to the respective conductors for connection arranged on the second surface of the circuit board are juxtaposed in a direction parallel to the first terminal row to form a second terminal row.

29. The electronic circuit unit of claim 26, further comprising:
   a connector-side seal member to be interposed between the case and the connector to seal the interior of the case; and
   a plurality of wire-side seal members to be interposed between the respective wires and the inner peripheral surfaces of the first and second terminal inserting portions to seal the interior case;
   wherein the housing locking portion of the case locks the housing at a position where the connector-side seal member is interposed between the housing and the case to seal the interior of the case.

30. The electronic circuit unit of claim 29, wherein each wire-side seal member is made of a resiliently deformable material and shaped to be mounted in close contact with the outer peripheral surface of the wire and held in close contact with the inner peripheral surface of the first or second terminal inserting portion over the entire circumference while being resiliently deformed.

31. The electronic circuit unit of claim 29, wherein the connector-side seal member is made of a resiliently deformable material and shaped to be held in close contact with the outer peripheral surface of the second terminal holding portion of the housing and the inner peripheral surface of the case over the entire circumference while being resiliently deformed.

32. The electronic circuit unit of claim 31, wherein the connector-side seal member is fixed on the outer peripheral surface of the second terminal holding portion of the housing.

33. The electronic circuit unit of claim 29, wherein the housing of the connector includes a cover portion shaped to cover an end part of the case on the opening side from an outer side in a state where the second terminal holding portion is inserted in the opening of the case.

34. The electrical circuit of claim 33, wherein the cover portion is provided with an engaging portion for locking to the case.

* * * * *